United States Patent
Yoshida et al.

(10) Patent No.: US 11,158,497 B2
(45) Date of Patent: Oct. 26, 2021

(54) SUBSTRATE PROCESSING APPARATUS

(71) Applicant: SCREEN Holdings Co., Ltd., Kyoto (JP)

(72) Inventors: Takeshi Yoshida, Kyoto (JP); Hiroaki Takahashi, Kyoto (JP); Kazuki Inoue, Kyoto (JP)

(73) Assignee: SCREEN Holdings Co., Ltd.

( * ) Notice: Subject to any disclaimer, the term of this patent is extended or adjusted under 35 U.S.C. 154(b) by 28 days.

(21) Appl. No.: 16/716,640

(22) Filed: Dec. 17, 2019

(65) Prior Publication Data
US 2020/0126783 A1 Apr. 23, 2020

Related U.S. Application Data

(62) Division of application No. 15/129,551, filed as application No. PCT/JP2015/056674 on Mar. 6, 2015, now Pat. No. 10,573,507.

(30) Foreign Application Priority Data

Mar. 28, 2014 (JP) .................................. 2014-068614
Mar. 28, 2014 (JP) .................................. 2014-068615
(Continued)

(51) Int. Cl.
H01L 21/67 (2006.01)
H01L 21/02 (2006.01)
H01L 21/687 (2006.01)

(52) U.S. Cl.
CPC .. *H01L 21/02052* (2013.01); *H01L 21/02057* (2013.01); *H01L 21/6719* (2013.01);
(Continued)

(58) Field of Classification Search
CPC ......... H01L 21/02052; H01L 21/68742; H01L 21/02057; H01L 21/67023;
(Continued)

(56) References Cited

U.S. PATENT DOCUMENTS 8,109,282 B2 * 2/2012 Miya ................. H01L 21/67028
134/95.1
9,698,031 B2 * 7/2017 Kobayashi ........ H01L 21/67103
(Continued)

FOREIGN PATENT DOCUMENTS

JP 2002-176026 A 6/2002
JP 2003-031538 A 1/2003
(Continued)

OTHER PUBLICATIONS

International Search Report dated May 26, 2015 in corresponding PCT International Application No. PCT/JP2015/056674.
(Continued)

*Primary Examiner* — Alexander Markoff
(74) *Attorney, Agent, or Firm* — Ostrolenk Faber LLP

(57) ABSTRACT

A substrate processing apparatus with efficient drying includes a chamber body having an upper opening, a chamber cover having a lower opening, and a shield plate disposed in a cover internal space of the chamber cover. With the upper opening of the chamber body covered by the chamber cover, a chamber is formed. In the cover internal space, a scanning nozzle for discharging a processing liquid toward a substrate is disposed and an inert gas is supplied and a gas is exhausted from the inside. When the processing liquid is supplied onto the substrate, the discharge part is disposed at a discharge position, and when the discharge part is dried while no processing liquid is supplied onto the substrate, the discharge part is disposed at a waiting position and the lower opening is closed by the shield plate.

9 Claims, 21 Drawing Sheets

(30) Foreign Application Priority Data

Mar. 28, 2014 (JP) .................................. 2014-068616
Mar. 28, 2014 (JP) .................................. 2014-068617

(52) U.S. Cl.
CPC .. *H01L 21/67023* (2013.01); *H01L 21/67028* (2013.01); *H01L 21/67051* (2013.01); *H01L 21/68742* (2013.01)

(58) Field of Classification Search
CPC ......... H01L 21/67028; H01L 21/67051; H01L 21/6719; H01L 21/02307
See application file for complete search history.

(56) References Cited

U.S. PATENT DOCUMENTS

| 10,573,507 | B2* | 2/2020 | Yoshida ............ H01L 21/67028 |
|---|---|---|---|
| 2002/0074020 | A1 | 6/2002 | Ono et al. ...................... 134/21 |
| 2003/0010671 | A1* | 1/2003 | Orii ..................... C03C 23/0075 206/710 |
| 2003/0172955 | A1 | 9/2003 | Kuroda et al. ..................... 134/2 |
| 2008/0057219 | A1 | 3/2008 | Kim et al. ..................... 427/534 |
| 2009/0038641 | A1 | 2/2009 | Matsumoto ....................... 134/6 |
| 2010/0032097 | A1 | 2/2010 | Ohashi ..................... 156/345.55 |
| 2010/0144158 | A1 | 6/2010 | Ito et al. ....................... 438/758 |
| 2011/0240601 | A1 | 10/2011 | Hashizume et al. ............ 216/83 |
| 2012/0103522 | A1 | 5/2012 | Hohenwarter .......... 156/345.23 |
| 2013/0319470 | A1 | 12/2013 | Kai et al. ................... 134/22.12 |
| 2014/0060423 | A1 | 3/2014 | Nakai et al. ..................... 118/50 |
| 2014/0227883 | A1 | 8/2014 | Izumoto et al. ............. 438/745 |
| 2014/0273498 | A1 | 9/2014 | Kobayashi et al. .......... 438/745 |
| 2014/0290703 | A1 | 10/2014 | Kobayashi et al. ............ 134/33 |
| 2017/0117135 | A1* | 4/2017 | Yoshida ............ H01L 21/67051 |

FOREIGN PATENT DOCUMENTS

| JP | 2003-045838 | | 2/2003 |
|---|---|---|---|
| JP | 2003-282514 | A | 10/2003 |
| JP | 2003-332284 | A | 11/2003 |
| JP | 2005-079220 | A | 3/2005 |
| JP | 2005-268244 | A | 9/2005 |
| JP | 2008-060578 | | 3/2008 |
| JP | 2009-064795 | A | 3/2009 |
| JP | 2009-267101 | | 11/2009 |
| JP | 2010-040818 | | 2/2010 |
| JP | 2010-056218 | | 3/2010 |
| JP | 2010-171229 | | 8/2010 |
| JP | 2011-211095 | A | 10/2011 |
| JP | 2011-216607 | | 10/2011 |
| JP | 2014-067778 | | 4/2014 |
| JP | 2014-067780 | | 4/2014 |
| JP | 2014-154858 | | 8/2014 |
| JP | 2014-157901 | | 8/2014 |
| JP | 2014-179489 | | 9/2014 |
| JP | 2014-179490 | | 9/2014 |
| JP | 2014-194965 | | 10/2014 |
| JP | 2016-063049 | | 4/2016 |
| KR | 10-2007-0091001 | A | 9/2007 |
| KR | 10-0979979 | B1 | 9/2010 |
| TW | 200811934 | A | 3/2008 |
| TW | 201410338 | A | 3/2014 |

OTHER PUBLICATIONS

Written Opinion dated May 26, 2015 in corresponding PCT International Application No. PCT/JP2015/056674.
PCT/IB/326 Notification Concerning Transmitaal of Copy of International Preliminary Report on Patentability including PCT/IB/373 and PCT/ISA/237 (in Japanese) for International Application No. PCT/JP2015/056674 dated Oct. 13, 2016.
PCT/IB/338 Notification of Transmittal of Copies of Translation of the International Preliminary Report on Patentability including PCT/IB/373 and PCT/ISA/237 (in English) for International Application No. PCT/JP2015/056674 dated Oct. 13, 2016.
Notice of Reasons for Refusal dated Jul. 16, 2019 in counterpart Japanese Patent Application No. 2018-219153 with English translation.

* cited by examiner

SUBSTRATE PROCESSING APPARATUS

CROSS-REFERENCE TO RELATED APPLICATIONS

The present application is a divisional of U.S. patent application Ser. No. 15/129,551, filed Sep. 27, 2016, which is a 35 U.S.C. §§ 371 national phase conversion of PCT/JP2015/056674, filed Mar. 6, 2015, which claims priority to Japanese Patent Application Nos. 2014-068615, 2014-068616, 2014-068617 and 2014-068614, filed Mar. 28, 2014, the contents of all of which are incorporated herein by reference.

TECHNICAL FIELD

The present invention relates to a technique for processing a substrate.

BACKGROUND ART

In a process of manufacturing a semiconductor substrate (hereinafter, referred to simply as a "substrate"), conventionally, various processings are performed on a substrate by using a substrate processing apparatus. By supplying a chemical liquid onto a substrate having a surface on which a resist pattern is formed, for example, a processing such as etching or the like is performed on the surface of the substrate. Further, after the etching process is finished, performed are a process of removing the resist from the substrate by supplying a removal liquid onto the substrate and/or a process of cleaning the substrate by supplying a cleaning liquid onto the substrate.

In this type of processing performed on a substrate by using a processing liquid, when the processing is performed under the environment where oxygen exists, such as in the atmosphere, the oxygen sometimes produces an adverse effect on the substrate. There is a case, for example, where the oxygen is dissolved into a chemical liquid used for the processing and the chemical liquid comes into contact with a surface of the substrate, to thereby produce an adverse effect on the surface of the substrate. Particularly, in a case where a metal film is formed on the surface of the substrate, for example, when the oxygen is dissolved into the processing liquid which is a removal liquid, to thereby increase the oxygen concentration in the processing liquid, the metal film on the substrate is sometimes oxidized by the processing liquid. Since a metal oxide is etched by the processing liquid, this causes a film loss of the metal film. It is required that such an adverse effect (oxidation of the metal film) should be prevented as much as possible. Then, in a substrate processing apparatus disclosed in Japanese Patent Application Laid-Open No. 2010-56218, provided is a cutoff member which faces a substrate held by a substrate holding part. The cutoff member includes a substrate facing surface which faces the substrate and a peripheral wall portion protruding from the perimeter of the substrate facing surface toward the substrate holding part. In the substrate processing apparatus disclosed in Japanese Patent Application Laid-Open No. 2010-56218, by providing the cutoff member, an atmosphere of the surface of the substrate is cut off from an atmosphere outside the cutoff member, and an increase of the oxygen concentration in the atmosphere of the surface of the substrate is thereby prevented. Further, Japanese Patent Application Laid-Open No. 2011-216607 and US Patent Application Publication No. 2012/0103522 disclose a substrate processing apparatus having a sealed chamber. In the substrate processing apparatus having the sealed chamber, it is possible to easily reduce the oxygen concentration in an atmosphere around the substrate. In the substrate processing apparatus disclosed in Japanese Patent Application Laid-Open No. 2011-216607 and US Patent Application Publication No. 2012/0103522, a nozzle for supplying a processing liquid onto a substrate is further provided in an internal space of the sealed chamber.

Japanese Patent Application Laid-Open No. 2003-45838 discloses a substrate processing apparatus which includes a spin chuck for rotating a wafer, a cutoff plate provided above the spin chuck, a processing cup for accommodating the spin chuck, and a processing liquid nozzle for supplying a processing liquid onto the wafer. Above the processing cup, provided is a splash guard for preventing the processing liquid from splattering from the wafer to the outside. In the substrate processing apparatus disclosed in Japanese Patent Application Laid-Open No. 2003-45838, by discharging a cleaning liquid toward an upper surface of the cutoff plate being rotated, the cleaning liquid is shaken off and spatters from a periphery of the cutoff plate and the processing liquid adhered to the splash guard is rinsed off by the cleaning liquid.

In the substrate processing apparatuses disclosed in Japanese Patent Application Laid-Open No. 2010-56218 and Japanese Patent Application Laid-Open No. 2003-45838, since the inside of the cutoff member is not completely isolated from the outside thereof, there is a limitation in reduction of the oxygen concentration in the atmosphere of the surface of the substrate (the atmosphere on the substrate). Further, there is also a limitation in rapid reduction of the oxygen concentration in the inside of the cutoff member. Then, there is a possible method in which the substrate is disposed in a chamber (processing chamber) and an inert gas or the like is supplied into the chamber, to thereby reduce the oxygen concentration in the atmosphere around the substrate. However, in a case, for example, where after loading the substrate in the inside of a chamber body, an upper opening of the chamber body is closed by a chamber cover to thereby form the chamber and the inert gas or the like is supplied into the sealed chamber, to thereby bring the chamber into a low oxygen state, there is a possibility that a mist of and/or fumes of the processing liquid which is supplied onto the substrate inside the chamber are adhered to an inner surface of the chamber cover which covers an upper portion of the substrate. Further, in the substrate processing apparatus, the substrate is dried after the processing performed on the substrate by using the processing liquid. Therefore, it is preferable that a space in which the substrate is dried should be kept clean. It is not easy, however, to keep clean the inside of the chamber in which the processing is performed by using the processing liquid.

Further, in the substrate processing apparatus in which a discharge part (nozzle) is provided inside the chamber, a liquid such as the processing liquid or the like is adhered around the discharge part. In this case, when droplets of the liquid fall onto the substrate during unloading or the like of the substrate, the substrate is contaminated. Though there is a possible method in which the discharge part is dried by supplying a gas into the inside of the chamber, this method is an inefficient one since the chamber for processing a substrate has a large size and this needs an increase of gas flow rate.

Furthermore, in order to efficiently perform the processing on a substrate, it is preferable to rapidly and sufficiently bring a substrate environment into a low oxygen state after loading the substrate into the chamber. Since the chamber for processing a substrate has a large size, however, this needs an increase of gas flow rate, or the like, in order to rapidly bring the inside of the chamber into a sufficient low oxygen state after loading the substrate into the chamber.

SUMMARY OF INVENTION

The present invention is intended for a substrate processing apparatus for processing a substrate, and it is an object of the present invention to efficiently dry a discharge part. Further, it is another object of the present invention to keep clean a space to dry the substrate and prevent a mist of or fumes of the processing liquid from entering an internal space of a chamber cover. Furthermore, it is still another object of the present invention to rapidly and efficiently bring a substrate environment into a low oxygen state after loading the substrate into a chamber.

The substrate processing apparatus according to one preferred embodiment of the present invention includes: a chamber cover which has a lower opening and forms a cover internal space having a size in a radial direction larger than that of the lower opening; a chamber body which forms a body internal space and has an upper opening facing the lower opening in a vertical direction, the chamber body together with the chamber cover forming a chamber with the upper opening covered by the chamber cover; a substrate holding part for holding a substrate in a horizontal state inside the chamber; a discharge part disposed in the cover internal space, for discharging a processing liquid toward an upper surface of the substrate; a discharge-part moving mechanism for disposing the discharge part selectively at a discharge position above the lower opening or at a waiting position separated from the lower opening in the radial direction in the cover internal space; a gas supply part for supplying a gas into the cover internal space; a gas exhaust part for exhausting a gas from the cover internal space; and a control part for controlling the discharge-part moving mechanism to dispose the discharge part at the discharge position when the processing liquid is supplied from the discharge part onto the substrate and to dispose the discharge part at the waiting position when the discharge part is dried while no processing liquid is supplied from the discharge part onto the substrate. By the substrate processing apparatus, it is possible to efficiently dry the discharge part by the gas supplied into the cover internal space.

In one aspect, the substrate processing apparatus further includes: a shield plate disposed in the cover internal space, facing the upper surface of the substrate; and a shield plate moving mechanism for moving the shield plate relatively to the chamber cover in the vertical direction in the cover internal space, and in the substrate processing apparatus, the control part controls the shield plate moving mechanism to dispose the shield plate above the discharge part when the processing liquid is supplied from the discharge part onto the substrate and to close the lower opening with the shield plate when the discharge part is dried while no processing liquid is supplied from the discharge part onto the substrate.

In another aspect, the chamber cover includes an exhaust port for exhausting a liquid from the cover internal space, and predispensing is performed in a state where the discharge part is disposed at the waiting position.

The substrate processing apparatus according to another preferred embodiment of the present invention includes: a chamber cover which has a lower opening and forms a cover internal space; a chamber body which forms a body internal space and has an upper opening facing the lower opening in a vertical direction, the chamber body together with the chamber cover forming a chamber with the upper opening covered by the chamber cover; a substrate holding part for holding a substrate in a horizontal state inside the chamber; a substrate moving mechanism for moving the substrate together with the substrate holding part relatively to the chamber in the vertical direction; a processing liquid supply part for supplying a processing liquid onto an upper surface of the substrate when the substrate is disposed in the body internal space; a substrate rotating mechanism for rotating the substrate together with the substrate holding part about a central axis directed in the vertical direction when the substrate is disposed in the cover internal space; a shield plate disposed in the cover internal space, facing the upper surface of the substrate; a shield plate rotating mechanism for rotating the shield plate about a central axis directed in the vertical direction; and a cleaning liquid supply part for supplying a cleaning liquid onto an upper surface of the shield plate, and in the substrate processing apparatus, the cleaning liquid supplied onto the upper surface of the shield plate being rotated spatters from the upper surface of the shield plate toward an inner side surface of the chamber cover by centrifugal force in the cover internal space. By the substrate processing apparatus, it is possible to keep clean the cover internal space to dry the substrate.

The substrate processing apparatus may further include a gas supply part for supplying a gas into the cover internal space; and a gas exhaust part for exhausting a gas from the cover internal space.

Further, the substrate processing apparatus may further include a shield plate moving mechanism for moving the shield plate relatively to the chamber cover in the vertical direction in the cover internal space. In this case, more preferably, the processing liquid supply part includes: a discharge part disposed in the cover internal space, for discharging the processing liquid toward the upper surface of the substrate; and a discharge-part moving mechanism for disposing the discharge part selectively at a discharge position above the lower opening or at a waiting position separated from the lower opening in the radial direction in the cover internal space, and in the substrate processing apparatus, the discharge part is disposed at the discharge position and the shield plate is disposed above the discharge part when the processing liquid is supplied from the discharge part onto the substrate, the discharge part is disposed at the waiting position when no processing liquid is supplied from the discharge part onto the substrate, and when the cleaning liquid is supplied onto the upper surface of the shield plate, the cleaning liquid spatters from the upper surface of the shield plate toward the discharge part positioned at the waiting position.

The substrate processing apparatus according to still another preferred embodiment of the present invention includes: a chamber cover which has a lower opening and forms a cover internal space having a size in a radial direction larger than that of the lower opening; a chamber body which forms a body internal space, the chamber body together with the chamber cover forming a chamber; a substrate holding part for holding a substrate in a horizontal state in the body internal space; a processing liquid supply part for supplying a processing liquid onto an upper surface of the substrate; a shield plate disposed in the cover internal space, facing the upper surface of the substrate, the shield plate being capable of closing the lower opening; a shield plate rotating mechanism for rotating the shield plate about a central axis directed in a vertical direction; and a film formation liquid supply part for supplying a film formation liquid onto an upper surface of the shield plate, and in the substrate processing apparatus, the chamber cover includes: a cover body having a shape like a cup turned upside down; and a cover bottom having an annular shape, which extends from a lower end portion of the cover body inwardly in the radial direction and is provided with the lower opening at a center portion thereof, and the film formation liquid supplied onto the upper surface of the shield plate being rotated flows from the upper surface of the shield plate toward an upper surface of the cover bottom by centrifugal force inside the chamber in a state where the shield plate is separated upward from the lower opening of the chamber cover, to thereby form an annular liquid film between the shield plate and the cover bottom. By the substrate processing apparatus, it is possible to prevent a mist of or fumes of the processing liquid from entering the internal space of the chamber cover.

In one aspect, the substrate processing apparatus further includes: a gas supply part for supplying a gas from a gas ejection port provided at a center portion of a lower surface of the shield plate toward a space between the lower surface of the shield plate and the upper surface of the substrate.

In another aspect, the processing liquid supply part includes: a discharge head for discharging the processing liquid; and a head supporting part which is a member extending in a horizontal direction, having a free end portion to which the discharge head is fixed, and a fixed end portion which is attached to the cover body of the chamber cover in the cover internal space, and the substrate processing apparatus further includes a head rotating mechanism for rotating the discharge head together with the head supporting part about the fixed end portion, and in the substrate processing apparatus, when the processing liquid is supplied onto the substrate, the head rotating mechanism rotates the discharge head and the head supporting part, to thereby dispose the discharge head between the shield plate and the lower opening, and the processing liquid is discharged from the discharge head onto the upper surface of the substrate through the lower opening.

The substrate processing apparatus according to yet another preferred embodiment of the present invention includes: a chamber cover which has a lower opening and a side opening and forms a cover internal space; a chamber body which forms a body internal space and has an upper opening facing the lower opening in a vertical direction, the chamber body together with the chamber cover which covers the upper opening, forming a chamber; a substrate holding part for holding a substrate in a horizontal state inside the chamber; a side opening open/close mechanism for opening and closing the side opening through which the substrate passes when the substrate is loaded into the chamber and unloaded from the chamber; a substrate moving mechanism for moving the substrate together with the substrate holding part relatively to the chamber in the vertical direction; a processing liquid supply part for supplying a processing liquid onto an upper surface of the substrate when the substrate is disposed in the body internal space; a substrate rotating mechanism for rotating the substrate together with the substrate holding part about a central axis directed in the vertical direction when the substrate is disposed in the cover internal space, to thereby dry the substrate; and a gas supply part for supplying a gas into the cover internal space. In the substrate processing apparatus, since the cover internal space in which the substrate is disposed immediately after being loaded into the chamber is a space in which a drying process using a gas is performed, it is possible to rapidly and efficiently supply a gas into a substrate environment and bring the substrate environment into a low oxygen state after loading the substrate into the chamber.

The substrate processing apparatus may further include: a shield plate disposed in the cover internal space, facing the upper surface of the substrate; and a shield plate moving mechanism for disposing the shield plate selectively at a close position close to the upper surface of the substrate disposed in the cover internal space or at a separate position separated from the upper surface of the substrate.

In this case, it is preferable that a size of the cover internal space in a radial direction is larger than that of the lower opening, and the shield plate closes the lower opening while a substrate is not disposed inside the chamber. Further, the gas supply part may supply a gas into a space between a lower surface of the shield plate and the upper surface of the substrate through a gas ejection port provided at a center portion of the lower surface of the shield plate.

The present invention is also intended for a substrate processing method for processing a substrate in a substrate processing apparatus. In the substrate processing method according to one preferred embodiment of the present invention, the substrate processing apparatus includes a chamber cover which has a lower opening and forms a cover internal space; a chamber body which forms a body internal space and has an upper opening facing the lower opening in a vertical direction, the chamber body together with the chamber cover forming a chamber with the upper opening covered by the chamber cover; a substrate holding part for holding a substrate in a horizontal state inside the chamber; a substrate moving mechanism for moving the substrate together with the substrate holding part relatively to the chamber in the vertical direction; a processing liquid supply part for supplying a processing liquid onto an upper surface of the substrate when the substrate is disposed in the body internal space; a substrate rotating mechanism for rotating the substrate together with the substrate holding part about a central axis directed in the vertical direction when the substrate is disposed in the cover internal space; and a shield plate disposed in the cover internal space, facing the upper surface of the substrate, and the substrate processing method includes a) rotating the shield plate about a central axis directed in the vertical direction; and b) supplying a cleaning liquid onto an upper surface of the shield plate, in parallel with the operation a), and in the substrate processing method, the cleaning liquid spatters from the upper surface of the shield plate toward an inner side surface of the chamber cover by centrifugal force in the operation b). By the substrate processing method, it is possible to keep clean the cover internal space to dry the substrate.

In the substrate processing method according to another preferred embodiment of the present invention, the substrate processing apparatus includes: a chamber cover which has a lower opening and forms a cover internal space having a size in a radial direction larger than that of the lower opening; a chamber body which forms a body internal space, the chamber body together with the chamber cover forming a chamber; a shield plate disposed in the cover internal space, facing an upper surface of the substrate, the shield plate being capable of closing the lower opening; and a shield plate rotating mechanism for rotating the shield plate about a central axis directed in the vertical direction, and the chamber cover includes: a cover body provided about the central axis; and a cover bottom having an annular shape, which extends from a lower end portion of the cover body inwardly in the radial direction and is provided with the lower opening at a center portion thereof, and the substrate processing method includes a) forming an annular liquid film between the shield plate and the cover bottom, with a film formation liquid flowing from the upper surface of the shield plate toward an upper surface of the cover bottom by centrifugal force by supplying the film formation liquid onto the upper surface of the shield plate being rotated in a state where the shield plate is separated upward from the lower opening of the chamber cover inside the chamber; and b) supplying a processing liquid onto an upper surface of the substrate in a state where the liquid film is formed. By the substrate processing method, it is possible to prevent a mist of or fumes of the processing liquid from entering the internal space of the chamber cover.

These and other objects, features, aspects and advantages of the present invention will become more apparent from the following detailed description of the present invention when taken in conjunction with the accompanying drawings.

DESCRIPTION OF EMBODIMENTS

Figure 1:
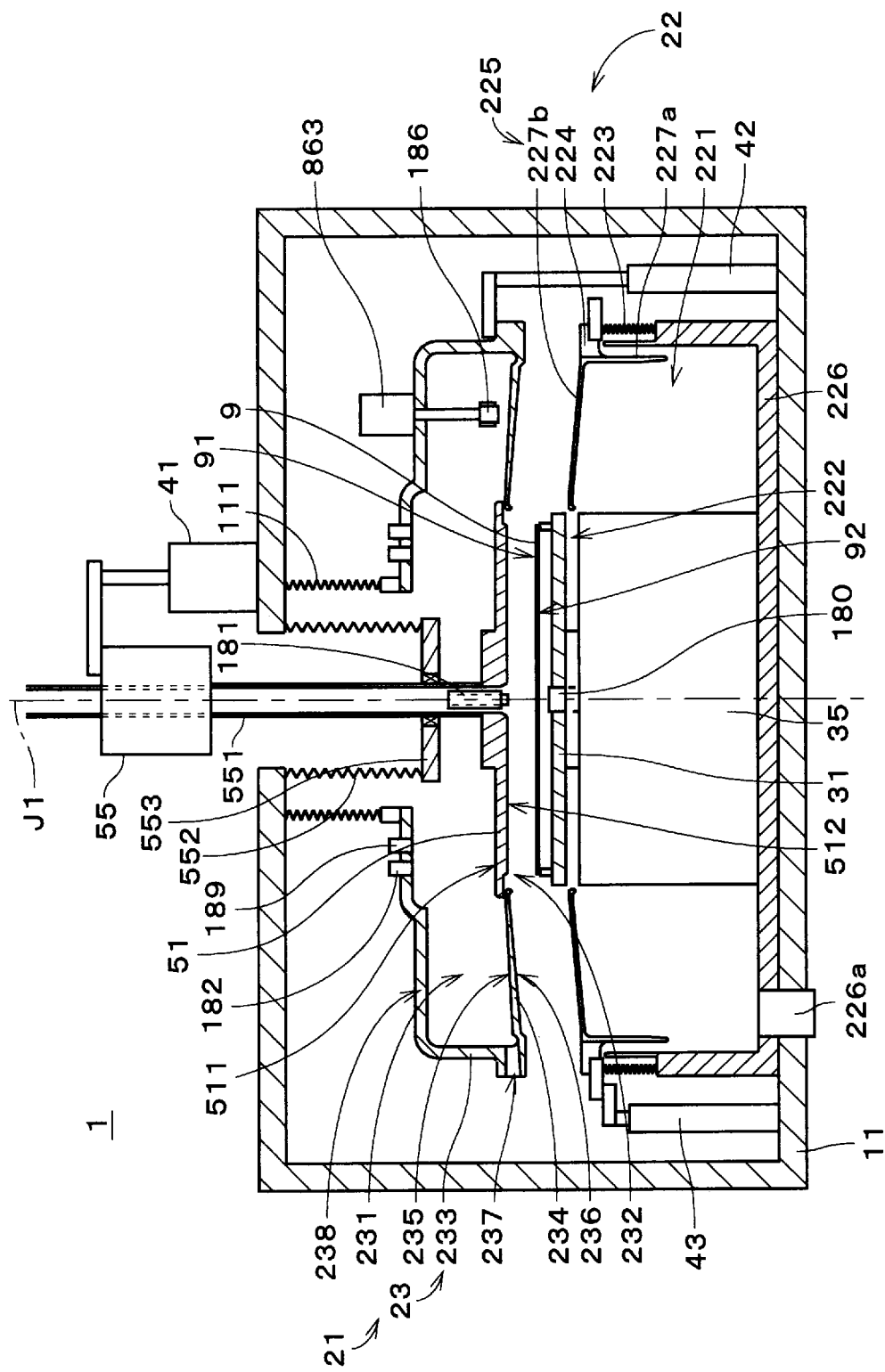
FIG. 1 is a cross section showing a configuration of a substrate processing apparatus in accordance with a first preferred embodiment.

FIG. 1 is a cross section showing a configuration of a substrate processing apparatus substrate processing apparatus 1 in accordance with the first preferred embodiment of the present invention. The substrate processing apparatus 1 is a single-substrate processing apparatus which supplies a processing liquid onto a semiconductor substrate 9 (hereinafter, referred to simply as a "substrate 9") having a substantially disk-like shape and thereby processes the substrates 9 one by one. In FIG. 1, hatching of the cross sections of some constituent elements in the substrate processing apparatus 1 is omitted (the same applies to other cross-sectional views).

The substrate processing apparatus 1 includes a chamber 21, a substrate holding part 31, a substrate rotating mechanism 35, a first moving mechanism 41, a second moving mechanism 42, a third moving mechanism 43, a shield plate 51, a shield plate rotating mechanism 55, and a housing 11. The housing 11 accommodates the chamber 21, the substrate holding part 31, the shield plate 51, and the like.

The chamber 21 has a substantially cylindrical shape with cover and bottom about a central axis J1 directed in a vertical direction. The chamber 21 includes a chamber body 22 and a chamber cover 23. The chamber body 22 faces the chamber cover 23 in the vertical direction. In a state of FIG. 1, the chamber body 22 and the chamber cover 23 are separated from each other in the vertical direction. The chamber body 22 has a substantially bottomed cylindrical shape about the central axis J1, which forms a body internal space 221. The chamber cover 23 has a substantially covered cylindrical shape about the central axis J1, which forms a cover internal space 231. The outer diameter of the chamber body 22 is almost equal to that of the chamber cover 23.

The chamber body 22 has an upper opening 222 having a substantially circular shape. The chamber cover 23 has a lower opening 232 having a substantially circular shape. The upper opening 222 of the chamber body 22 faces the lower opening 232 of the chamber cover 23 in the vertical direction. The diameter of the upper opening 222 of the chamber body 22 is almost equal to that of the lower opening 232 of the chamber cover 23. Further, the size of the cover internal space 231 of the chamber cover 23 in a radial direction about the central axis J1 is larger than that of the lower opening 232 in the radial direction (i.e., the diameter of the lower opening 232). Respective detailed structures of the chamber body 22 and the chamber cover 23 will be described later.

The substrate holding part 31 has a substantially disk-like shape about the central axis J1. The substrate holding part 31 is disposed below the substrate 9 and holds an outer edge portion of the substrate 9 in a horizontal state. In the state of FIG. 1, the substrate holding part 31 is positioned between the chamber body 22 and the chamber cover 23 in the vertical direction. The diameter of the substrate holding part 31 is larger than that of the substrate 9. The diameter of the substrate holding part 31 is smaller than that of the upper opening 222 of the chamber body 22 and smaller than that of lower opening 232 of the chamber cover 23. The upper opening 222 of the chamber body 22 and the lower opening 232 of the chamber cover 23 face the substrate 9 and the substrate holding part 31 in the vertical direction. The substrate rotating mechanism 35 is disposed below the substrate holding part 31. The substrate rotating mechanism 35 rotates the substrate 9 together with the substrate holding part 31 about the central axis J1.

The shield plate 51 has a substantially disk-like shape about the central axis J1. The shield plate 51 is disposed in the cover internal space 231 which is an internal space of the chamber cover 23. It is preferable that the size of the shield plate 51 in the radial direction (i.e., the diameter of the shield plate 51) should be larger than the diameter of the lower opening 232 of the chamber cover 23. The shield plate 51 is capable of closing the lower opening 232 of the chamber cover 23. The shield plate 51 faces an upper surface 91 of the substrate 9 held by the substrate holding part 31 through the lower opening 232 in the vertical direction.

The shield plate rotating mechanism 55 is disposed above the shield plate 51. The shield plate rotating mechanism 55 is, for example, a hollow shaft motor. The shield plate rotating mechanism 55 rotates the shield plate 51 about the central axis J1 in the cover internal space 231 of the chamber cover 23. The rotation of the shield plate 51 by the shield plate rotating mechanism 55 is performed independently of that of the substrate 9 by the substrate rotating mechanism 35.

A rotation axis 551 of the shield plate rotating mechanism 55 is connected to the shield plate 51 through a through hole provided at an upper portion of the housing 11 and another through hole provided at an upper portion of the chamber cover 23. A portion around the through hole of the housing 11 and a portion around the through hole of the chamber cover 23 are connected to each other with an extensible member 111 (e.g., a bellows) which has a substantially cylindrical shape and is extensible in the vertical direction. Further, the rotation axis 551 is provided with a flange portion 553 having a substantially disk-like shape, and an outer peripheral portion of the flange portion 553 and the portion around the through hole of the housing 11 are connected to each other with an extensible member 552 (e.g., a bellows) which has a substantially cylindrical shape and is extensible in the vertical direction. In the substrate processing apparatus 1, a space inside the housing 11 is separated from a space outside the housing 11 with the flange portion 553 and the extensible member 552. Furthermore, a space inside the chamber cover 23 is separated from a space inside the housing 11 and outside the chamber cover 23 with the extensible member 111.

The first moving mechanism 41 is disposed, for example, above the housing 11. The first moving mechanism 41 moves the shield plate 51 together with the shield plate rotating mechanism 55 in the vertical direction. The shield plate 51 is moved by the first moving mechanism 41 in the vertical direction in the cover internal space 231 of the chamber cover 23. As described above, since the shield plate 51 is larger than the lower opening 232 of the chamber cover 23, the shield plate 51 does not move to the outside of the chamber cover 23 (below a cover bottom 234 described later) through the lower opening 232. The first moving mechanism 41 includes, for example, a motor and a ball screw (the same applies to the second moving mechanism 42 and the third moving mechanism 43).

The chamber cover 23 includes a cover body 233 and a cover bottom 234. The cover body 233 has a substantially covered cylindrical shape about the central axis J1. In other words, the cover body 233 has a shape like a cup turned upside down. As described above, the through hole at a center portion of the cover body 233, i.e., the through hole at the upper portion of the chamber cover 23 is closed by the extensible members 111 and 552, part of the upper portion of the housing 11, and the flange portion 553. These members which close the through hole may be regarded as part of the cover body 233. Further, a cylindrical space formed by the extensible members 111 and 552 is part of the cover internal space 231.

The cover bottom 234 has a substantially annular disk-like shape about the central axis J1 and is provided with the above-described lower opening 232 at a center portion thereof. The cover bottom 234 extends from a lower end portion of the cover body 233 inwardly in the radial direction. An upper surface 235 and a lower surface 236 of the cover bottom 234 are sloped surfaces going downward as these go outward in the radial direction. At a connecting portion between the cover bottom 234 and the cover body 233 of the chamber cover 23, provided is a cover exhaust port 237. Through the cover exhaust port 237, a liquid and a gas are exhausted from the cover internal space 231.

In the state of FIG. 1, a lower surface 512 of the shield plate 51 superposed on the lower opening 232 of the chamber cover 23 is in contact with an upper surface 235 of the cover bottom 234 along the entire circumference of the lower opening 232. Specifically, an outer peripheral portion of the lower surface 512 of the shield plate 51 is in contact with a portion of the upper surface 235 of the cover bottom 234, which is near to the lower opening 232, along the entire circumference. The lower opening 232 of the chamber cover 23 is thereby closed by the shield plate 51, and the cover internal space 231 above the lower opening 232 becomes a closed space. Further, in the present preferred embodiment, though a contact portion between the shield plate 51 and the cover bottom 234 is not a complete airtight structure and therefore the cover internal space 231 is not completely cut off from the outside space, there may be a case where the contact portion is an airtight structure provided with a seal member or the like and the cover internal space 231 is a sealed space isolated from the outside space.

The second moving mechanism 42 is disposed on a side of the chamber body 22, and moves the chamber cover 23 in the vertical direction. Specifically, the chamber cover 23 is moved between an "upper position" shown in FIG. 1 and a "lower position" shown in FIG. 2 by the second moving mechanism 42. In a state where the chamber cover 23 is disposed at the upper position, the lower opening 232 is positioned above the substrate 9 on the substrate holding part 31, and in a state where the chamber cover 23 is disposed at the lower position, the lower opening 232 is positioned below the substrate 9 on the substrate holding part 31. When the chamber cover 23 is moved from the upper position to the lower position which is lower than the upper position, the shield plate 51 is also moved by the first moving mechanism 41 in the vertical direction. Actually, a relative position of the shield plate 51 relative to the chamber cover 23 in the vertical direction is changed. Thus, the first moving mechanism 41 and the second moving mechanism 42 serves as a shield plate moving mechanism for moving the shield plate 51 relatively to the chamber cover 23 in the vertical direction in the cover internal space 231 of the chamber cover 23.

As shown in FIG. 1, the chamber body 22 includes an outer cylinder portion 223, an outer cylinder connecting portion 224, a cup part 225, and a body bottom 226. The cup part 225 has a substantially cylindrical shape about the central axis J1. The cup part 225 is positioned outside the substrate rotating mechanism 35 in the radial direction along the entire circumference thereof below the chamber cover 23. The cup part 225 includes a cup sidewall 227a having a substantially cylindrical shape about the central axis J1 and a cup top portion 227b having a substantially annular disk-like shape extending from an upper end of the cup sidewall 227a inwardly in the radial direction.

The outer cylinder portion 223 has a substantially cylindrical shape about the central axis J1. The outer cylinder portion 223 is positioned outside the cup part 225 in the radial direction along the entire circumference thereof. The outer cylinder portion 223 is, for example, a bellows in which a plurality of mountain fold lines each having a circumferential shape and a plurality of valley fold lines each having a circumferential shape are arranged alternately in the vertical direction. Below the outer cylinder portion 223, the cup part 225, and the substrate holding part 31, disposed is the body bottom 226 having a substantially bottomed cylindrical shape. A lower end portion of the outer cylinder portion 223 is connected to an upper end portion of a sidewall portion of the body bottom 226 along the entire circumference thereof. At a bottom of the body bottom 226, provided is a body exhaust port 226a. The body exhaust port 226a is disposed below the substrate 9, the substrate holding part 31, and the cup part 225 in the body internal space 221 which is an internal space of the chamber body 22. A liquid and a gas are exhausted from the chamber body 22 through the body exhaust port 226a to the outside of the chamber body 22 (i.e., the outside of the chamber 21). At the body bottom 226, a plurality of body exhaust ports 226a may be provided, being arranged in a circumferential direction.

The outer cylinder connecting portion 224 has a substantially annular disk-like shape about the central axis J1. The outer cylinder connecting portion 224 connects an upper end portion of the outer cylinder portion 223 and an outer edge portion of the cup part 225. Specifically, the outer cylinder connecting portion 224 connects the upper end portion of the outer cylinder portion 223 and an outer edge portion of the cup top portion 227b. The outer cylinder connecting portion 224 closes a gap between the upper end portion of the outer cylinder portion 223 and the cup part 225.

The third moving mechanism 43 is disposed on a side of the chamber body 22 and moves part of the chamber body 22 in the vertical direction. Specifically, the third moving mechanism 43 moves the cup part 225 of the chamber body 22 between the "lower position" shown in FIGS. 1 and 2 and the "upper position" shown in FIG. 3. In a state where the cup part 225 is disposed at the lower position, the upper opening 222 is positioned below the substrate 9 on the substrate holding part 31, and in a state where the cup part 225 is disposed at the upper position, the upper opening 222 is positioned above the substrate 9 on the substrate holding part 31. When the cup part 225 is moved in the vertical direction, the outer cylinder portion 223 extends and contracts in the vertical direction. Further, in the substrate processing apparatus 1, the body bottom 226 of the chamber body 22 and the substrate holding part 31 are not moved in the vertical direction.

Figure 2:
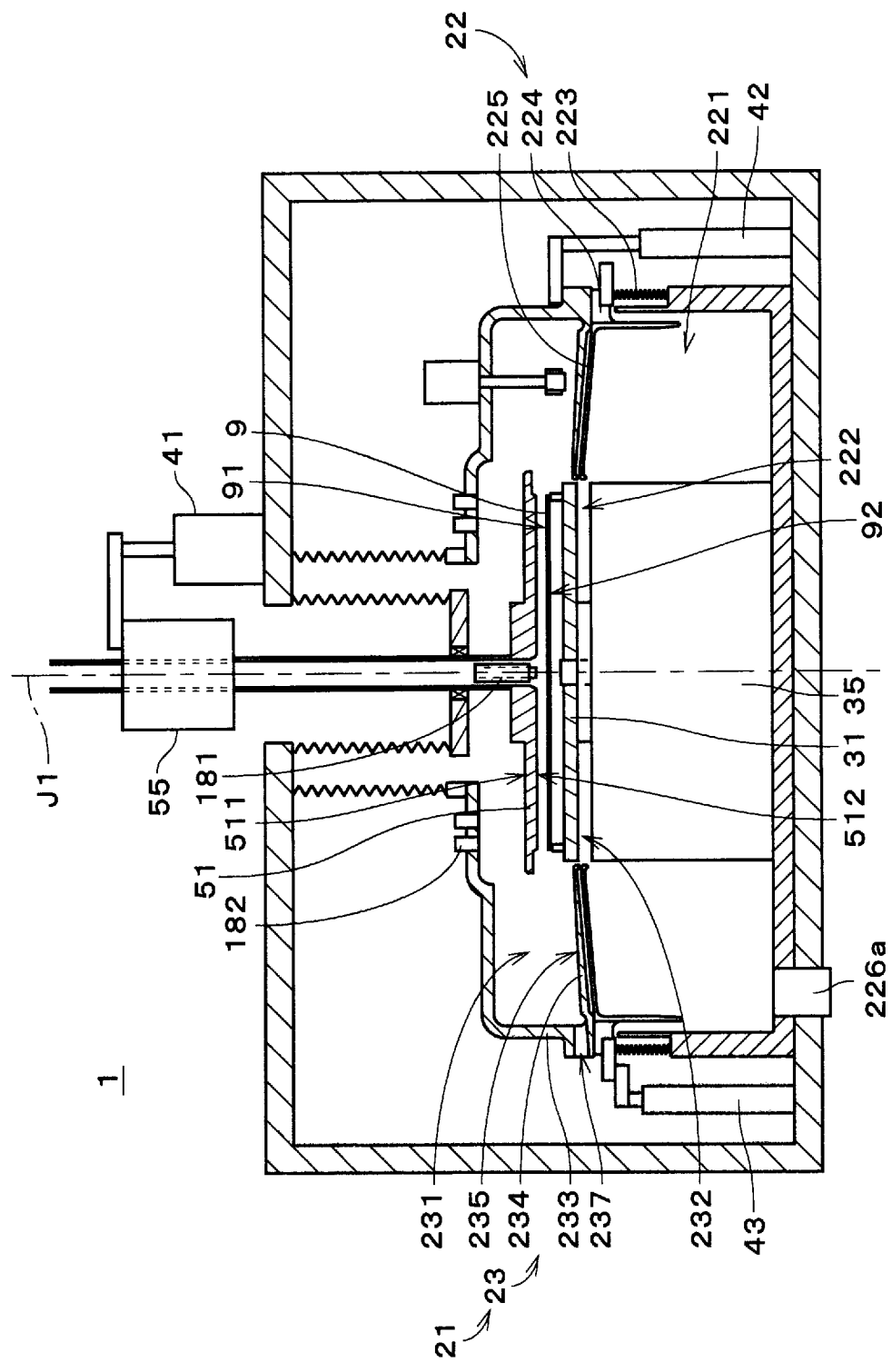
FIGS. 2 and 3 are cross sections each showing the substrate processing apparatus.

As shown in FIG. 2, in a state where the chamber cover 23 is positioned at the lower position and the cup part 225 of the chamber body 22 is also positioned at the lower position, the upper opening 222 is covered by the chamber cover 23, with the upper opening 222 of the chamber body 22 facing the lower opening 232 of the chamber cover 23. The chamber 21 is thereby formed by the chamber cover 23 and the chamber body 22 to have a sealed space (i.e., a space including the cover internal space 231 and the body internal space 221, and hereinafter, referred to as a "chamber space") inside. In detail, the chamber 21 is formed with the connecting portion between the cover body 233 and the cover bottom 234 of the chamber cover 23 in contact with the outer cylinder portion 223 of the chamber body 22 along the entire circumference thereof through the outer cylinder connecting portion 224.

Figure 3:
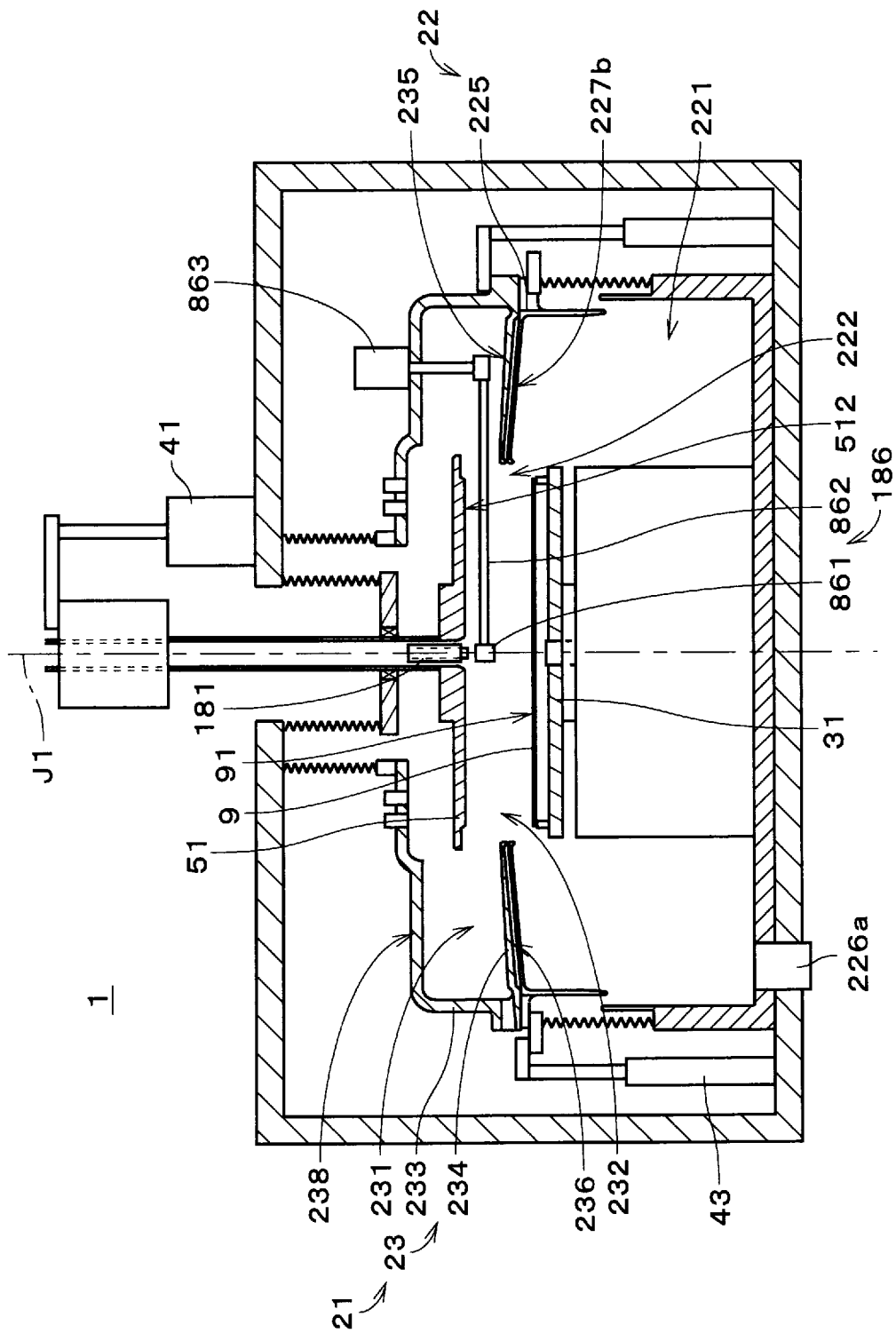

Further, as shown in FIG. 3, also in a state where the cup part 225 of the chamber body 22 is positioned at the upper position and the chamber cover 23 is also positioned at the upper position, similarly, the lower opening 232 of the chamber cover 23 becomes adjacent to the upper opening 222 of the chamber body 22, and the chamber cover 23 thereby covers the upper opening 222. The chamber body 22 together with the chamber cover 23 thereby forms the chamber 21. As shown in FIGS. 2 and 3, inside the chamber 21 (i.e., in the chamber space), accommodated are the substrate 9 and the substrate holding part 31. On the other hand, as shown in FIG. 1, in a state where the chamber cover 23 is positioned at the upper position and the cup part 225 of the chamber body 22 is positioned at the lower position, the lower opening 232 of the chamber cover 23 is separated upward from the upper opening 222. Therefore, around the substrate 9 on the substrate holding part 31, an annular gap is formed between the cover bottom 234 of the chamber cover 23 and the cup top portion 227b of the cup part 225, to thereby open the chamber 21 (in other words, the upper opening 222 is substantially opened). Thus, the second moving mechanism 42 and the third moving mechanism 43 serve as a chamber open/close mechanism which moves the chamber cover 23 relatively to the chamber body 22 in the vertical direction and covers the upper opening 222 of the chamber body 22 by the chamber cover 23, to thereby form the chamber 21.

Figure 4:
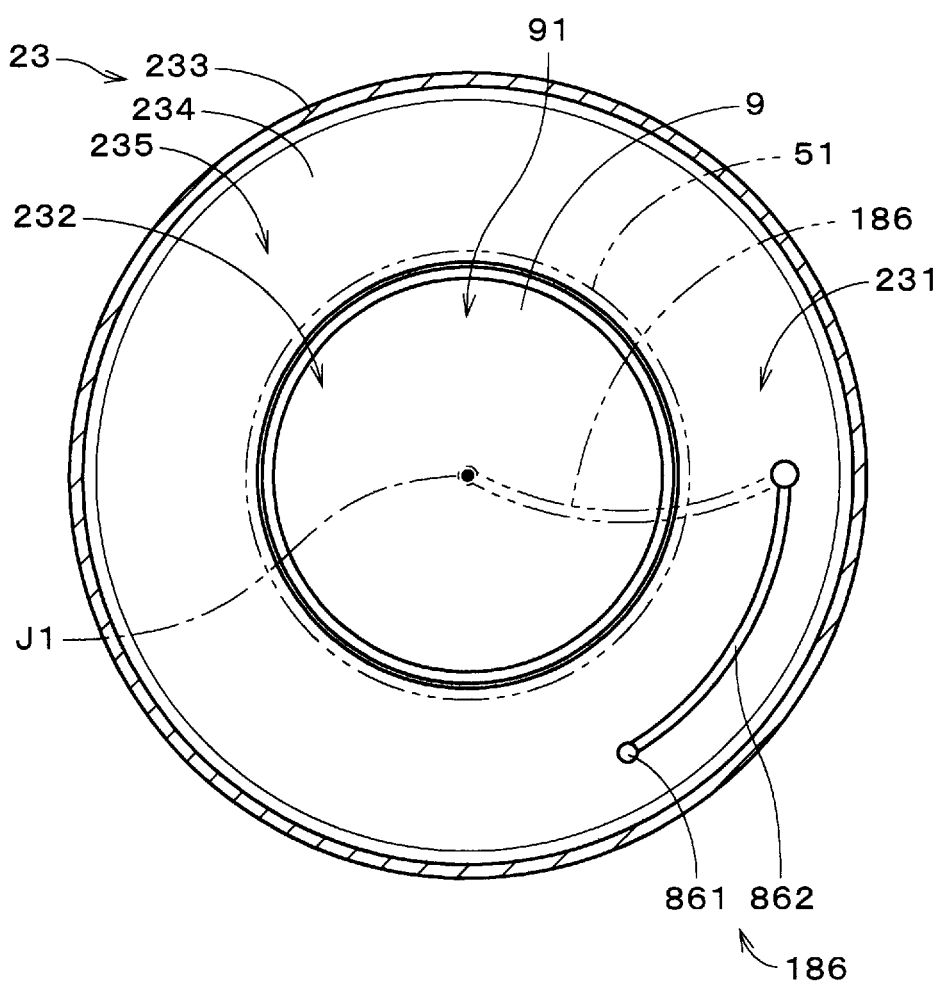
FIG. 4 is a view showing a scanning nozzle inside a chamber cover.

FIG. 4 is a view showing the inside of the chamber cover 23, and shows a cross section of the chamber cover 23 perpendicular to the central axis J1. In FIG. 4, the shield plate 51 is indicated by a two-dot chain line. As shown in FIGS. 3 and 4, to the chamber cover 23, attached is a scanning nozzle 186 serving as a discharge part. The scanning nozzle 186 is disposed in the cover internal space 231 and discharges a processing liquid toward the upper surface 91 of the substrate 9. The scanning nozzle 186 includes a discharge head 861 and a head supporting part 862. The discharge head 861 discharges the processing liquid downward. The head supporting part 862 is a member extending in a substantially horizontal direction to support the discharge head 861. The head supporting part 862 bends convexly outward in the radial direction in a plan view (see FIG. 4). In other words, the scanning nozzle 186 has a substantially arc shape, and in the cover internal space 231, the scanning nozzle 186 is disposed so that the head supporting part 862 may be positioned along a sidewall portion of the cover body 233. One end portion (i.e., a fixed end portion) of the head supporting part 862 is attached to a hood portion 238 of the cover body 233 of the chamber cover 23 (see FIG. 3) in the cover internal space 231. To the other end portion (i.e., a free end portion) of the head supporting part 862, the discharge head 861 is fixed.

At an upper surface of the hood portion 238 of the chamber cover 23, provided is a head rotating mechanism 863. The head rotating mechanism 863 rotates the discharge head 861 together with the head supporting part 862 substantially horizontally about the fixed end portion of the head supporting part 862. The head rotating mechanism 863 disposes the discharge head 861 selectively at a discharge position above the lower opening 232 (see the scanning nozzle 186 indicated by the two-dot chain line in FIG. 4) or at a waiting position separated from the lower opening 232 in the radial direction in the cover internal space 231 (see the scanning nozzle 186 indicated by a solid line in FIG. 4). In other words, the head rotating mechanism 863 is capable of disposing the scanning nozzle 186 at the discharge position where the discharge head 861 faces the upper surface 91 of the substrate 9 and at the waiting position where the entire scanning nozzle 186 is positioned above the cover bottom 234 (which is a position above the cup top portion 227b). Thus, the head rotating mechanism 863 serves as a discharge-part moving mechanism for moving the scanning nozzle 186 which is a discharge part, in the cover internal space 231. The scanning nozzle 186 disposed at the waiting position is never in contact with the shield plate 51 which moves in the vertical direction. Further, the discharge-part moving mechanism may include a head up-and-down moving mechanism for moving the discharge head 861 and the head supporting part 862 in the vertical direction.

As shown in FIG. 1, inside the rotation axis 551 of the shield plate rotating mechanism 55, provided is an upper center nozzle 181. At a center portion of a lower end of the upper center nozzle 181, provided is a processing liquid discharge port for discharging a processing liquid toward the upper surface 91 of the substrate 9. Pure water delivered from a pure water supply part 814 (see FIG. 5) described later is discharged from the processing liquid discharge port. Further, at the lower end of the upper center nozzle 181, a gas ejection port having a substantially annular shape is provided around the processing liquid discharge port. An inert gas delivered from an inert gas supply part 816 described later is supplied from the gas ejection port toward a space (i.e., a space between the lower surface 512 of the shield plate 51 and the upper surface 91 of the substrate 9) below the shield plate 51. The lower end of the upper center nozzle 181 is disposed at almost the same position as that of the lower surface 512 of the shield plate 51 in the vertical direction. In other words, the processing liquid discharge port and the gas ejection port of the upper center nozzle 181 are provided at a center portion of the lower surface 512 of the shield plate 51.

At the center of the substrate holding part 31, attached is a lower nozzle 180. The lower nozzle 180 faces the upper center nozzle 181 with the substrate 9 interposed therebetween. An upper end portion of the lower nozzle 180 is slightly separated from a lower surface 92 of the substrate 9. On the hood portion 238 of the cover body 233 in the chamber cover 23, provided are a plurality of outer cover nozzles 182 and a plurality of inner cover nozzles 189. The plurality of outer cover nozzles 182 and the plurality of inner cover nozzles 189 are positioned above the shield plate 51 and face an upper surface 511 of the shield plate 51 in the vertical direction. The plurality of outer cover nozzles 182 are disposed circumferentially about the central axis J1. The plurality of inner cover nozzles 189 are disposed inside the plurality of outer cover nozzles 182 in the radial direction (on the side of the central axis J1).

Figure 5:
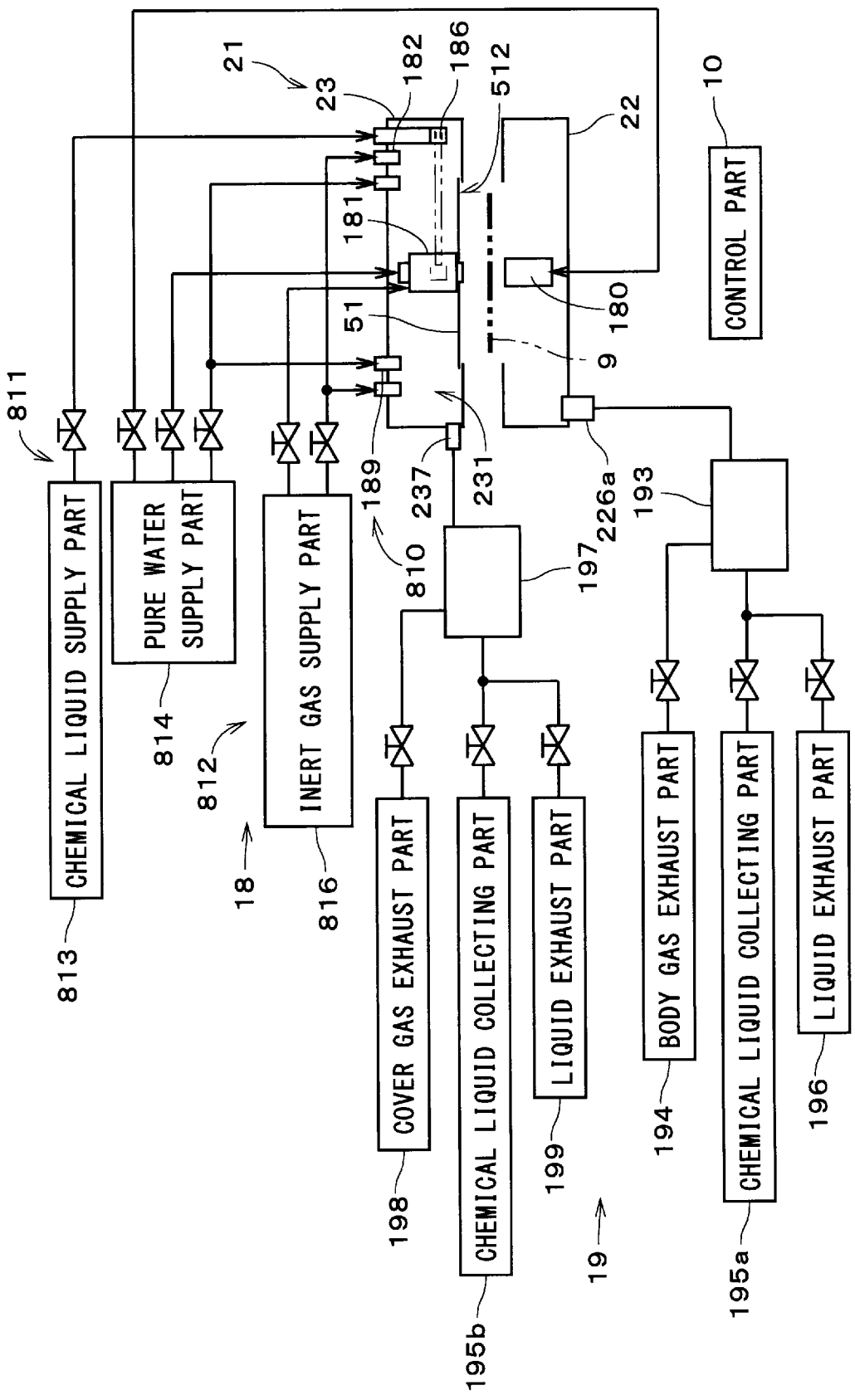
FIG. 5 is a block diagram showing a gas-liquid supply part and a gas-liquid exhaust part.

FIG. 5 is a block diagram showing a gas-liquid supply part 18 and a gas-liquid exhaust part 19 included in the substrate processing apparatus 1. The gas-liquid supply part 18 includes a processing liquid supply part 811, a gas supply part 812, and a cleaning liquid supply part 810. The processing liquid supply part 811 includes the scanning nozzle 186, the upper center nozzle 181, the lower nozzle 180, a chemical liquid supply part 813, and a pure water supply part 814. The chemical liquid supply part 813 is connected to the scanning nozzle 186 through a valve. The pure water supply part 814 is connected to the upper center nozzle 181 through a valve. The pure water supply part 814 is also connected to the lower nozzle 180 through another valve.

The gas supply part 812 includes the upper center nozzle 181, the plurality of outer cover nozzles 182, and the inert gas supply part 816. The inert gas supply part 816 is connected to the upper center nozzle 181 through a valve. The inert gas supply part 816 is also connected to the plurality of outer cover nozzles 182 through respective valves. The cleaning liquid supply part 810 includes the plurality of inner cover nozzles 189, the lower nozzle 180, and the pure water supply part 814. As described earlier, the pure water supply part 814 is connected to the lower nozzle 180. The pure water supply part 814 is also connected to the plurality of inner cover nozzles 189 through respective valves.

In the gas-liquid supply part 18, the upper center nozzle 181 is shared by the processing liquid supply part 811 and the gas supply part 812, and the lower nozzle 180 is shared by the processing liquid supply part 811 and the cleaning liquid supply part 810. Further, the pure water supply part 814 is shared by the processing liquid supply part 811 and the cleaning liquid supply part 810. The processing liquid supply part 811, the gas supply part 812, and the cleaning liquid supply part 810 may be formed by constituent elements which are independent of one another. Furthermore, the arrangement of the nozzles provided in the chamber 21 may be changed as appropriate.

The gas-liquid exhaust part 19 includes the body exhaust port 226a, the cover exhaust port 237, a gas-liquid separating part 193, a body gas exhaust part 194, a chemical liquid collecting part 195a, a liquid exhaust part 196, a gas-liquid separating part 197, a cover gas exhaust part 198, a chemical liquid collecting part 195b, and a liquid exhaust part 199. The body exhaust port 226a provided in the chamber body 22 is connected to the gas-liquid separating part 193. The gas-liquid separating part 193 is connected to the body gas exhaust part 194, the chemical liquid collecting part 195a, and the liquid exhaust part 196 through respective valves. The cover exhaust port 237 provided on the chamber cover 23 is connected to the gas-liquid separating part 197. The gas-liquid separating part 197 is connected to the cover gas exhaust part 198, the chemical liquid collecting part 195b, and the liquid exhaust part 199 through respective valves. The constituent elements of the gas-liquid supply part 18 and the gas-liquid exhaust part 19 are controlled by a control part 10. The first moving mechanism 41, the second moving mechanism 42, the third moving mechanism 43, the substrate rotating mechanism 35, and the shield plate rotating mechanism 55 (see FIG. 1) are also controlled by the control part 10.

A chemical liquid supplied from the chemical liquid supply part 813 through the scanning nozzle 186 onto the substrate 9 is, for example, a polymer removal liquid or an etching solution such as hydrofluoric acid, a tetramethylammonium hydroxide solution, or the like. The pure water supply part 814 supplies pure water (DIW: deionized water) onto the substrate 9 through the upper center nozzle 181 and the lower nozzle 180. The processing liquid supply part 811 may include another supply part for supplying a processing liquid (for example, a solvent such as isopropyl alcohol (IPA) or the like, an acid solution, an alkaline solution, a removal liquid, or the like) other than the above-described chemical liquid and pure water. As described later, the pure water supplied from the pure water supply part 814 into the cover internal space 231 is also a cleaning liquid for cleaning the inside of the chamber cover 23. The cleaning liquid supply part 810 may include another supply part for supplying a cleaning liquid other than the pure water. A gas supplied from the inert gas supply part 816 is, for example, nitrogen ($N_2$) gas. The gas supply part 812 may include another supply part for supplying an inert gas other than nitrogen gas or a gas other than the inert gas.

Figure 6:
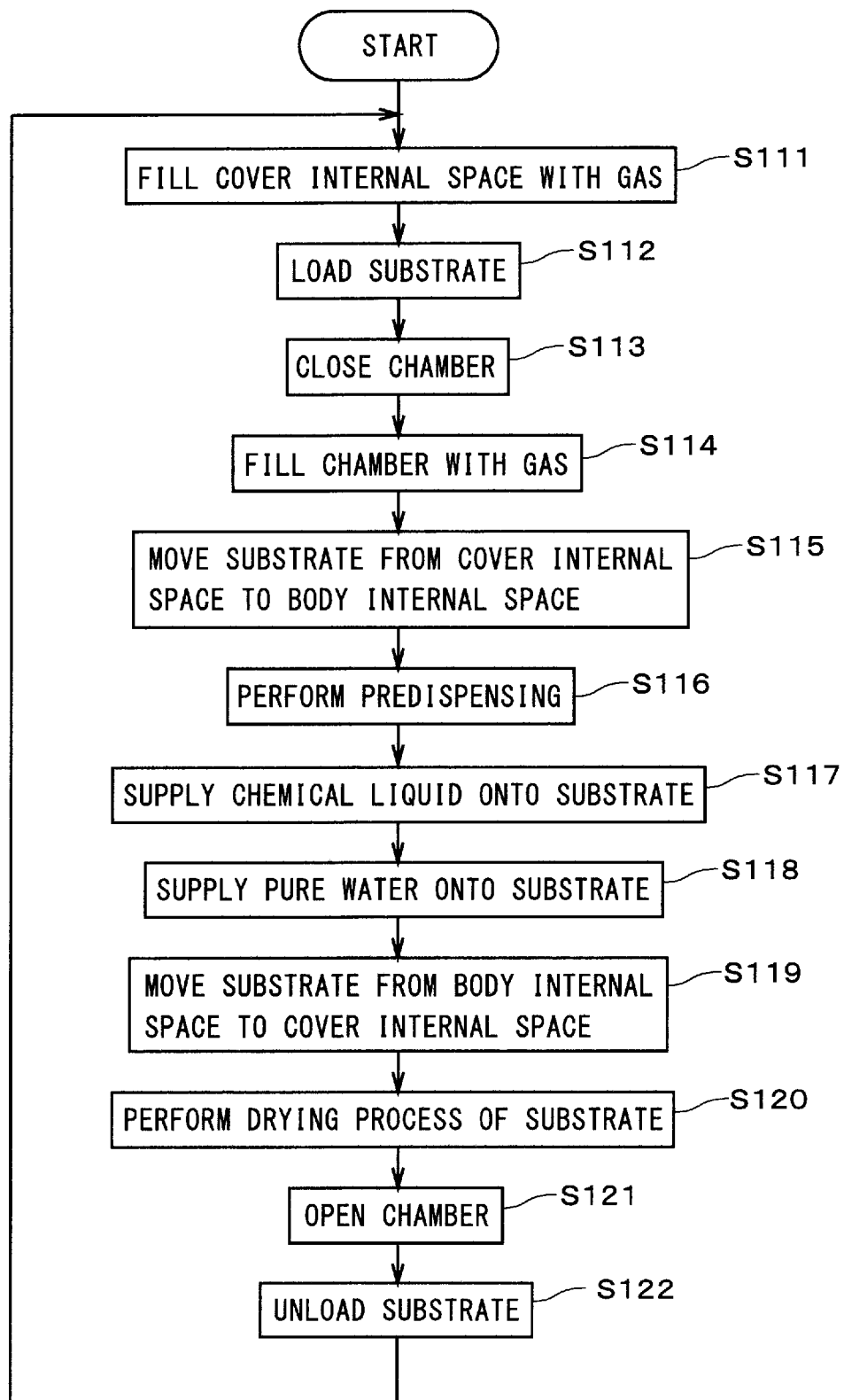
FIG. 6 is a flowchart showing an operation flow for processing a substrate.

Next, an operation flow for processing the substrate 9 in the substrate processing apparatus 1 will be described, with reference to FIG. 6. In the substrate processing apparatus 1, first, as shown in FIG. 1, the chamber cover 23 is positioned at the upper position and the cup part 225 of the chamber body 22 is positioned at the lower position. In other words, the substrate processing apparatus 1 is in the state where the chamber 21 is opened. Further, the shield plate 51 is superposed on the lower opening 232 of the chamber cover 23 and the lower surface 512 of the shield plate 51 comes into contact with the upper surface 235 of the cover bottom 234, to thereby close the lower opening 232 and bring the cover internal space 231 into a closed space. Further, in the substrate processing apparatus 1, nitrogen gas is supplied from the plurality of outer cover nozzles 182 of the gas supply part 812 (see FIG. 5) into the cover internal space 231 and a gas in the cover internal space 231 is exhausted from the cover exhaust port 237 to the outside of the chamber cover 23. Therefore, the cover internal space 231 is filled with the nitrogen gas (Step S111). In the substrate processing apparatus 1, in principle, the supply of the nitrogen gas into the cover internal space 231 and the exhaust of the gas from the cover internal space 231 are always performed.

In Step S111, it is not always necessary to hermetically seal the lower opening 232 of the chamber cover 23 by the shield plate 51 but there may be a very small gap between the shield plate 51 and the cover bottom 234 only if the shield plate 51 is superposed on the lower opening 232. Even in this state, by controlling the feed rate of the nitrogen gas from the gas supply part 812 into the cover internal space 231 to make the inflow of the nitrogen gas into the cover internal space 231 almost equal to the outflow of the gas from the gap and the cover exhaust port 237, the cover internal space 231 is filled with the nitrogen gas. Further, though the substrate 9 is shown in FIG. 1, Step S111 is performed before the substrate 9 is loaded into the substrate processing apparatus 1.

Subsequently, as described above, in a state where the chamber cover 23 is separated from the chamber body 22, the substrate 9 is loaded into the housing 11 from a carry-in/carry-out port (not shown) provided on the housing 11 by an external transfer mechanism. The substrate 9 passes through a gap between a lower surface 236 of the cover bottom 234 and an upper surface of the cup top portion 227b and is moved to below the shield plate 51, and is then held by the substrate holding part 31 (Step S112). In Step S112, the substrate 9 is held by the substrate holding part 31 above the upper opening 222 of the chamber body 22.

After the substrate 9 is held by the substrate holding part 31, the chamber cover 23 is moved downward, by driving the second moving mechanism 42, from the upper position shown in FIG. 1 to the lower position shown in FIG. 2. In other words, the chamber cover 23 is moved relatively to chamber body 22 in the vertical direction. Then, with the upper opening 222 of the chamber body 22 covered by the chamber cover 23, the chamber 21 is closed (Step S113). Specifically, the chamber 21 in which the substrate 9 and the substrate holding part 31 are accommodated is formed. At that time, the shield plate 51 is moved upward relatively to the chamber cover 23 by driving the first moving mechanism 41, and the shield plate 51 is thereby separated upward from the lower opening 232 of the chamber cover 23 in the chamber 21.

As described above, when the chamber cover 23 is moved from the upper position to the lower position, the substrate 9 held by the substrate holding part 31 is moved into the cover internal space 231 through the lower opening 232 of the chamber cover 23. In other words, in Step S113, in the state where the chamber 21 is formed, the substrate 9 is positioned in the cover internal space 231 among the chamber space. As described above, since the cover internal space 231 is filled with the nitrogen gas, when the substrate 9 is moved into the cover internal space 231, the environment of the substrate 9 can be rapidly brought into a nitrogen gas atmosphere (i.e., a low oxygen atmosphere). In the cover internal space 231, the upper surface 91 of the substrate 9 and the lower surface 512 of shield plate 51 face each other, being adjacent to each other, in the vertical direction.

In a state of FIG. 2, when the plurality of outer cover nozzles 182 positioned above the shield plate 51 supply the nitrogen gas into the cover internal space 231, the atmospheric pressure of the cover internal space 231 becomes higher than that of the body internal space 221. For this reason, the nitrogen gas in the cover internal space 231 is delivered (supplied) into the body internal space 221 from the gap between the shield plate 51 and the cover bottom 234 of the chamber cover 23 through the lower opening 232 and the upper opening 222. Further, the gas in the body internal space 221 is exhausted from the body exhaust port 226a to the outside of the chamber 21. After a predetermined time elapses from the formation of the chamber 21, the body internal space 221 is thereby also filled with the nitrogen gas supplied from the gas supply part 812. In other words, the nitrogen gas is supplied by the gas supply part 812 into the chamber 21, to thereby fill the inside of the chamber 21 (Step S114). Hereinafter, the process of Step S114 will be referred to as a "gas replacement process".

In the gas replacement process of Step S114, besides the plurality of outer cover nozzles 182, the upper center nozzle 181 is also used for supplying the nitrogen gas into the chamber 21. Specifically, the nitrogen gas from the gas supply part 812 is also supplied into a space between the lower surface 512 of the shield plate 51 and the upper surface 91 of the substrate 9 through the gas ejection port of the upper center nozzle 181. The atmosphere in the space between the shield plate 51 and the substrate 9 can be thereby rapidly replaced by the nitrogen gas atmosphere.

Figure 7:
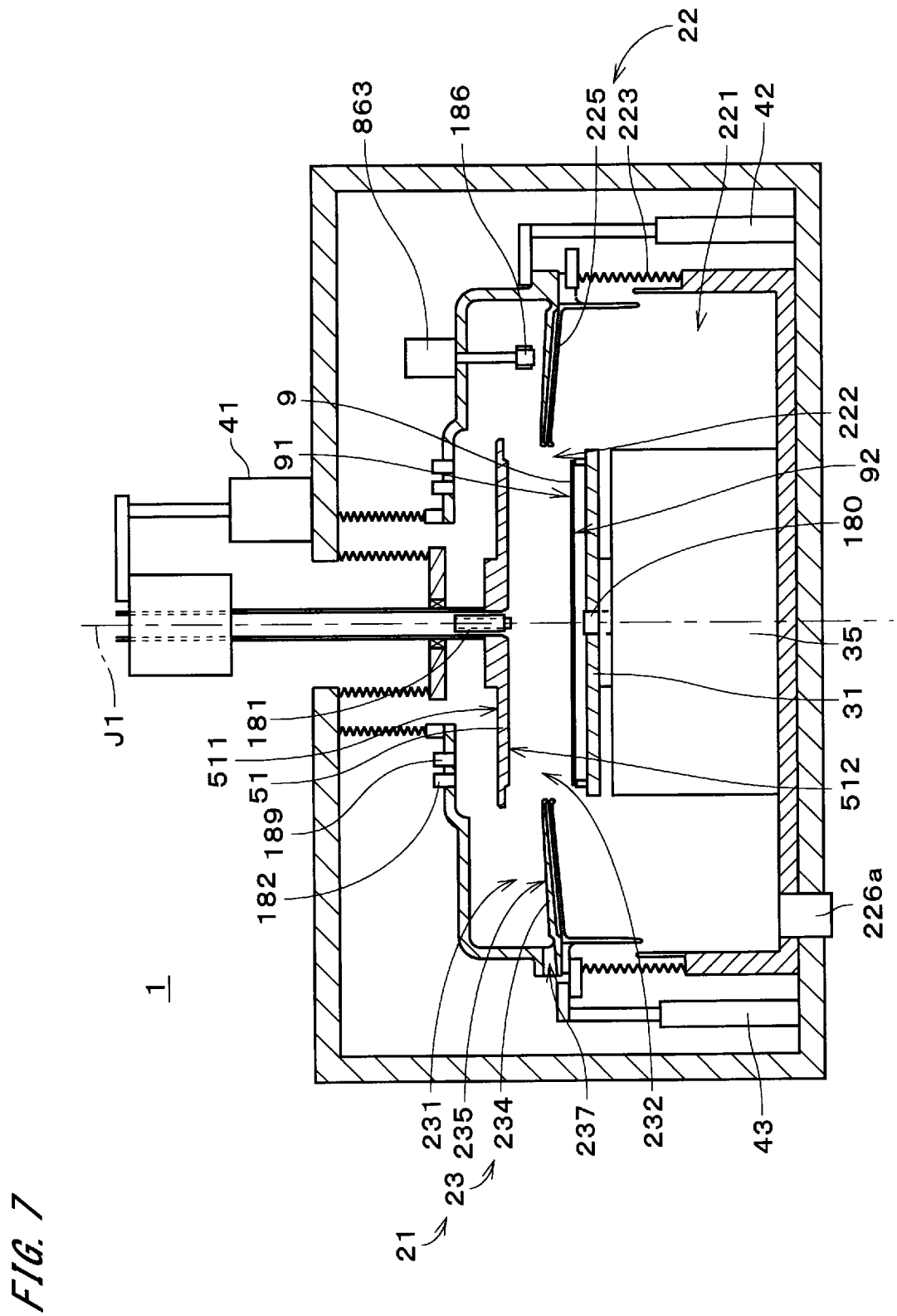
FIG. 7 is a cross section showing the substrate processing apparatus.

Next, the chamber cover 23 and the cup part 225 of the chamber body 22 are each moved upward, by driving the second moving mechanism 42 and the third moving mechanism 43, from the lower position shown in FIG. 2 to the upper position shown in FIG. 7. In other words, by the second moving mechanism 42 and the third moving mechanism 43, the substrate 9 together with the substrate holding part 31 is moved downward relatively to the chamber 21. The second moving mechanism 42 and the third moving mechanism 43 serve as a substrate moving mechanism for moving the substrate 9 together with the substrate holding part 31 relatively to the chamber 21 in the vertical direction. At that time, the relative position of the shield plate 51 relative to the chamber cover 23 is not changed since the first moving mechanism 41 is driven. In other words, the state where the shield plate 51 is separated upward from the lower opening 232 of the chamber cover 23 is kept by the first moving mechanism 41.

As described above, when the chamber 21 is moved from the lower position to the upper position, the substrate 9 is moved from the cover internal space 231 into the body internal space 221 through the lower opening 232 and the upper opening 222 in the chamber 21 (Step S115). The cup part 225 is thereby positioned outside the substrate 9 and the substrate holding part 31 in the radial direction along the entire circumference thereof below the chamber cover 23.

When the substrate 9 is positioned in the body internal space 221, the substrate rotating mechanism 35 starts rotating the substrate 9. Further, a predetermined amount of chemical liquid is supplied from the chemical liquid supply part 813 (see FIG. 5) to the scanning nozzle 186 disposed at the waiting position outside the lower opening 232 in the radial direction. The discharge of the chemical liquid from the discharge head 861 (see FIG. 4) in the state of being disposed at the waiting position, i.e., the predispensing is performed (Step S116). The chemical liquid discharged from the discharge head 861 is received by the upper surface 235 of the cover bottom 234 and led to the cover exhaust port 237. The chemical liquid passing through the cover exhaust port 237 flows in the gas-liquid separating part 197 shown in FIG. 5. In the chemical liquid collecting part 195*b*, the chemical liquid is collected from the gas-liquid separating part 197 and impurities and the like are removed from the chemical liquid through a filter or the like, and after that, the chemical liquid is reused.

After the predispensing is finished, the scanning nozzle 186 is rotated by the head rotating mechanism 863 shown in FIG. 7. As shown in FIG. 3, the discharge head 861 thereby passes between the lower surface 512 of the shield plate 51 and the upper surface 235 of the cover bottom 234 and is disposed between the shield plate 51 and the lower opening 232, i.e., at the discharge position above the substrate 9. Further, the head rotating mechanism 863 is controlled by the control part 10 to start a reciprocating movement of the discharge head 861 above the substrate 9. The discharge head 861 continuously moves to and fro in the horizontal direction along a predetermined moving path connecting the center portion and outer edge portion of the substrate 9. Then, the chemical liquid is supplied from the chemical liquid supply part 813 to the discharge head 861, and the chemical liquid is supplied from the discharge head 861 in the cover internal space 231 onto the upper surface 91 of the substrate 9 in the body internal space 221 through the lower opening 232 (Step S117).

The chemical liquid from the discharge head 861 is serially supplied onto the upper surface 91 of the substrate 9 being rotated. The chemical liquid is spread outward in the radial direction on the upper surface 91 by centrifugal force, to thereby cover the entire upper surface 91. By supplying the chemical liquid from the discharge head 861 oscillating in the horizontal direction onto the substrate 9 being rotated, the chemical liquid can be almost uniformly supplied onto the upper surface 91 of the substrate 9. Further, the uniformity in the temperature of the chemical liquid on the substrate 9 can be improved. As a result, the uniformity of the chemical liquid processing on the substrate 9 can be improved.

The chemical liquid spattering from the outer peripheral edge of the substrate 9 being rotated is received by the cup part 225 and led to the body exhaust port 226*a* disposed below the cup part 225. The chemical liquid passing through the body exhaust port 226*a* flows in the gas-liquid separating part 193 shown in FIG. 5. In the chemical liquid collecting part 195*a*, the chemical liquid is collected from the gas-liquid separating part 193 and impurities and the like are removed from the chemical liquid through a filter or the like, and after that, the chemical liquid is reused.

Further, in the state where the chamber 21 is formed, an inner edge portion of the cup top portion 227*b* which is an edge of the upper opening 222 comes into contact with an inner edge portion of the cover bottom 234 which is an edge of the lower opening 232. It is thereby possible to prevent the chemical liquid spattering from the upper surface 91 of the substrate 9 from being adhered to the lower surface 236 of the cover bottom 234 (the same applies to the process in Step S118 described later). Therefore, when the substrate 9 is unloaded (and a next substrate 9 is loaded) as described later, it is possible to prevent the liquid from the lower surface 236 of the cover bottom 234 forming a path through which the substrate 9 passes, from falling onto upper surface 91 of the substrate 9.

In the substrate processing apparatus 1, it is preferable that also while the chemical liquid is supplied onto the substrate 9, as described above, by continuously supplying the nitrogen gas from the gas supply part 812, the nitrogen gas atmosphere should be kept in the chamber space (the same applies to the supply of the pure water described later). Further, the nitrogen gas may be ejected from the gas ejection port of the upper center nozzle 181, to thereby surely keep the nitrogen gas atmosphere around the substrate 9.

After a predetermined time elapses since the supply of the chemical liquid is started, the supply of the chemical liquid from the scanning nozzle 186 onto the substrate 9 is stopped. Further, by the head rotating mechanism 863, the scanning nozzle 186 passes between the lower surface 512 of the shield plate 51 and the upper surface 235 of the cover bottom 234 and is moved to the waiting position where the scanning nozzle 186 does not overlap the lower opening 232 in the vertical direction as shown in FIG. 7. Thus, when the processing liquid is supplied from the scanning nozzle 186 onto the substrate 9, the scanning nozzle 186 is disposed at the discharge position by the head rotating mechanism 863, and when no processing liquid is supplied from the scanning nozzle 186 onto the substrate 9, the scanning nozzle 186 is disposed at the waiting position by the head rotating mechanism 863.

When the scanning nozzle 186 is moved to the waiting position, the pure water serving as a rinse liquid is supplied by the pure water supply part 814 (see FIG. 5) onto the upper surface 91 and the lower surface 92 of the substrate 9 through the upper center nozzle 181 and the lower nozzle 180 (Step S118). The pure water from the pure water supply part 814 is continuously supplied onto the center portions of the upper surface 91 and the lower surface 92 of the substrate 9. The pure water is spread toward outer peripheral portions of the upper surface 91 and the lower surface 92 by the rotation of the substrate 9 and spatters outward from the outer peripheral edge of the substrate 9. The pure water spattering from the substrate 9 is received by the cup part 225 and led to the body exhaust port 226*a*. The pure water passing through the body exhaust port 226*a* is discarded through the gas-liquid separating part 193 and the liquid exhaust part 196 (see FIG. 5). Besides the rinse process of the upper surface 91 of the substrate 9 and the cleaning process of the lower surface 92, cleaning of the inside of the cup part 225 is thereby substantially performed. After a predetermined time elapses since the supply of the pure water is started, the supply of the pure water from the pure water supply part 814 is stopped.

After the supply of the processing liquid (the chemical liquid and the pure water) onto the substrate 9 is finished, the chamber cover 23 and the cup part 225 of the chamber body 22 are each moved downward, by driving the second moving mechanism 42 and the third moving mechanism 43, from the upper position shown in FIG. 7 to the lower position shown in FIG. 2. In other words, by the second moving mechanism 42 and the third moving mechanism 43, the substrate 9 together with the substrate holding part 31 is moved upward relatively to the chamber 21. At that time, the relative position of the shield plate 51 relative to the chamber cover 23 is not changed since the first moving mechanism 41 is driven. In other words, the state where the shield plate 51 is separated upward from the lower opening 232 of the chamber cover 23 is kept by the first moving mechanism 41.

As described above, when the chamber 21 is moved from the upper position to the lower position, the substrate 9 is moved from the body internal space 221 into the cover internal space 231 through the upper opening 222 and the lower opening 232 in the chamber 21 (Step S119). As shown in FIG. 2, in the cover internal space 231, the upper surface 91 of the substrate 9 and the lower surface 512 of shield plate 51 face each other, being adjacent to each other, in the vertical direction.

Subsequently, the substrate 9 disposed in the cover internal space 231 is rotated together with the substrate holding part 31 by the substrate rotating mechanism 35 at a relatively high speed about the central axis J1. The processing liquid (mainly, the pure water) on the substrate 9 is thereby moved outward in the radial direction on the upper surface 91 and the lower surface 92 and spatters around from the outer edge of the substrate 9. As a result, the processing liquid on the substrate 9 is removed (Step S120). Hereinafter, the process of Step S120 will be referred to as a "drying process". The rotation speed of the substrate 9 in Step S120 is higher than that of the substrate 9 in Steps S117 and S118.

In Step S120, the processing liquid spattering from the substrate 9 being rotated is received by an inner side surface of the cover body 233 and the upper surface 235 of the cover bottom 234 and moved to the connecting portion between the cover body 233 and the cover bottom 234. The processing liquid (i.e., the processing liquid removed from the substrate 9 in Step S120) is discarded through the cover exhaust port 237, the gas-liquid separating part 197, and the liquid exhaust part 199 (see FIG. 5). In the chamber cover 23, as described earlier, the upper surface 235 of the cover bottom 234 is a sloped surface going downward as it goes outward in the radial direction. For this reason, it is possible to prevent the processing liquid on the upper surface 235 from moving toward the lower opening 232 at the center thereof. Further, since the processing liquid on the upper surface 235 is rapidly moved outward in the radial direction, rapid exhaust of the processing liquid from the cover internal space 231 can be achieved.

When the substrate 9 is rotated in the cover internal space 231, the shield plate 51 is rotated by the shield plate rotating mechanism 55 at a position close to the upper surface 91 of the substrate 9 in the vertical direction, at a rotation speed almost equal to that of the substrate 9 in the same rotation direction as the substrate 9 rotates, about the central axis J1. Since the shield plate 51 is disposed, being close to the upper surface 91 of the substrate 9, it is possible to inhibit (or prevent) the processing liquid spattering from the substrate 9 from being splashed back from the inner side surface of the cover body 233 and adhered again to the upper surface 91 of the substrate 9. Further, with the rotation of the shield plate 51, it is possible to spatter around the processing liquid adhered to the upper surface 511 and the lower surface 512 of the shield plate 51 and remove the processing liquid from the shield plate 51.

In the drying process of Step S120, besides the plurality of outer cover nozzles 182, the upper center nozzle 181 also ejects the nitrogen gas. Specifically, the nitrogen gas is supplied in the space between the lower surface 512 of the shield plate 51 and the upper surface 91 of the substrate 9 through the gas ejection port of the upper center nozzle 181. The processing liquid can be thereby exhausted more rapidly from the space between the substrate 9 and the shield plate 51 and drying of the substrate 9 can be accelerated.

After the drying process of the substrate 9 is finished, the rotation of the substrate 9 by the substrate rotating mechanism 35 is stopped. The chamber cover 23 is moved upward from the position shown in FIG. 2 by driving the second moving mechanism 42 and disposed at the upper position shown in FIG. 1. The chamber cover 23 and the chamber body 22 are thereby separated from each other in the vertical direction, and the chamber 21 is opened (Step S121). Then, by the external transfer mechanism, the substrate 9 after being subjected to the above series of processes is carried through the gap between the lower surface 236 of the cover bottom 234 and the upper surface of the cup top portion 227b and unloaded to the outside of the housing 11 through the carry-in/carry-out port (not shown) provided on the housing 11 (Step S122).

Actually, by driving the first moving mechanism 41 in parallel with driving the second moving mechanism 42, in the state of FIG. 1 where the chamber 21 is opened, the shield plate 51 closes the lower opening 232 of the chamber cover 23. Further, the supply of the nitrogen gas into the cover internal space 231 and the exhaust of the gas from the cover internal space 231 also continue. Therefore, in parallel with the unloading of the substrate 9 in Step S122 described above, the process in which the cover internal space 231 is filled with the nitrogen gas is performed, as Step S111 for the next substrate 9. Further, by the nitrogen gas supplied into the cover internal space 231, drying of the cover internal space 231 (a decrease of the humidity), i.e., drying of the inner surface of the chamber cover 23, the upper surface 511 of the shield plate 51, and the scanning nozzle 186 disposed at the waiting position is also performed. The process in Step S111 may be regarded as a drying process of the inner surface of the chamber cover 23 and the scanning nozzle 186. Then, when the substrate 9 is loaded and held by the substrate holding part 31 (Step S112), Steps S113 to S122 are performed in the same manner as above.

Figure 8:
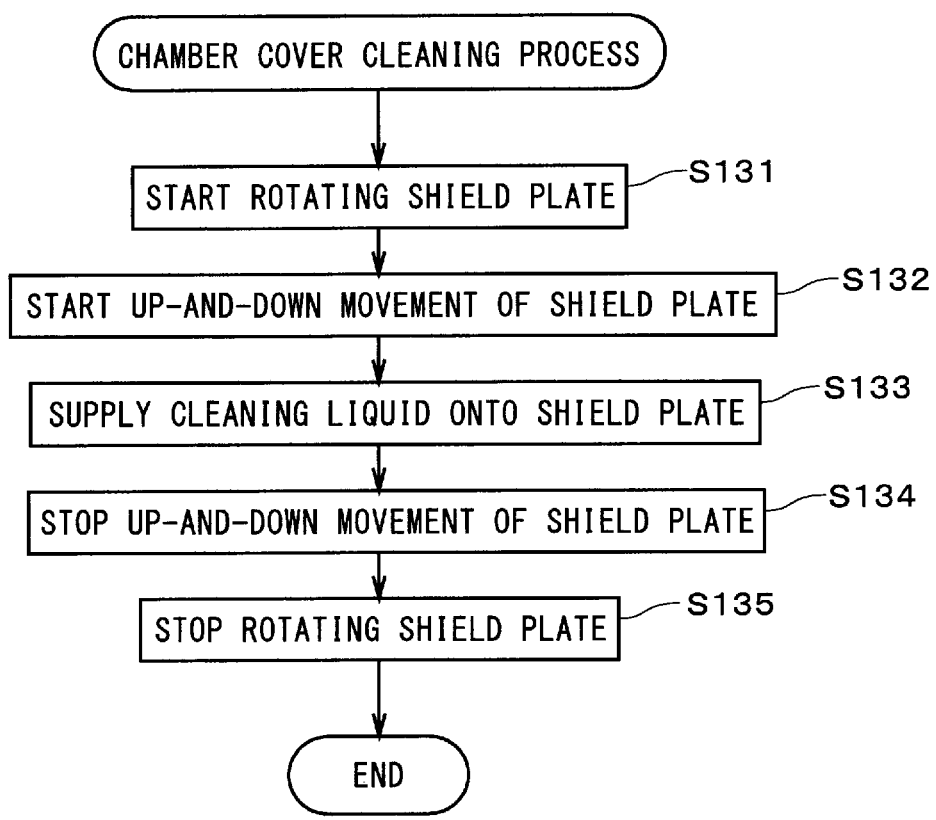
FIG. 8 is a flowchart showing an operation flow for cleaning the inside of the chamber cover.
Figure 9:
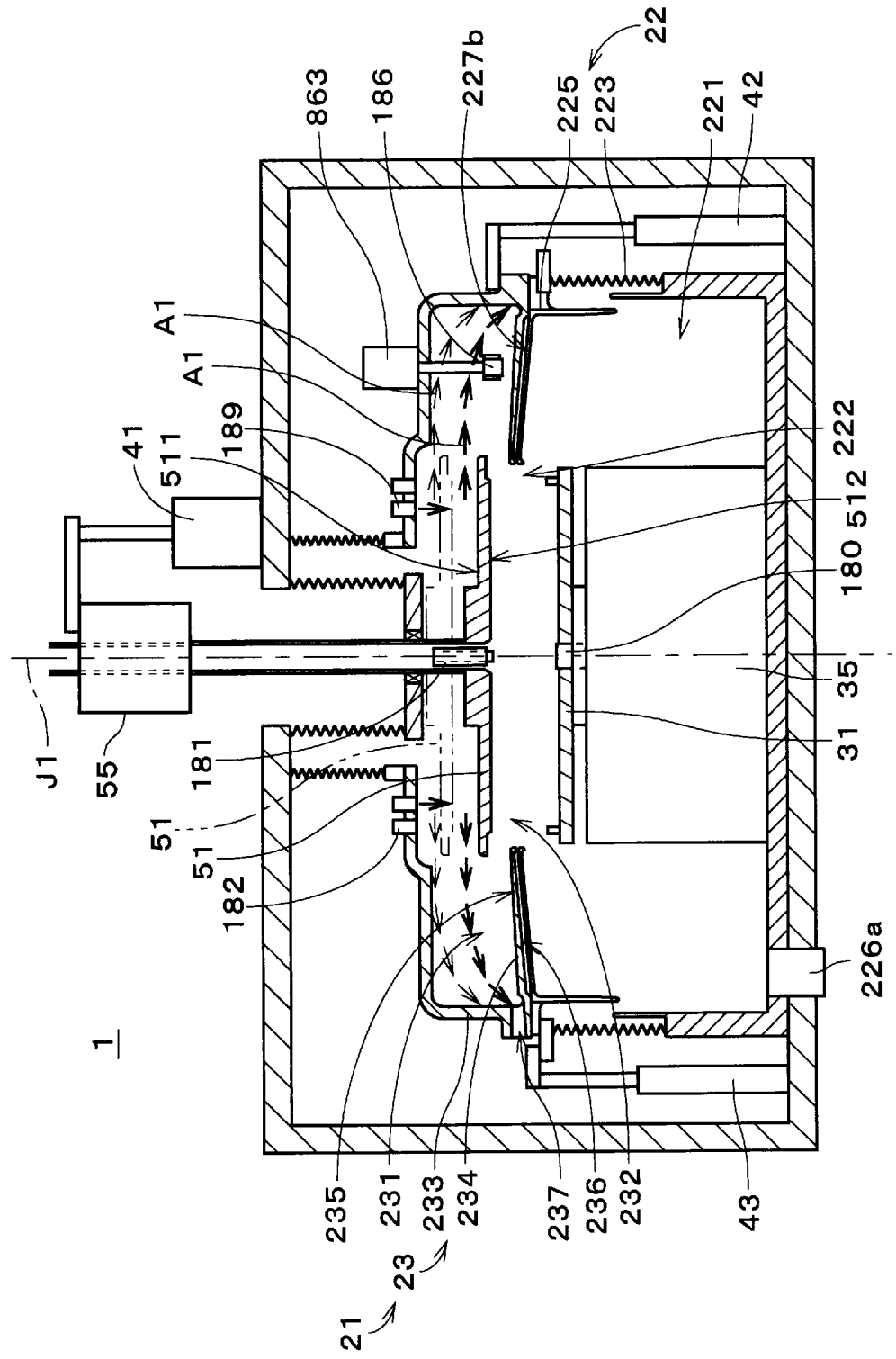
FIG. 9 is a view for explaining the operation for cleaning the inside of the chamber cover.

Next, a process of cleaning the inside of the chamber cover 23 will be described, with reference to FIG. 8. Since the inside of the chamber cover 23 is gradually contaminated by the processing liquid spattering from the substrate 9 during the drying process, for example, each time when a predetermined number of substrates 9 are processed, the inside of the chamber cover 23 is cleaned by the process shown in FIG. 8. When the inside of the chamber cover 23 is cleaned, as shown in FIG. 9, both the chamber cover 23 and the cup part 225 of the chamber body 22 are positioned at the upper position, and any substrate 9 is not disposed inside the chamber 21. Further, the scanning nozzle 186 is disposed at the waiting position. In the substrate processing apparatus 1, first, the shield plate rotating mechanism 55 starts rotating the shield plate 51 (Step S131). The rotation speed of the shield plate 51 is relatively high, like during the drying process of the substrate 9. Furthermore, by driving the first moving mechanism 41, the shield plate 51 starts an operation of repeatedly moving upward and downward, i.e., an up-and-down movement in the cover internal space 231 (Step S132).

Subsequently, the pure water is delivered from the pure water supply part 814 (see FIG. 5) to the plurality of inner cover nozzles 189, and the pure water is discharged from the plurality of inner cover nozzles 189 toward the upper surface 511 of the shield plate 51. Further, the pure water is also delivered from the pure water supply part 814 to the lower nozzle 180 disposed in the body internal space 221, and the pure water is discharged upward from the lower nozzle 180. Specifically, the pure water is given from the lower nozzle 180 through the upper opening 222 and the lower opening 232 onto the lower surface 512 of the shield plate 51. Thus, in parallel with the rotation and the up-and-down movement of the shield plate 51, the cleaning liquid supply part 810 having the plurality of inner cover nozzles 189 and the lower nozzle 180 (see FIG. 5) supplies the pure water as a cleaning liquid onto the upper surface 511 and the lower surface 512 of the shield plate 51, and the upper surface 511 and the lower surface 512 of the shield plate 51 is cleaned (Step S133).

At that time, at an outer peripheral edge of the shield plate 51 being rotated while performing the up-and-down movement, the cleaning liquid on the upper surface 511 and the lower surface 512 is shaken off and spatters to the inner surface of the chamber cover 23, i.e., the inner side surface of the cover body 233 and the upper surface 235 of the cover bottom 234 (see the arrows represented by the reference sign A1 in FIG. 9). Further, the cleaning liquid also spatters to the scanning nozzle 186 disposed at the waiting position. As a result, chemical liquid components or the like adhered to the inner surface of the chamber cover 23 and a surface of the scanning nozzle 186 are rinsed off by the cleaning liquid. The cleaning liquid is moved to the connecting portion between the cover body 233 and the cover bottom 234 and exhausted to the outside of the chamber cover 23 through the cover exhaust port 237. When the cleaning liquid is supplied onto the shield plate 51, it is preferable that the substrate holding part 31 should be also rotated by the substrate rotating mechanism 35, and it is thereby possible to prevent the cleaning liquid from being retained on the substrate holding part 31. Further, when the pure water is supplied as the cleaning liquid from the upper center nozzle 181 onto an upper surface of the substrate holding part 31 being rotated, the inner surface of the chamber body 22 can be also cleaned by the cleaning liquid spattering from the upper surface of the substrate holding part 31.

In the chamber cover 23, as described above, since the upper surface 235 of the cover bottom 234 is a sloped surface going downward as it goes outward in the radial direction, it is possible to prevent the cleaning liquid on the upper surface 235 from moving toward the lower opening 232 at the center thereof. Further, since the cleaning liquid on the upper surface 235 rapidly moves outward in the radial direction, it is possible to achieve rapid exhaust of the cleaning liquid from the cover internal space 231. Furthermore, since the inner edge portion of the cup top portion 227b comes into contact with the inner edge portion of the cover bottom 234, it is possible to prevent the cleaning liquid from being adhered to the lower surface 236 of the cover bottom 234. Therefore, after cleaning the inside of the chamber cover 23, when the substrate 9 to be processed passes through the gap between the cover bottom 234 and the cup top portion 227b in the state where the chamber 21 is opened, it is possible to prevent the liquid from falling from the lower surface 236 of the cover bottom 234 onto the upper surface 91 of the substrate 9.

After the supply of the cleaning liquid onto the shield plate 51 continues for a predetermined time, the supply is stopped. Subsequently, the up-and-down movement of the shield plate 51 by the first moving mechanism 41 is stopped (Step S134). Also after stopping the supply of the cleaning liquid onto the shield plate 51, the shield plate 51 is continuously rotated for a predetermined time. The cleaning liquid on the upper surface 511 and the lower surface 512 is thereby removed. After drying the shield plate 51, the rotation of the shield plate 51 by the shield plate rotating mechanism 55 is also stopped, and the cleaning process of the inside of the chamber cover 23 is completed (Step S135). In the substrate processing apparatus 1, the nitrogen gas is always supplied from the plurality of outer cover nozzles 182 of the gas supply part 812 (see FIG. 5) into the cover internal space 231 (the supply of the nitrogen gas may be stopped when the cleaning liquid is supplied onto the shield plate 51). Therefore, the inner surface of the chamber cover 23 after being cleaned and the scanning nozzle 186 can be efficiently dried.

As explained above, in the substrate processing apparatus 1, the shield plate 51 having a size in the radial direction larger than that of the lower opening 232 is provided in the cover internal space 231 of the chamber cover 23. Then, before the substrate 9 is loaded and the chamber 21 is formed, the cover internal space 231 of the chamber cover 23 is filled with the gas supplied from the gas supply part 812 in the state where the shield plate 51 closes the lower opening 232. After the chamber 21 is formed, it is thereby possible to rapidly bring the inside of the chamber 21 into a desired gas atmosphere. As a result, it is possible to reduce the time period from the formation of the chamber 21 to the start of the processing on the substrate 9 in the gas atmosphere, and to increase the productivity of the substrate processing apparatus 1.

As described above, since the gas supplied from the gas supply part 812 is an inert gas such as nitrogen gas or the like, it is possible to rapidly perform the processing on the substrate 9 by using the processing liquid in a low oxygen atmosphere. As a result, it is possible to prevent oxidation or the like of a metal film provided on the upper surface 91 of the substrate 9. Further, immediately after the chamber 21 is formed (at the same time when the chamber 21 is formed), since the substrate 9 is positioned in the cover internal space 231 which is filled with the gas in advance, after loading the substrate 9 into the apparatus, it is possible to rapidly bring the environment of the substrate 9 into a desired gas atmosphere.

In the substrate processing apparatus 1, with the control by the control part 10, when the processing liquid is supplied from the scanning nozzle 186 onto the substrate 9, the scanning nozzle 186 is disposed at the discharge position and the shield plate 51 is disposed above the scanning nozzle 186. Further, when the scanning nozzle 186 is dried while no processing liquid is supplied from the scanning nozzle 186 onto the substrate 9, the scanning nozzle 186 is disposed at the waiting position and the shield plate 51 closes the lower opening 232. Therefore, with the gas supplied into the cover internal space 231 smaller than the body internal space 221, it is possible to efficiently dry the scanning nozzle 186 and keep clean the scanning nozzle 186. Further, since the size of the lower opening 232 in the radial direction is smaller than that of cover internal space 231, even when the shield plate 51 does not close the lower opening 232, with the gas supplied into the relatively small cover internal space 231, it is possible to dry the scanning nozzle 186 efficiently to some degree. Furthermore, as compared with the case where the scanning nozzle 186 is provided outside the chamber cover 23 and outside the chamber 21 and in order to move the scanning nozzle 186 above the substrate 9 when the processing liquid is supplied onto the substrate 9, the chamber cover 23 is opened or provided with an opening for a nozzle to pass through, it is possible to keep the substrate 9 in a lower oxygen state since the outside air does not enter the circumference of the substrate 9 when the processing liquid is supplied.

In the state where the chamber cover 23 includes the cover exhaust port 237 for exhausting the liquid from the cover internal space 231 and the scanning nozzle 186 is disposed at the waiting position, the predispensing is performed. In the substrate processing apparatus 1, this makes it possible to omit a liquid receiving structure for the predispensing. Further, since the head rotating mechanism 863 is provided on the upper surface of the chamber cover 23, it is possible to shorten the head supporting part 862 in the scanning nozzle 186 as compared with the case where the head rotating mechanism 863 is provided on an outer side surface of the chamber cover 23.

In the substrate processing apparatus 1, the drying process of the substrate 9 is performed in the cover internal space 231 different from the body internal space 221 in which the processing on the substrate 9 by using the processing liquid is performed. Further, in the cover internal space 231, by supplying the cleaning liquid onto the upper surface 511 of the shield plate 51 being rotated and spattering the cleaning liquid from the upper surface 511 of the shield plate 51 toward the inner side surface or the like of the chamber cover 23 by centrifugal force, it is possible to easily clean the inner side surface or the like of the chamber cover 23. As a result, it is possible to keep extremely clean the cover internal space 231 used for drying the substrate 9. Furthermore, since the chamber space including the cover internal space 231 is hermetically sealed, it is also possible to prevent the mist or the like of the cleaning liquid from spattering to the outside (the outside of the chamber 21). Moreover, when the inside of the chamber cover 23 is cleaned, by moving the shield plate 51 relatively to the chamber cover 23 in the vertical direction in the cover internal space 231, it is possible to clean a wider range of the inner surface of the chamber cover 23.

In the substrate processing apparatus 1 in which the scanning nozzle 186 is provided in the chamber cover 231, when the cleaning liquid is supplied onto the upper surface 511 of the shield plate 51, the cleaning liquid spatters from the upper surface 511 of the shield plate 51 also to the scanning nozzle 186 positioned at the waiting position. It is thereby also possible to easily clean the scanning nozzle 186 and keep clean the scanning nozzle 186. Further, the gas supply part 812 supplies a gas into the cover internal space 231 and the cover gas exhaust part 198 exhausts the gas from the cover internal space 231. It is thereby possible to efficiently dry the inner surface of the chamber cover 23 and the scanning nozzle 186 and prevent the cleaning liquid from falling onto the substrate 9.

In the substrate processing apparatus 1, it is also possible to clean the inside of the chamber cover 23 in parallel with the processing performed on the substrate 9 by using the processing liquid. In the state of FIG. 7, for example, in parallel with the processes of Steps S117 and S118 in which the processing liquid is supplied onto the substrate 9, the cleaning liquid is supplied from the plurality of inner cover nozzles 189 onto the upper surface 511 of the shield plate 51 being rotated. In other words, while the cleaning liquid is supplied onto the upper surface 511 of the shield plate 51, the processing liquid is supplied by the processing liquid supply part 811 onto the upper surface 91 of the substrate 9 disposed in the body internal space 221. It is thereby possible to clean the inner surface of the chamber cover 23 during the processing performed on the substrate 9 by using the processing liquid, and increase the throughput in the substrate processing performed in the substrate processing apparatus 1.

The substrate processing apparatus 1 allows various variations.

The chemical liquid may be discharged from the upper center nozzle 181 and the pure water may be discharged from the scanning nozzle 186. In this case, when the chemical liquid is discharged from the upper center nozzle 181, the shield plate 51 is moved closer to the lower opening 232 and it is thereby possible to prevent the chemical liquid spattering from the upper surface 91 of the substrate 9 from being adhered to the scanning nozzle 186. Further, there may be a case where both the chemical liquid supply part 813 and the pure water supply part 814 are connected to the upper center nozzle 181 (or the scanning nozzle 186) through respective valves and the chemical liquid and the pure water are selectively discharged from the upper center nozzle 181.

Depending on the design of the substrate processing apparatus 1, a plurality of scanning nozzles for discharging different kinds of processing liquids may be provided in the cover internal space 231. In this case, a plurality of pods for collecting the chemical liquids from the plurality of scanning nozzles may be provided on the upper surface 235 of the cover bottom 234. Since the plurality of scanning nozzles perform the predispensing in the individual pods, it is possible to easily collect the chemical liquids individually.

Though the head rotating mechanism 863 for rotating the scanning nozzle 186 is provided on the chamber cover 23 in the above-described preferred embodiment, the head rotating mechanism 863 may be provided outside the housing 11, for example, on an upper surface of the housing 11. In this case, it is possible to keep the head rotating mechanism 863 at a distance from the atmosphere of the chemical liquid or the like, and the head rotating mechanism 863 can stand long use.

Further, depending on the design of the substrate processing apparatus 1, the discharge part for discharging the processing liquid may be another form other than an open-side scanning nozzle. Further, the discharge-part moving mechanism for disposing the discharge part selectively at the discharge position or at the waiting position may be a mechanism for moving the discharge part linearly, or the like.

Depending on the type of processing on the substrate 9, droplets or steam of the processing liquid may be supplied onto the upper surface 91 of the substrate 9 by the processing liquid supply part 811.

Though the above-described chamber open/close mechanism includes the second moving mechanism 42 for moving the chamber cover 23 and the third moving mechanism 43 for moving the cup part 225 of the chamber body 22 in the exemplary configuration of FIG. 1, there may be a configuration, for example, where either one of the second moving mechanism 42 and the third moving mechanism 43 is omitted and only the other one is used as the chamber open/close mechanism. Further, though the shield plate moving mechanism includes the first moving mechanism 41 for moving the shield plate 51 and the second moving mechanism 42 for moving the chamber cover 23 in the exemplary configuration of FIG. 1, there may be a configuration, for example, where either one of the first moving mechanism 41 and the second moving mechanism 42 is omitted and only the other one is used as the shield plate moving mechanism.

Though the above-described substrate moving mechanism includes the second moving mechanism 42 for moving the chamber cover 23 and the third moving mechanism 43 for moving the cup part 225 of the chamber body 22 in the exemplary configuration of FIG. 1, the substrate moving mechanism may be, for example, a mechanism for moving the substrate holding part 31 in the vertical direction in the chamber 21.

In the chamber body 22, a plurality of cups disposed concentrically may be provided as the cup part 225. In this case, when the type of the processing liquid to be supplied onto the substrate 9 is changed, it is preferable that the cup for receiving the processing liquid from the substrate 9 should be also changed. When a plurality of types of processing liquids are used, it is thereby possible to easily separate the plurality of processing liquids, to be then collected or discarded.

Figure 10:
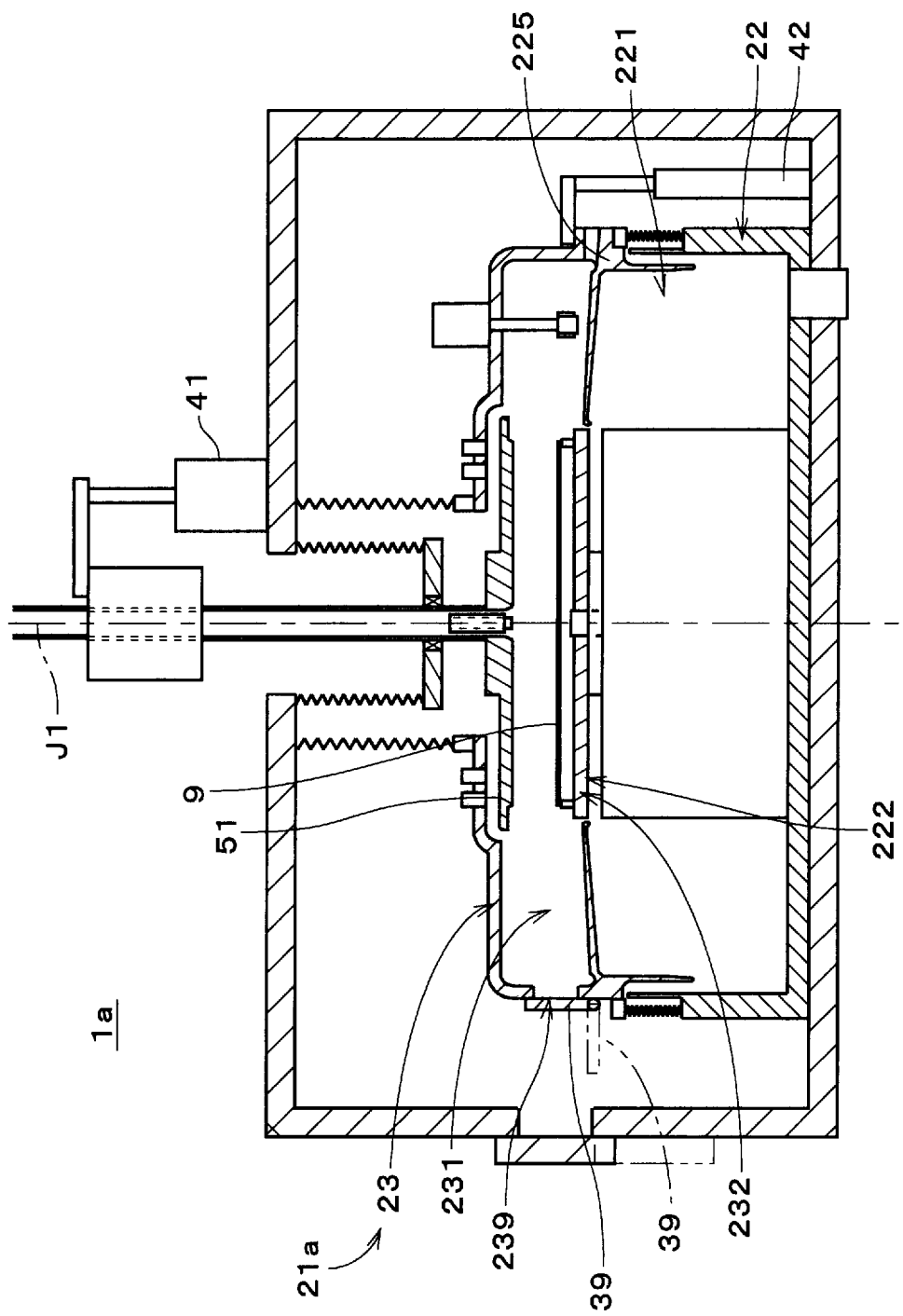
FIG. 10 is a cross section showing another example of the substrate processing apparatus.

As shown in FIG. 10, a chamber 21a formed by using the chamber cover 23 and the cup part 225 of the chamber body 22 as a coupled member may be adopted. Also in a substrate processing apparatus 1a of FIG. 10, the chamber 21a is formed, with the upper opening 222 of the chamber body 22 covered by the chamber cover 23. In the chamber 21a, a side opening 239 is provided on the chamber cover 23, and the substrate 9 passes through the side opening 239 when the substrate 9 is loaded into the chamber 21a or unloaded to the outside of the chamber 21a. The side opening 239 is opened and closed by a side opening open/close mechanism 39. In the substrate processing apparatus 1a of FIG. 10, the third moving mechanism 43 in the substrate processing apparatus 1 of FIG. 1 is omitted and the second moving mechanism 42 moves the chamber cover 23 and the cup part 225 in the vertical direction. The substrate 9 is thereby disposed selectively in the cover internal space 231 or in the body internal space 221. Also in the substrate processing apparatus 1a, the processing using the processing liquid is performed when the substrate 9 is disposed in the body internal space 221, and the drying process of the substrate 9 is performed when the substrate 9 is disposed in the cover internal space 231. The processing of cleaning the inside of the chamber cover 23 is also performed in the same manner as in the above-described substrate processing apparatus 1.

In the substrate processing apparatuses 1 and 1a, the processing may be performed on various types of substrates other than the semiconductor substrate. Further, by using various liquids such as hydrochloric acid, hydrofluoric acid, and the like, various liquid processings which are desirable to be performed under a low oxygen environment, not limited to polymer removal or etching, can be performed. The gas to achieve the low oxygen state is not limited to the nitrogen gas but may be another inert gas such as argon or the like, or another desirable gas atmosphere, for example, a gas in which a plurality of types of gas composition ratios are managed may be achieved.

Next, described will be a substrate processing apparatus 1 in accordance with the second preferred embodiment of the present invention. The basic constitution of the substrate processing apparatus 1 of the second preferred embodiment is the same as that of the substrate processing apparatus 1 shown in FIG. 1.

Figure 11:
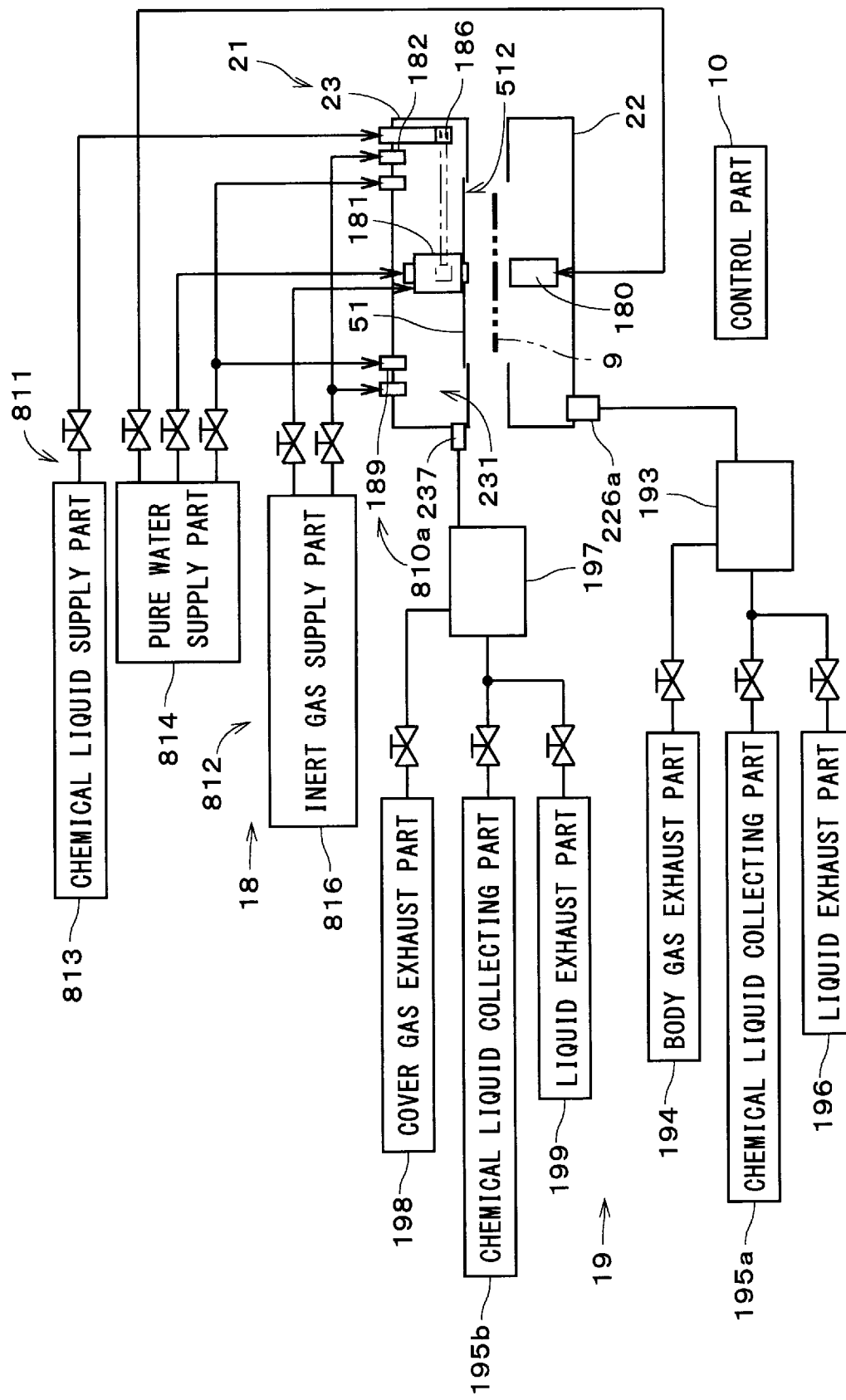
FIG. 11 is a block diagram showing a gas-liquid supply part and a gas-liquid exhaust part in accordance with a second preferred embodiment.

FIG. 11 is a block diagram showing a gas-liquid supply part 18 and a gas-liquid exhaust part 19 included in the substrate processing apparatus 1 of the second preferred embodiment. The gas-liquid supply part 18 includes the processing liquid supply part 811, the gas supply part 812, and a film formation liquid supply part 810a. The processing liquid supply part 811 includes the scanning nozzle 186, the upper center nozzle 181, the lower nozzle 180, the chemical liquid supply part 813, and the pure water supply part 814. The chemical liquid supply part 813 is connected to the scanning nozzle 186 through a valve. The pure water supply part 814 is connected to the upper center nozzle 181 through a valve. The pure water supply part 814 is also connected to the lower nozzle 180 through another valve.

The gas supply part 812 includes the upper center nozzle 181, the plurality of outer cover nozzles 182, and the inert gas supply part 816. The inert gas supply part 816 is connected to the upper center nozzle 181 through a valve. The inert gas supply part 816 is also connected to the plurality of outer cover nozzles 182 through respective valves. The film formation liquid supply part 810a includes the plurality of inner cover nozzles 189 and the pure water supply part 814. The pure water supply part 814 is connected to the plurality of inner cover nozzles 189 through respective valves. Further, in the substrate processing apparatus 1 of the second preferred embodiment, the plurality of inner cover nozzles 189 are disposed circumferentially about the central axis J1 (see FIG. 1) inside the plurality of outer cover nozzles 182 in the radial direction (on the side of the central axis J1). At a lower end of each inner cover nozzle 189, provided is a film formation liquid discharge port for discharging a film formation liquid described later. A plurality of film formation liquid discharge ports are disposed circumferentially about the central axis J1 above the shield plate 51.

In the gas-liquid supply part 18, the upper center nozzle 181 is shared by the processing liquid supply part 811 and the gas supply part 812. Further, the pure water supply part 814 is shared by the processing liquid supply part 811 and the film formation liquid supply part 810a. The processing liquid supply part 811, the gas supply part 812, and the film formation liquid supply part 810a may be formed by constituent elements which are independent of one another. Furthermore, the arrangement of the nozzles provided in the chamber 21 may be changed as appropriate.

The gas-liquid exhaust part 19 includes the body exhaust port 226a, the cover exhaust port 237, the gas-liquid separating part 193, the body gas exhaust part 194, the chemical liquid collecting part 195a, the liquid exhaust part 196, the gas-liquid separating part 197, the cover gas exhaust part 198, the chemical liquid collecting part 195b, and the liquid exhaust part 199. The body exhaust port 226a provided in the chamber body 22 is connected to the gas-liquid separating part 193. The gas-liquid separating part 193 is connected to the body gas exhaust part 194, the chemical liquid collecting part 195a, and the liquid exhaust part 196 through respective valves. The cover exhaust port 237 provided on the chamber cover 23 is connected to the gas-liquid separating part 197. The gas-liquid separating part 197 is connected to the cover gas exhaust part 198, the chemical liquid collecting part 195b, and the liquid exhaust part 199 through respective valves. The constituent elements of the gas-liquid supply part 18 and the gas-liquid exhaust part 19 are controlled by the control part 10. The first moving mechanism 41, the second moving mechanism 42, the third moving mechanism 43, the substrate rotating mechanism 35, and the shield plate rotating mechanism 55 (see FIG. 1) are also controlled by the control part 10.

A chemical liquid supplied from the chemical liquid supply part 813 through the scanning nozzle 186 onto the substrate 9 is, for example, a polymer removal liquid or an etching solution such as hydrofluoric acid, a tetramethylammonium hydroxide solution, or the like. The pure water supply part 814 supplies pure water (DIW: deionized water) onto the substrate 9 through the upper center nozzle 181 and the lower nozzle 180. The processing liquid supply part 811 may include another supply part for supplying a processing liquid (for example, a solvent such as isopropyl alcohol (IPA) or the like, an acid solution, an alkaline solution, a removal liquid, or the like) other than the above-described chemical liquid and the pure water.

As described later, the pure water supplied from the pure water supply part 814 onto the upper surface 511 of the shield plate 51 through the plurality of inner cover nozzles 189 is also a film formation liquid for forming a liquid film in the cover internal space 231. The film formation liquid supply part 810a may include another supply part for supplying a film formation liquid other than the pure water.

A gas supplied from the inert gas supply part 816 is, for example, nitrogen (N$_2$) gas. The gas supply part 812 may include another supply part for supplying an inert gas other than nitrogen gas or a gas other than the inert gas.

Figure 12:
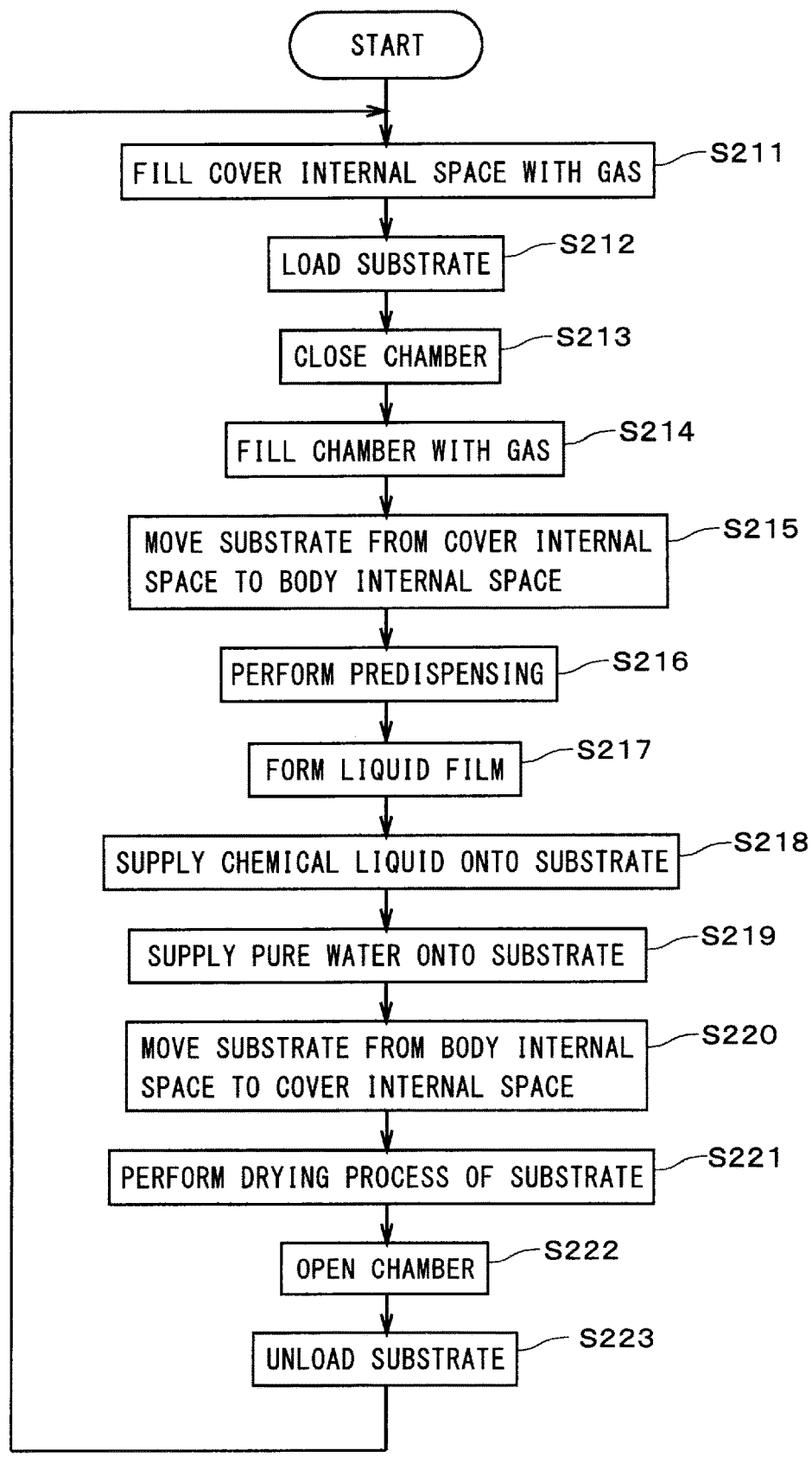
FIG. 12 is a flowchart showing an operation flow for processing a substrate.

Next, an operation flow for processing the substrate 9 in the substrate processing apparatus 1 will be described, with reference to FIG. 12. In the substrate processing apparatus 1, first, as shown in FIG. 1, the chamber cover 23 is positioned at the upper position and the cup part 225 of the chamber body 22 is positioned at the lower position. In other words, the substrate processing apparatus 1 is in the state where the chamber 21 is opened. Further, the shield plate 51 is superposed on the lower opening 232 of the chamber cover 23 in a plan view so that the lower surface 512 of the shield plate 51 comes into contact with the upper surface 235 of the cover bottom 234. The lower opening 232 is thereby closed, to bring the cover internal space 231 into a closed space. Further, in the substrate processing apparatus 1, nitrogen gas is supplied from the plurality of outer cover nozzles 182 of the gas supply part 812 (see FIG. 11) into the cover internal space 231 and a gas in the cover internal space 231 is exhausted from the cover exhaust port 237 to the outside of the chamber cover 23. Therefore, the cover internal space 231 is filled with the nitrogen gas (Step S211). In the substrate processing apparatus 1, in principle, the supply of the nitrogen gas into the cover internal space 231 and the exhaust of the gas from the cover internal space 231 are always performed.

In Step S211, it is not always necessary to hermetically seal the lower opening 232 of the chamber cover 23 by the shield plate 51 but there may be a form of closure in which a slight gap exists between the shield plate 51 and the cover bottom 234 only if the shield plate 51 is superposed on the lower opening 232. Even in such a form of closure, by controlling the feed rate of the nitrogen gas from the gas supply part 812 into the cover internal space 231 to make the inflow of the nitrogen gas into the cover internal space 231 almost equal to the outflow of the gas from the gap and the cover exhaust port 237, the cover internal space 231 is filled with the nitrogen gas. Then, by appropriately controlling the inflow of the nitrogen gas and the like, it is possible to bring the cover internal space 231 into a low oxygen state in which the oxygen concentration in the cover internal space 231 is reduced to a degree required by the process. Further, though the substrate 9 is shown in FIG. 1, Step S211 is performed before the substrate 9 is loaded into the substrate processing apparatus 1.

Subsequently, as described above, in the state where the chamber cover 23 is separated from the chamber body 22, the substrate 9 is loaded into the housing 11 from a carry-in/carry-out port (not shown) provided on the housing 11 by an external transfer mechanism. The substrate 9 passes through the gap between the lower surface 236 of the cover bottom 234 and the upper surface of the cup top portion 227b and is moved to below the shield plate 51, and is then held by the substrate holding part 31 (Step S212). In Step S212, the substrate 9 is held by the substrate holding part 31 above the upper opening 222 of the chamber body 22.

After the substrate 9 is held by the substrate holding part 31, the chamber cover 23 is moved downward, by driving the second moving mechanism 42, from the upper position shown in FIG. 1 to the lower position shown in FIG. 2. In other words, the chamber cover 23 is moved relatively to the chamber body 22 in the vertical direction. Then, with the upper opening 222 of the chamber body 22 covered by the chamber cover 23, the chamber 21 is closed (Step S213). Specifically, the chamber 21 in which the substrate 9 and the substrate holding part 31 are accommodated is formed. At that time, the shield plate 51 is moved upward relatively to the chamber cover 23 by driving the first moving mechanism 41, and the shield plate 51 is thereby separated upward from the lower opening 232 of the chamber cover 23 in the chamber 21.

As described above, when the chamber cover 23 is moved from the upper position to the lower position, the substrate 9 held by the substrate holding part 31 is moved into the cover internal space 231 through the lower opening 232 of the chamber cover 23. In other words, in Step S213, in the state where the chamber 21 is formed, the substrate 9 is positioned in the cover internal space 231 among the chamber space. As described above, since the cover internal space 231 is filled with the nitrogen gas before the chamber 21 is formed, when the substrate 9 is moved into the cover internal space 231, the environment of the substrate 9 can be rapidly brought into a nitrogen gas atmosphere (i.e., a low oxygen atmosphere). In the cover internal space 231, the upper surface 91 of the substrate 9 and the lower surface 512 of shield plate 51 face each other, being adjacent to each other, in the vertical direction.

In the state of FIG. 2, when the plurality of outer cover nozzles 182 positioned above the shield plate 51 supply the nitrogen gas into the cover internal space 231, the atmospheric pressure of the cover internal space 231 becomes higher than that of the body internal space 221. In other words, the cover internal space 231 is brought into a positive pressure state. For this reason, the nitrogen gas in the cover internal space 231 flows out into the body internal space 221 from the gap between the shield plate 51 and the cover bottom 234 of the chamber cover 23 through the lower opening 232 and the upper opening 222 (in other words, the nitrogen gas is delivered from the cover internal space 231 to the body internal space 221). Further, the gas in the body internal space 221 is exhausted from the body exhaust port 262a to the outside of the chamber 21. After a predetermined time elapses from the formation of the chamber 21, the body internal space 221 is thereby also filled with the nitrogen gas supplied from the gas supply part 812. In other words, the nitrogen gas is supplied by the gas supply part 812 into the chamber 21, to thereby fill the inside of the chamber 21 (Step S214). Hereinafter, the process of Step S214 will be referred to as the "gas replacement process".

In the gas replacement process of Step S214, besides the plurality of outer cover nozzles 182, the upper center nozzle 181 is also used for supplying the nitrogen gas into the chamber 21. Specifically, the nitrogen gas from the gas supply part 812 is also supplied into a space between the lower surface 512 of the shield plate 51 and the upper surface 91 of the substrate 9 through the gas ejection port of the upper center nozzle 181. The atmosphere in the space between the shield plate 51 and the substrate 9 can be thereby rapidly replaced by the nitrogen gas atmosphere. Further, in any one of Steps S211 to S213, the nitrogen gas may be supplied from a second gas ejection port 185 as necessary. Especially, by supplying the nitrogen gas from the second gas ejection port 185 in Step S213, it is possible to more efficiently perform the gas replacement process in Step S214.

Next, the chamber cover 23 and the cup part 225 of the chamber body 22 are each moved upward, by driving the second moving mechanism 42 and the third moving mechanism 43, from the lower position shown in FIG. 2 to the upper position shown in FIG. 7. In other words, by the second moving mechanism 42 and the third moving mechanism 43, the substrate 9 together with the substrate holding part 31 is moved downward relatively to the chamber 21. The second moving mechanism 42 and the third moving mechanism 43 serve as a substrate moving mechanism for moving the substrate 9 together with the substrate holding part 31 relatively to the chamber 21 in the vertical direction. At that time, the relative position of the shield plate 51 relative to the chamber cover 23 is not changed since the first moving mechanism 41 is driven. In other words, the state where the shield plate 51 is separated upward from the lower opening 232 of the chamber cover 23 is kept by the first moving mechanism 41.

As described above, when the chamber 21 is moved from the lower position to the upper position, the substrate 9 and the substrate holding part 31 are moved from the cover internal space 231 into the body internal space 221 through the lower opening 232 and the upper opening 222 in the chamber 21 (Step S215). The cup part 225 is thereby positioned outside the substrate 9 and the substrate holding part 31 in the radial direction along the entire circumference thereof below the chamber cover 23.

When the substrate 9 and the substrate holding part 31 are positioned in the body internal space 221, the substrate rotating mechanism 35 starts rotating the substrate 9. Further, a predetermined amount of chemical liquid is supplied from the chemical liquid supply part 813 (see FIG. 11) to the scanning nozzle 186 disposed at the waiting position outside the lower opening 232 in the radial direction. The discharge of the chemical liquid from the discharge head 861 (see FIG. 4) in the state of being disposed at the waiting position, i.e., the predispensing is thereby performed (Step S216). The chemical liquid discharged from the discharge head 861 is received by the upper surface 235 of the cover bottom 234 and led to the cover exhaust port 237. The chemical liquid passing through the cover exhaust port 237 flows in the gas-liquid separating part 197 shown in FIG. 11. In the chemical liquid collecting part 195*b*, the chemical liquid is collected from the gas-liquid separating part 197 and impurities and the like are removed from the chemical liquid through a filter or the like, and after that, the chemical liquid is reused.

Figure 13:
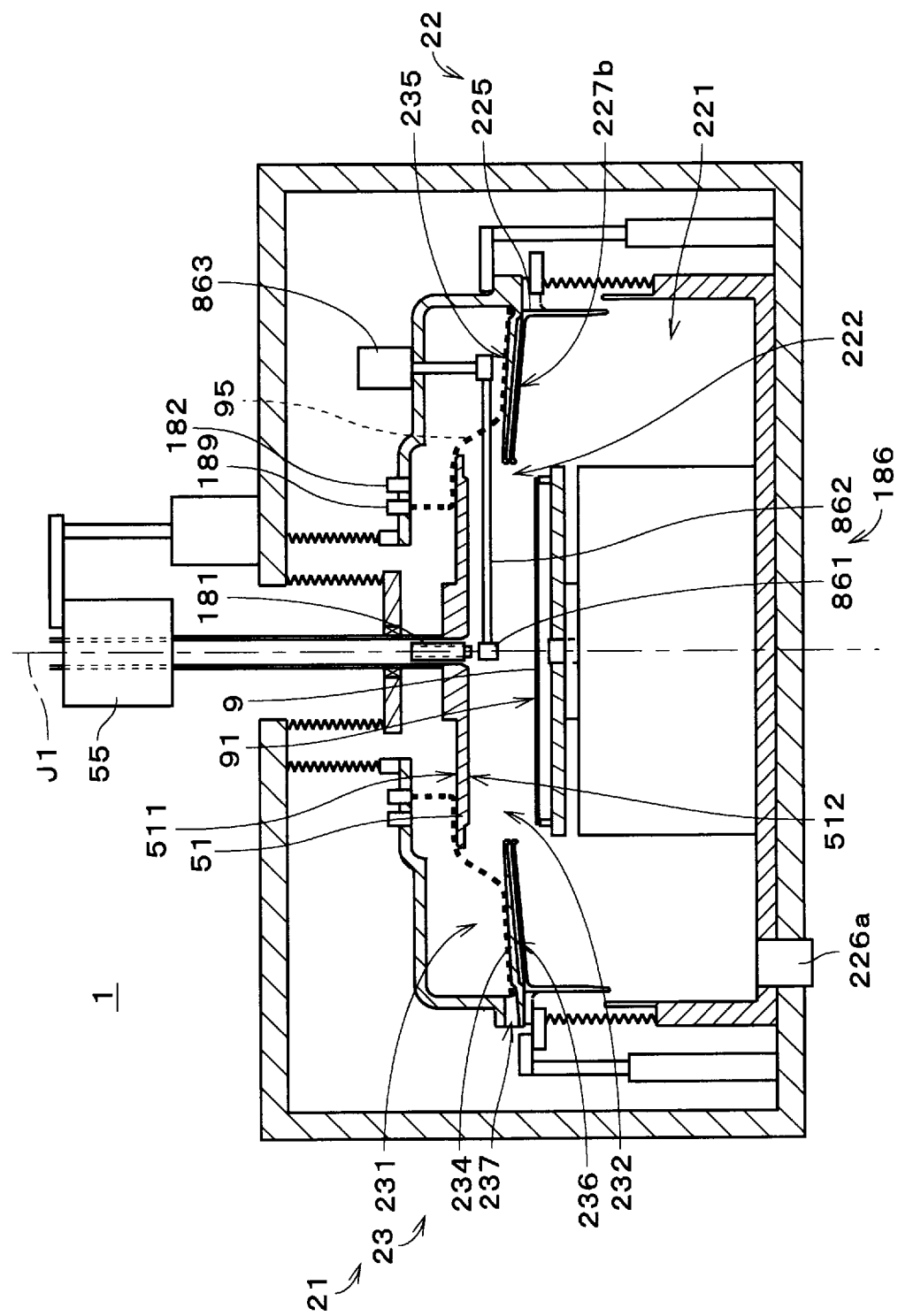
FIGS. 13 and 14 are cross sections each showing the substrate processing apparatus.

After the predispensing is finished, the discharge head 861 and the head supporting part 862 of the scanning nozzle 186 are rotated by the head rotating mechanism 863 shown in FIG. 7. As shown in FIG. 13, the discharge head 861 thereby passes between the lower surface 512 of the shield plate 51 and the upper surface 235 of the cover bottom 234 and is disposed between the shield plate 51 and the lower opening 232, i.e., at the discharge position above the substrate 9. Further, the head rotating mechanism 863 is controlled by the control part 10 to start a reciprocating movement of the discharge head 861 above the substrate 9. The discharge head 861 continuously moves to and fro in the horizontal direction along a predetermined moving path connecting the center portion and outer edge portion of the substrate 9.

Subsequently, the shield plate rotating mechanism 55 starts the rotation of the shield plate 51. Further, in the film formation liquid supply part 810*a* (see FIG. 11), the pure water serving as a film formation liquid is supplied from the pure water supply part 814 to the plurality of inner cover nozzles 189, and the film formation liquid is discharged from the plurality of film formation liquid discharge ports toward the upper surface 511 of the shield plate 51. Inside the chamber 21, the film formation liquid supplied onto the upper surface 511 of the shield plate 51 being rotated is spread on the upper surface 511 of the shield plate 51 by centrifugal forces. The upper surface 511 of the shield plate 51 has a lyophilic property to the film formation liquid. In the present preferred embodiment, the upper surface 511 of the shield plate 51 is hydrophilic. For this reason, the film formation liquid is spread substantially uniformly on the upper surface 511 of the shield plate 51.

The film formation liquid spread on the upper surface 511 of the shield plate 51 flows from the upper surface 511 of the shield plate 51 to the upper surface 235 of the cover bottom 234 by centrifugal force. The film formation liquid flows from an outer edge of the upper surface 511 of the shield plate 51 outward in the radial direction along the entire circumference thereof, to thereby form an annular liquid film 95 between the shield plate 51 and the cover bottom 234 (Step S217). In FIG. 13, the liquid film 95 is indicated by a thick broken line (the same applies to FIGS. 14 and 15). As shown in FIG. 13, the head supporting part 862 of the scanning nozzle 186 penetrates the liquid film 95. The pure water (i.e., the film formation liquid) forming the liquid film 95, which is received by the upper surface 235 of the cover bottom 234, is led to the cover exhaust port 237. The film formation liquid passing through the cover exhaust port 237 is discarded through the gas-liquid separating part 197 and the liquid exhaust part 199 shown in FIG. 11.

In the chamber cover 23, as described earlier, the upper surface 235 of the cover bottom 234 is a sloped surface going downward as it goes outward in the radial direction. For this reason, it is possible to prevent the film formation liquid on the upper surface 235 from moving toward the lower opening 232 at the center thereof. Further, since the film formation liquid on the upper surface 235 is rapidly moved outward in the radial direction, rapid exhaust of the film formation liquid from the cover internal space 231 can be achieved.

The formation of the liquid film 95 in Step S217 may be performed in the state where the scanning nozzle 186 is positioned at the waiting position, and may be performed in parallel with the movement of the scanning nozzle 186 from the waiting position to the discharge position. Further, in a case where it is not necessary to reuse the chemical liquid used during the predispensing, or the like, the above-described formation of the liquid film 95 may be performed between Steps S215 and S216.

In the substrate processing apparatus 1, in parallel the formation of the liquid film 95 in Step S217, the nitrogen gas is supplied from the plurality of outer cover nozzles 182 into the cover internal space 231, to thereby fill the cover internal space 231 with the nitrogen gas. The nitrogen gas is supplied from the plurality of outer cover nozzles 182 in a relatively small flow rate to a degree that does not shake up the liquid film 95.

After the liquid film 95 is formed in the cover internal space 231, the chemical liquid is supplied from the chemical liquid supply part 813 to the discharge head 861, and the chemical liquid is discharged from the discharge head 861 oscillating in the horizontal direction in the cover internal space 231 through the lower opening 232 onto the upper surface 91 of the substrate 9 in the body internal space 221 (Step S218). The supply of the chemical liquid onto the substrate 9 is performed in the state where the liquid film 95 is formed.

The chemical liquid from the discharge head 861 is serially supplied onto the upper surface 91 of the substrate 9 being rotated. The chemical liquid is spread outward in the radial direction on the upper surface 91 by centrifugal force, to thereby cover the entire upper surface 91. By supplying the chemical liquid from the discharge head 861 oscillating in the horizontal direction onto the substrate 9 being rotated, the chemical liquid can be almost uniformly supplied onto the upper surface 91 of the substrate 9. Further, the uniformity in the temperature of the chemical liquid on the substrate 9 can be improved. As a result, the uniformity of the chemical liquid processing on the substrate 9 can be improved.

The chemical liquid spattering from the outer edge of the substrate 9 being rotated is received by the cup part 225 and led to the body exhaust port 226a disposed below the cup part 225. The chemical liquid passing through the body exhaust port 226a flows in the gas-liquid separating part 193 shown in FIG. 11. In the chemical liquid collecting part 195a, the chemical liquid is collected from the gas-liquid separating part 193 and impurities and the like are removed from the chemical liquid through a filter or the like, and after that, the chemical liquid is reused.

Further, in the state where the chamber 21 is formed, the inner edge portion of the cup top portion 227b which is an edge of the upper opening 222 comes into contact with the inner edge portion of the cover bottom 234 which is an edge of the lower opening 232. It is thereby possible to prevent the chemical liquid spattering from the upper surface 91 of the substrate 9 from being adhered to the lower surface 236 of the cover bottom 234 (the same applies to the process in Step S219 described later). Therefore, when the substrate 9 is unloaded (and a next substrate 9 is loaded) as described later, it is possible to prevent the liquid from the lower surface 236 of the cover bottom 234 forming a path through which the substrate 9 passes, from falling onto the upper surface 91 of the substrate 9.

In the substrate processing apparatus 1, it is preferable that also while the chemical liquid is supplied onto the substrate 9, as described above, by continuously supplying the nitrogen gas from the gas supply part 812, the nitrogen gas atmosphere should be kept in the chamber space (the same applies to the supply of the pure water described later). Further, the nitrogen gas may be also ejected from the gas ejection port of the upper center nozzle 181, to thereby surely keep the nitrogen gas atmosphere around the substrate 9.

After a predetermined time elapses since the supply of the chemical liquid is started, the supply of the chemical liquid from the scanning nozzle 186 onto the substrate 9 is stopped. Further, by the head rotating mechanism 863, the scanning nozzle 186 passes between the lower surface 512 of the shield plate 51 and the upper surface 235 of the cover bottom 234 and is moved to the waiting position where the scanning nozzle 186 does not overlap the lower opening 232 in the vertical direction as shown in FIG. 7. Thus, when the processing liquid is supplied from the scanning nozzle 186 onto the substrate 9, the scanning nozzle 186 is disposed at the discharge position by the head rotating mechanism 863, and when no processing liquid is supplied from the scanning nozzle 186 onto the substrate 9, the scanning nozzle 186 is disposed at the waiting position by the head rotating mechanism 863.

After the scanning nozzle 186 is moved to the waiting position, the pure water serving as a rinse liquid is supplied by the pure water supply part 814 (see FIG. 11) onto the upper surface 91 and the lower surface 92 of the substrate 9 through the upper center nozzle 181 and the lower nozzle 180 (Step S219). The supply of the pure water onto the substrate 9 is performed in the state where the above-described liquid film 95 is formed.

The pure water from the pure water supply part 814 is continuously supplied onto the center portions of the upper surface 91 and the lower surface 92 of the substrate 9. The pure water is spread toward outer peripheral portions of the upper surface 91 and the lower surface 92 by the rotation of the substrate 9 and spatters outward from the outer edge of the substrate 9. The pure water spattering from the substrate 9 is received by the cup part 225 and led to the body exhaust port 226a. The pure water passing through the body exhaust port 226a is discarded through the gas-liquid separating part 193 and the liquid exhaust part 196 (see FIG. 11). Besides the rinse process of the upper surface 91 of the substrate 9 and the cleaning process of the lower surface 92, cleaning of the inside of the cup part 225 is thereby substantially performed. After a predetermined time elapses since the supply of the pure water is started, the supply of the pure water from the pure water supply part 814 is stopped. Further, the supply of the pure water onto the upper surface 511 of the shield plate 51 and the rotation of the shield plate 51 are stopped, and the formation of the liquid film 95 is finished.

After the supply of the processing liquid (the chemical liquid and the pure water) onto the substrate 9 is finished, the chamber cover 23 and the cup part 225 of the chamber body 22 are each moved downward, by driving the second moving mechanism 42 and the third moving mechanism 43, from the upper position shown in FIG. 7 to the lower position shown in FIG. 2. In other words, by the second moving mechanism 42 and the third moving mechanism 43, the substrate 9 together with the substrate holding part 31 is moved upward relatively to the chamber 21. At that time, the relative position of the shield plate 51 relative to the chamber cover 23 is not changed since the first moving mechanism 41 is driven. In other words, the state where the shield plate 51 is separated upward from the lower opening 232 of the chamber cover 23 is kept by the first moving mechanism 41.

As described above, when the chamber 21 is moved from the upper position to the lower position, the substrate 9 is moved from the body internal space 221 into the cover internal space 231 through the upper opening 222 and the lower opening 232 in the chamber 21 (Step S220). As shown in FIG. 2, in the cover internal space 231, the upper surface 91 of the substrate 9 and the lower surface 512 of shield plate 51 face each other, being adjacent to each other, in the vertical direction.

Subsequently, the substrate 9 disposed in the cover internal space 231 is rotated together with the substrate holding part 31 by the substrate rotating mechanism 35 at a relatively high speed about the central axis J1. The processing liquid (mainly, the pure water) on the substrate 9 is thereby moved outward in the radial direction on the upper surface 91 and the lower surface 92 and spatters around from the outer edge of the substrate 9. As a result, the processing liquid on the substrate 9 is removed (Step S221). Hereinafter, the process of Step S221 will be referred to as the "drying process". The rotation speed of the substrate 9 in Step S221 is higher than that of the substrate 9 in Steps S218 and S219.

In Step S221, the processing liquid spattering from the substrate 9 being rotated is received by the inner side surface of the cover body 233 and the upper surface 235 of the cover bottom 234 and moved to the connecting portion between the cover body 233 and the cover bottom 234. The processing liquid (i.e., the processing liquid removed from the substrate 9 in Step S221) is discarded through the cover exhaust port 237, the gas-liquid separating part 197, and the liquid exhaust part 199 (see FIG. 11). In the chamber cover 23, as described earlier, the upper surface 235 of the cover bottom 234 is a sloped surface going downward as it goes outward in the radial direction. For this reason, it is possible to prevent the processing liquid on the upper surface 235 from moving toward the lower opening 232 at the center thereof. Further, since the processing liquid on the upper surface 235 is rapidly moved outward in the radial direction, rapid exhaust of the processing liquid from the cover internal space 231 can be achieved.

When the substrate 9 is rotated in the cover internal space 231, the shield plate 51 is rotated by the shield plate rotating mechanism 55 at a position close to the upper surface 91 of the substrate 9 in the vertical direction, at a rotation speed almost equal to that of the substrate 9 in the same rotation direction as the substrate 9 rotates, about the central axis J1. Since the shield plate 51 is disposed, being close to the upper surface 91 of the substrate 9, it is possible to inhibit (or prevent) the processing liquid spattering from the substrate 9 from being splashed back from the inner side surface of the cover body 233 and adhered again to the upper surface 91 of the substrate 9. Further, with the rotation of the shield plate 51, it is possible to spatter around the processing liquid and the film formation liquid adhered to the upper surface 511 and the lower surface 512 of the shield plate 51 and remove the processing liquid and the film formation liquid from the shield plate 51.

In the drying process of Step S221, besides the plurality of outer cover nozzles 182, the upper center nozzle 181 also ejects the nitrogen gas. Specifically, the nitrogen gas is supplied in the space between the lower surface 512 of the shield plate 51 and the upper surface 91 of the substrate 9 through the gas ejection port of the upper center nozzle 181. The processing liquid can be thereby exhausted more rapidly from the space between the substrate 9 and the shield plate 51 and drying of the substrate 9 can be accelerated.

After the drying process of the substrate 9 is finished, the rotation of the substrate 9 by the substrate rotating mechanism 35 is stopped. The chamber cover 23 is moved upward from the position shown in FIG. 2 by driving the second moving mechanism 42 and disposed at the upper position shown in FIG. 1. The chamber cover 23 and the chamber body 22 are thereby separated from each other in the vertical direction, and the chamber 21 is opened (Step S222). Then, by the external transfer mechanism, the substrate 9 after being subjected to the above series of processes is carried through the gap between the lower surface 236 of the cover bottom 234 and the upper surface of the cup top portion 227b and unloaded to the outside of the housing 11 through the carry-in/carry-out port (not shown) provided on the housing 11 (Step S223).

Actually, by driving the first moving mechanism 41 in parallel with driving the second moving mechanism 42, in the state of FIG. 1 where the chamber 21 is opened, the shield plate 51 closes the lower opening 232 of the chamber cover 23. Further, the supply of the nitrogen gas into the cover internal space 231 and the exhaust of the gas from the cover internal space 231 also continue. Therefore, in parallel with the unloading of the substrate 9 in Step S223 described above, the process in which the cover internal space 231 is filled with the nitrogen gas is performed, as Step S211 for the next substrate 9.

Further, by the nitrogen gas supplied into the cover internal space 231, drying of the cover internal space 231 (a decrease of the humidity), i.e., drying of the inner surface of the chamber cover 23, the upper surface 511 of the shield plate 51, and the scanning nozzle 186 disposed at the waiting position is also performed. The process in Step S211 may be regarded as the drying process of the inner surface of the chamber cover 23 and the scanning nozzle 186. Then, when the next substrate 9 is loaded and held by the substrate holding part 31 (Step S212), Steps S213 to S223 are performed in the same manner as above.

As explained above, also in the substrate processing apparatus 1 of the second preferred embodiment, the shield plate 51 having a size in the radial direction larger than that of the lower opening 232 is provided in the cover internal space 231 of the chamber cover 23. Then, before the substrate 9 is loaded and the chamber 21 is formed, the cover internal space 231 of the chamber cover 23 is filled with the gas supplied from the gas supply part 812 in the state where the shield plate 51 closes the lower opening 232. After the chamber 21 is formed, it is thereby possible to rapidly bring the inside of the chamber 21 into a desired gas atmosphere. As a result, it is possible to reduce the time period from the formation of the chamber 21 to the start of the processing on the substrate 9 in the gas atmosphere, and to increase the productivity of the substrate processing apparatus 1.

As described above, since the gas supplied from the gas supply part 812 is an inert gas such as nitrogen gas or the like, it is possible to rapidly perform the processing on the substrate 9 by using the processing liquid in a low oxygen atmosphere. As a result, it is possible to prevent oxidation or the like of a metal film provided on the upper surface 91 of the substrate 9. Further, immediately after the chamber 21 is formed (at the same time when the chamber 21 is formed), since the substrate 9 is positioned in the cover internal space 231 which is filled with the gas in advance, after loading the substrate 9 into the apparatus, it is possible to rapidly bring the environment of the substrate 9 into a desired gas atmosphere.

In Steps S218 and S219, in a state where the annular liquid film 95 is formed between the shield plate 51 and the cover bottom 234 by the film formation liquid supply part 810a, the processing liquid supply part 811 supplies the processing liquid onto the upper surface 91 of the substrate 9. For this reason, it is possible to prevent a mist, fumes, or the like of the processing liquid from passing through the liquid film 95 and entering the cover internal space 231 from the gap between the shield plate 51 and the cover bottom 234.

As described above, when the liquid film 95 is formed, the film formation liquid is discharged from the plurality of film formation liquid discharge ports disposed circumferentially about the central axis J1 in the film formation liquid supply part 810a onto the upper surface 511 of the shield plate 51. It is thereby possible to improve the uniformity in the thickness of the liquid film of the film formation liquid on the shield plate 51. As a result, it is possible to improve the uniformity of the liquid film 95 in the circumferential direction. Further, since the upper surface 511 of the shield plate 51 has a lyophilic property to the film formation liquid supplied from the film formation liquid supply part 810a, it is possible to further improve the uniformity in the thickness of the liquid film of the film formation liquid on the shield plate 51. As a result, it is possible to much further improve the uniformity of the liquid film 95 in the circumferential direction.

In the chemical liquid processing of Step S218, the head supporting part 862 is positioned in the gap between the shield plate 51 and the cover bottom 234 of the chamber cover 23. As described above, between the shield plate 51 and the cover bottom 234, the annular liquid film 95 is formed and the liquid film 95 closes a region in the gap other than the head supporting part 862. For this reason, even when the scanning nozzle 186 positioned in the cover internal space 231 supplies the processing liquid onto the substrate 9, it is possible to prevent a mist, fumes, or the like of the processing liquid from entering the cover internal space 231.

In the substrate processing apparatus 1, with the control by the control part 10, when the processing liquid is supplied from the scanning nozzle 186 onto the substrate 9, the scanning nozzle 186 is disposed at the discharge position and the shield plate 51 is disposed above the scanning nozzle 186. Further, when the scanning nozzle 186 is dried while no processing liquid is supplied from the scanning nozzle 186 onto the substrate 9, the scanning nozzle 186 is disposed at the waiting position and the shield plate 51 closes the lower opening 232. Therefore, with the gas supplied into the cover internal space 231 smaller than the body internal space 221, it is possible to efficiently dry the scanning nozzle 186 and keep clean the scanning nozzle 186.

In the state where the chamber cover 23 includes the cover exhaust port 237 for exhausting the liquid from the cover internal space 231 and the scanning nozzle 186 is disposed at the waiting position, the predispensing is performed. In the substrate processing apparatus 1, this makes it possible to omit the liquid receiving structure for the predispensing. Further, since the head rotating mechanism 863 is provided on the upper surface of the chamber cover 23, it is possible to shorten the head supporting part 862 in the scanning nozzle 186 as compared with the case where the head rotating mechanism 863 is provided on the outer side surface of the chamber cover 23.

As described above, the gas supply part 812 supplies a gas into a space between the lower surface 512 of the shield plate 51 and the upper surface 91 of the substrate 9 through the gas ejection port provided at the center portion of the lower surface 512 of the shield plate 51. In Steps S218 and S219, it is thereby possible to perform the processing on the substrate 9 by using the processing liquid in a desired gas atmosphere. Further, since the liquid film 95 is formed, the space into which the above gas ejection port supplies the gas can be made smaller than the chamber space.

In the substrate processing apparatus 1, as described above, in parallel with the formation of the liquid film 95 in Step S217, the nitrogen gas is supplied from the plurality of outer cover nozzles 182 into the cover internal space 231 and the cover internal space 231 is filled with the nitrogen gas. For this reason, by moving the substrate 9 into the cover internal space 231 after the processing on the substrate 9 by using the processing liquid, it is possible to rapidly start the drying process of the substrate 9 in a desired gas atmosphere.

Figure 14:
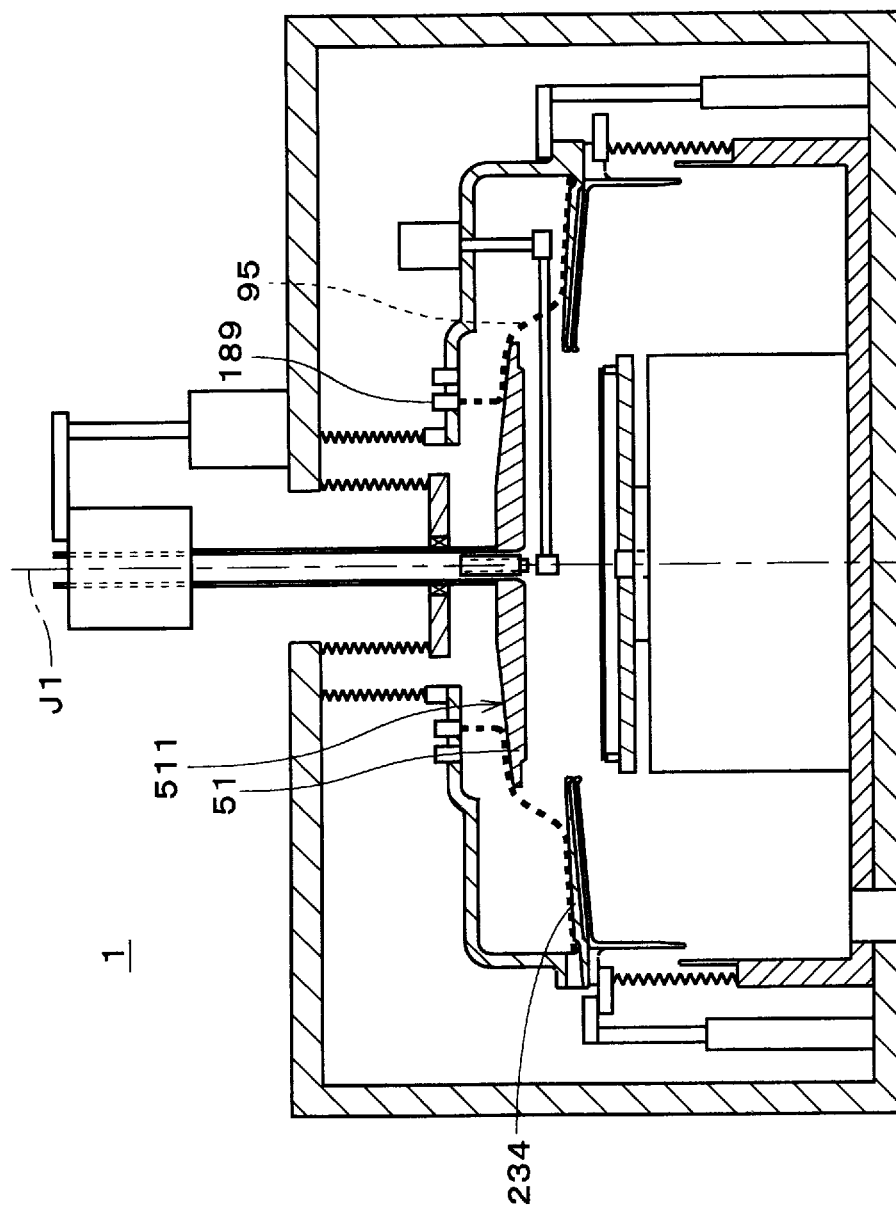

In the substrate processing apparatus 1, as shown in FIG. 14, the upper surface 511 of the shield plate 51 may be a sloped surface going downward as it goes outward in the radial direction. In this case, the film formation liquid supplied onto the upper surface 511 of the shield plate 51 from the plurality of inner cover nozzles 189 moves outward in the radial direction additionally by gravity. It is thereby possible to appropriately form the annular liquid film 95 between the shield plate 51 and the cover bottom 234 even when the rotation speed of the shield plate 51 is relatively low.

The substrate processing apparatus 1 allows various variations.

For example, the chemical liquid may be discharged from the upper center nozzle 181 and the pure water may be discharged from the scanning nozzle 186. In this case, when the chemical liquid is discharged from the upper center nozzle 181, the shield plate 51 is moved closer to the lower opening 232 and it is thereby possible to prevent the chemical liquid spattering from the upper surface 91 of the substrate 9 from being adhered to the scanning nozzle 186. Further, there may be a case where both the chemical liquid supply part 813 and the pure water supply part 814 are connected to either one of the upper center nozzle 181 and the scanning nozzle 186 through respective valves and the chemical liquid and the pure water are selectively discharged from the one nozzle. Even in this case, like in the above case, since the annular liquid film 95 is formed between the shield plate 51 and the cover bottom 234, it is possible to prevent a mist, fumes, or the like of the processing liquid from entering the cover internal space 231.

Depending on the design of the substrate processing apparatus 1, a plurality of scanning nozzles for discharging different kinds of processing liquids may be provided in the cover internal space 231. In this case, a plurality of pods for collecting the chemical liquids from the plurality of scanning nozzles may be provided on the upper surface 235 of the cover bottom 234. Since the plurality of scanning nozzles perform the predispensing in the individual pods, it is possible to easily collect the chemical liquids individually.

Though the head rotating mechanism 863 for rotating the scanning nozzle 186 is provided on the chamber cover 23 in the above-described preferred embodiment, the head rotating mechanism 863 may be provided outside the housing 11, for example, on the upper surface of the housing 11. In this case, it is possible to keep the head rotating mechanism 863 at a distance from the atmosphere of the chemical liquid or the like, and the head rotating mechanism 863 can stand long use.

Further, depending on the design of the substrate processing apparatus 1, the discharge part for discharging the processing liquid may be another form other than an open-side scanning nozzle. Further, the discharge-part moving mechanism for disposing the discharge part selectively at the discharge position or at the waiting position may be a mechanism for moving the discharge part linearly, or the like.

Depending on the type of processing on the substrate 9, droplets or steam of the processing liquid may be supplied onto the upper surface 91 of the substrate 9 by the processing liquid supply part 811.

In the film formation liquid supply part 810a, it is not always necessary to provide the plurality of film formation liquid discharge ports disposed circumferentially, but one film formation liquid discharge port may be provided on the chamber cover 23. For example, a film formation liquid discharge port having an annular shape about the central axis J1 may be provided on the chamber cover 23. Even in this case, it is possible to improve the uniformity in the thickness of the liquid film of the film formation liquid on the shield plate 51, and as a result, it is possible to improve the uniformity of the liquid film 95 in the circumferential direction.

Though the above-described chamber open/close mechanism includes the second moving mechanism 42 for moving the chamber cover 23 and the third moving mechanism 43 for moving the cup part 225 of the chamber body 22 in the exemplary configuration of FIG. 1, there may be a configuration, for example, where either one of the second moving mechanism 42 and the third moving mechanism 43 is omitted and only the other one is used as the chamber open/close mechanism. Further, though the shield plate moving mechanism includes the first moving mechanism 41 for moving the shield plate 51 and the second moving mechanism 42 for moving the chamber cover 23 in the exemplary configuration of FIG. 1, there may be a configuration, for example, where either one of the first moving mechanism 41 and the second moving mechanism 42 is omitted and only the other one is used as the shield plate moving mechanism.

Though the above-described substrate moving mechanism includes the second moving mechanism 42 for moving the chamber cover 23 and the third moving mechanism 43 for moving the cup part 225 of the chamber body 22 in the exemplary configuration of FIG. 1, the substrate moving mechanism may be, for example, a mechanism for moving the substrate holding part 31 in the vertical direction in the chamber 21.

In the chamber body 22, a plurality of cups disposed concentrically may be provided as the cup part 225. In this case, when the type of the processing liquid to be supplied onto the substrate 9 is changed, it is preferable that the cup for receiving the processing liquid from the substrate 9 should be also changed. When a plurality of types of processing liquids are used, it is thereby possible to easily separate the plurality of processing liquids, to be then collected or discarded.

Figure 15:
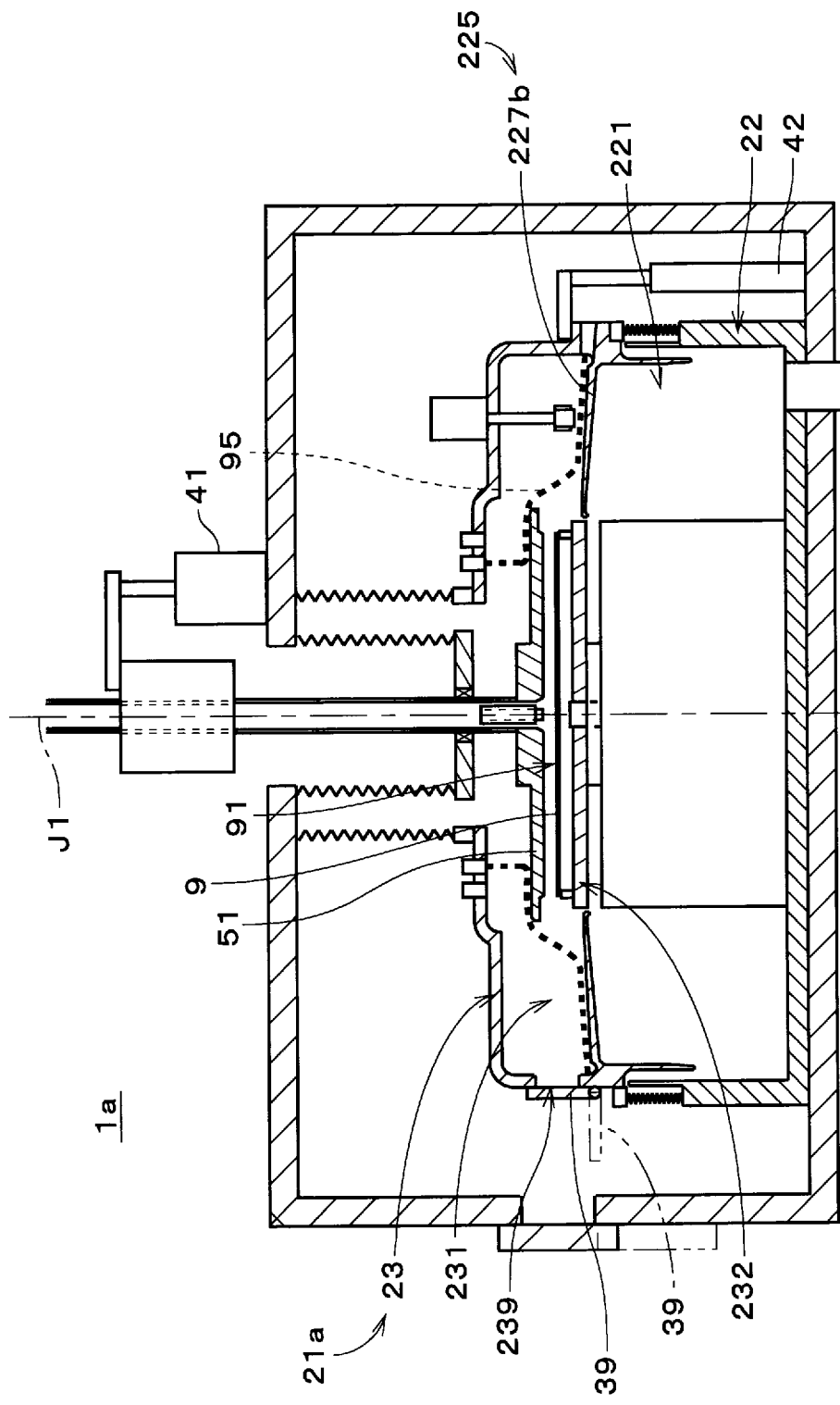
FIG. 15 is a cross section showing still another example of the substrate processing apparatus.

As shown in FIG. 15, a chamber 21a formed by using the chamber cover 23 and the cup part 225 of the chamber body 22 as a coupled member may be adopted. In other words, the chamber body 22 together with the chamber cover 23 forms the chamber 21a. In the substrate processing apparatus 1a, the chamber 21a is formed, with an opening at the center of the cup top portion 227b (i.e., the upper opening of the chamber body 22) covered by the chamber cover 23. The upper opening of the chamber body 22 is also the lower opening 232 of the chamber cover 23.

In the chamber 21a, a side opening 239 is provided on the chamber cover 23, and the substrate 9 passes through the side opening 239 when the substrate 9 is loaded into the chamber 21a or unloaded to the outside of the chamber 21a. The side opening 239 is opened and closed by the side opening open/close mechanism 39. In the substrate processing apparatus 1a of FIG. 15, the third moving mechanism 43 in the substrate processing apparatus 1 of FIG. 1 is omitted and the second moving mechanism 42 moves the chamber cover 23 and the cup part 225 in the vertical direction. The substrate 9 is disposed selectively in the cover internal space 231 or in the body internal space 221. Also in the substrate processing apparatus 1a, the processing using the processing liquid is performed when the substrate 9 is disposed in the body internal space 221, and the drying process of the substrate 9 is performed when the substrate 9 is disposed in the cover internal space 231.

In the processing using the processing liquid, like in the above-described case, in the state where the annular liquid film 95 is formed between the shield plate 51 and the cup top portion 227b (which is the cover bottom of the chamber cover 23), the processing liquid is supplied onto the upper surface 91 of the substrate 9. For this reason, it is possible to prevent a mist, fumes, or the like of the processing liquid from passing through the liquid film 95 and entering the cover internal space 231 from the gap between the shield plate 51 and the cup top portion 227b.

In the substrate processing apparatuses 1 and 1a, the processing may be performed on various types of substrates other than the semiconductor substrate. Further, in the substrate processing apparatuses 1 and 1a, by using various processing liquids such as hydrochloric acid, hydrofluoric acid, and the like, various liquid processings which are desirable to be performed under a low oxygen environment, not limited to polymer removal or etching, can be performed. The gas supplied into the chamber 21 to achieve the low oxygen state is not limited to the nitrogen gas but may be another inert gas such as argon or the like. The gas supplied into the chamber 21 may be a gas to bring the inside of the chamber 21 into a desirable gas atmosphere, for example, a mixed gas in which the gas composition ratios are managed (i.e., in which a plurality of types of gases are mixed).

Figure 16:
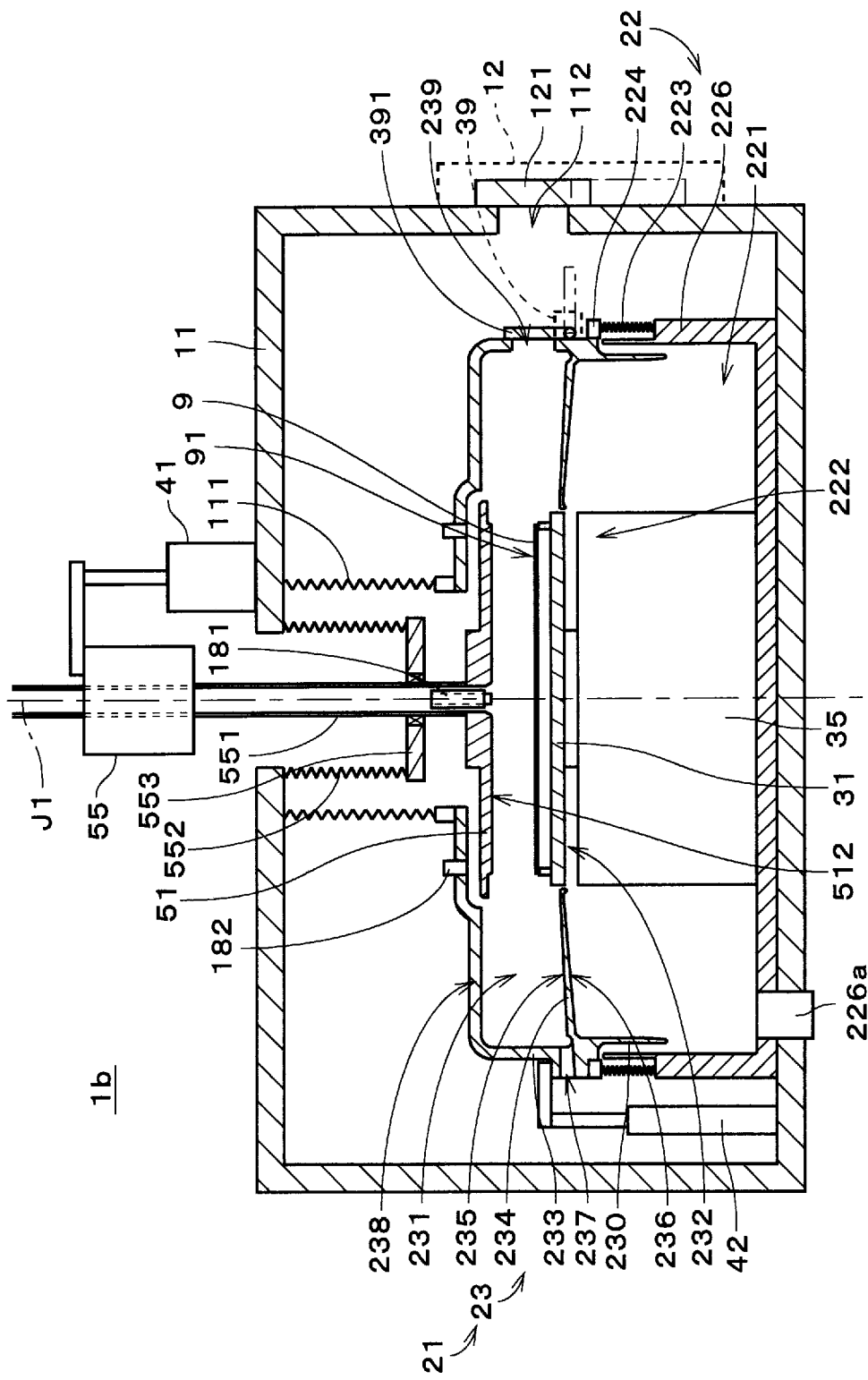
FIG. 16 is a cross section showing a configuration of a substrate processing apparatus in accordance with a third preferred embodiment.

FIG. 16 is a cross section showing a configuration of a substrate processing apparatus 1b in accordance with the third preferred embodiment of the present invention. The substrate processing apparatus 1b is a single-substrate processing apparatus which supplies a processing liquid onto a semiconductor substrate 9 (hereinafter, referred to simply as a "substrate 9") having a substantially disk-like shape and thereby processes the substrates 9 one by one. In FIG. 16, hatching of the cross sections of some constituent elements in the substrate processing apparatus 1b is omitted (the same applies to other cross-sectional views).

The substrate processing apparatus 1b includes the chamber 21, the substrate holding part 31, the substrate rotating mechanism 35, the first moving mechanism 41, the second moving mechanism 42, the shield plate 51, the shield plate rotating mechanism 55, and the housing 11. The housing 11 accommodates the chamber 21, the substrate holding part 31, the shield plate 51, and the like. On a side portion of the housing 11, provided is an outer opening 112. When the substrate 9 is loaded into the housing 11 and unloaded to the outside of the housing 11, the substrate 9 passes through the outer opening 112. On the housing 11, an outer opening open/close mechanism 12 is further provided. The outer opening open/close mechanism 12 moves a shutter 121 in the vertical direction, to thereby open and close the outer opening 112. The outer opening open/close mechanism 12 may be a mechanism for revolving the shutter 121, or the like.

The chamber 21 has a substantially cylindrical shape with cover and bottom about the central axis J1 directed in the vertical direction. The chamber 21 includes the chamber body 22 and the chamber cover 23. The chamber body 22 faces the chamber cover 23 in the vertical direction. The chamber body 22 has a substantially bottomed cylindrical shape about the central axis J1, which forms the body internal space 221. The chamber cover 23 has a substantially covered cylindrical shape about the central axis J1, which forms the cover internal space 231. The outer diameter of the chamber body 22 is almost equal to that of the chamber cover 23.

The chamber cover 23 includes the cover body 233, the cover bottom 234, and a cylindrical portion 230. The cover body 233 has a substantially covered cylindrical shape about the central axis J1. In other words, the cover body 233 has a shape like a cup turned upside down. On a sidewall portion of the cover body 233, provided is the side opening 239. In a state of FIG. 16, the side opening 239 faces the outer opening 112 in the horizontal direction. When the substrate 9 is loaded into the chamber 21 and unloaded to the outside of the chamber 21, the substrate 9 passes through the side opening 239. On the cover body 233, the side opening open/close mechanism 39 is further provided. The side opening open/close mechanism 39 revolves a shutter 391, to thereby open and close the side opening 239. The side opening open/close mechanism 39 may be a mechanism for moving the shutter 391 in the vertical direction, or the like.

The cover bottom 234 has a substantially annular disk-like shape about the central axis J1 and is provided with the lower opening 232 having a substantially circular shape at the center portion thereof. The cover bottom 234 extends from the lower end portion of the cover body 233 inwardly in the radial direction. The already-described cover internal space 231 is a space surrounded by the cover body 233 and the cover bottom 234. A size of the cover internal space 231 in the radial direction about the central axis J1 is larger than that of the lower opening 232 (i.e., the diameter thereof). The upper surface 235 and the lower surface 236 of the cover bottom 234 are sloped surfaces going downward as these go outward in the radial direction. At the connecting portion between the cover bottom 234 and the cover body 233 of the chamber cover 23, provided is the cover exhaust port 237. Through the cover exhaust port 237, a liquid and a gas are exhausted from the cover internal space 231. The cylindrical portion 230 has a substantially cylindrical shape about the central axis J1, extending downward from the outer edge portion of the cover bottom 234.

The chamber body 22 includes the outer cylinder portion 223 and the body bottom 226. The outer cylinder portion 223 has a substantially cylindrical shape about the central axis J1. The outer cylinder portion 223 is positioned outside the cylindrical portion 230 of the chamber cover 23 in the radial direction along the entire circumference thereof. The outer cylinder portion 223 is, for example, a bellows in which a plurality of mountain fold lines each having a circumferential shape and a plurality of valley fold lines each having a circumferential shape are arranged alternately in the vertical direction. Below the outer cylinder portion 223, disposed is the body bottom 226 having a substantially bottomed cylindrical shape. The lower end portion of the outer cylinder portion 223 is connected to the upper end portion of the sidewall portion of the body bottom 226 along the entire circumference thereof. At the bottom of the body bottom 226, provided is the body exhaust port 226a. A liquid and a gas are exhausted from the chamber body 22 through the body exhaust port 226a to the outside of the chamber body 22 (i.e., the outside of the chamber 21). At the body bottom 226, the plurality of body exhaust ports 226a may be provided, being arranged in the circumferential direction.

The chamber body 22 has the upper opening 222 having a substantially circular shape, which is formed (surrounded) by the upper end portion of the outer cylinder portion 223. The upper opening 222 faces the lower opening 232 of the chamber cover 23 in the vertical direction. The upper opening 222 is larger than the lower opening 232 of the chamber cover 23. The upper opening 222 is covered by the chamber cover 23. The upper end portion of the outer cylinder portion 223 is connected to the outer edge portion of the chamber cover 23 with the outer cylinder connecting portion 224. Specifically, the outer cylinder connecting portion 224 has a substantially annular disk-like shape about the central axis J1, and connects the upper end portion of the outer cylinder portion 223 and the outer edge portion of the cover bottom 234 outside the cylindrical portion 230. The outer cylinder connecting portion 224 closes a gap between the upper end portion of the outer cylinder portion 223 and the cylindrical portion 230. In the substrate processing apparatus 1b, the chamber 21 is formed by the chamber cover 23 and the chamber body 22 to have a sealed space (i.e., a space including the cover internal space 231 and the body internal space 221, and hereinafter, referred to as the "chamber space") inside. The already-described housing 11 covers the respective side portions, upper portions, and lower portions of the chamber cover 23 and the chamber body 22.

The substrate holding part 31 has a substantially disk-like shape about the central axis J1, and is provided in the chamber 21. The substrate holding part 31 is disposed below the substrate 9 and holds the outer edge portion of the substrate 9 in a horizontal state. The diameter of the substrate holding part 31 is larger than that of the substrate 9. The diameter of the substrate holding part 31 is slightly smaller than that of the lower opening 232 of the chamber cover 23. As viewed along the vertical direction, the substrate 9 and the substrate holding part 31 are disposed in the lower opening 232 of the chamber cover 23. The substrate rotating mechanism 35 is disposed below the substrate holding part 31 inside the chamber 21. The substrate rotating mechanism 35 rotates the substrate 9 together with the substrate holding part 31 about the central axis J1.

The shield plate 51 has a substantially disk-like shape about the central axis J1. The shield plate 51 is disposed in the cover internal space 231 which is an internal space of the chamber cover 23. It is preferable that the size of the shield plate 51 in the radial direction (i.e., the diameter of the shield plate 51) should be larger than the diameter of the lower opening 232 of the chamber cover 23. As described later, the shield plate 51 is capable of closing the lower opening 232 of the chamber cover 23. The shield plate 51 faces the upper surface 91 of the substrate 9 held by the substrate holding part 31 in the vertical direction.

The shield plate rotating mechanism 55 is disposed above the shield plate 51. The shield plate rotating mechanism 55 is, for example, a hollow shaft motor. The shield plate rotating mechanism 55 rotates the shield plate 51 about the central axis J1 in the cover internal space 231 of the chamber cover 23. The rotation of the shield plate 51 by the shield plate rotating mechanism 55 is performed independently of that of the substrate 9 by the substrate rotating mechanism 35.

The rotation axis 551 of the shield plate rotating mechanism 55 is connected to the shield plate 51 through a through hole provided at the upper portion of the housing 11 and another through hole provided at the upper portion of the chamber cover 23. The portion around the through hole of the housing 11 and the portion around the through hole of the chamber cover 23 are connected to each other with the extensible member 111 (e.g., a bellows) which has a substantially cylindrical shape and is extensible in the vertical direction. Further, the rotation axis 551 is provided with the flange portion 553 having a substantially disk-like shape, and the outer peripheral portion of the flange portion 553 and the portion around the through hole of the housing 11 are connected to each other with the extensible member 552 (e.g., a bellows) which has a substantially cylindrical shape and is extensible in the vertical direction. In the substrate processing apparatus 1b, the space inside the housing 11 is separated from the space outside the housing 11 with the flange portion 553 and the extensible member 552. Furthermore, the space inside the chamber cover 23 is separated from the space inside the housing 11 and outside the chamber cover 23 with the extensible member 111. Thus, the through hole at the center portion of the cover body 233 is closed by the extensible members 111 and 552, part of the upper portion of the housing 11, and the flange portion 553. These members which close the through hole may be regarded as part of the cover body 233. Further, the cylindrical space formed by the extensible members 111 and 552 is part of the cover internal space 231.

The first moving mechanism 41 is disposed, for example, above the housing 11. The first moving mechanism 41 moves the shield plate 51 together with the shield plate rotating mechanism 55 in the vertical direction. The shield plate 51 is moved by the first moving mechanism 41 in the vertical direction in the cover internal space 231 of the chamber cover 23. In the state of FIG. 16, the shield plate 51 is disposed at a position adjacent to the hood portion 238 of the chamber cover 23, i.e., a position (hereinafter, referred to as a "separate position") separated from the upper surface 91 of the substrate 9 on the substrate holding part 31. As described above, since the shield plate 51 is larger than the lower opening 232 of the chamber cover 23, the shield plate 51 does not move to below the cover bottom 234 through the lower opening 232. In other words, the shield plate 51 is capable of closing the lower opening 232. The first moving mechanism 41 includes, for example, a motor and a ball screw (the same applies to the second moving mechanism 42).

The second moving mechanism 42 is disposed on the side of the chamber body 22, and moves the chamber cover 23 in the vertical direction. Specifically, the chamber cover 23 is moved between the "lower position" shown in FIG. 16 and the "upper position" shown in FIG. 17 by the second moving mechanism 42. In the state where the chamber cover 23 is disposed at the lower position, the lower opening 232 is positioned below the substrate 9 on the substrate holding part 31, and in the state where the chamber cover 23 is disposed at the upper position which is higher than the lower position, the lower opening 232 is positioned above the substrate 9 on the substrate holding part 31. When the chamber cover 23 is moved from the lower position to the upper position, the shield plate 51 is moved by the first moving mechanism 41 in the vertical direction. Actually, the relative position of the shield plate 51 relative to the chamber cover 23 in the vertical direction is changed. Thus, the first moving mechanism 41 and the second moving mechanism 42 serves as the shield plate moving mechanism for moving the shield plate 51 relatively to the chamber cover 23 in the vertical direction in the cover internal space 231 of the chamber cover 23. Further, in the substrate processing apparatus 1b, the body bottom 226 of the chamber body 22 and the substrate holding part 31 are not moved in the vertical direction.

As shown in FIG. 16, inside the rotation axis 551 of the shield plate rotating mechanism 55, provided is the upper center nozzle 181. At the center portion of the lower end of the upper center nozzle 181, provided is the processing liquid discharge port for discharging a processing liquid toward the upper surface 91 of the substrate 9. Pure water delivered from the pure water supply part 814 (see FIG. 18) described later is discharged from the processing liquid discharge port. Further, at the lower end of the upper center nozzle 181, the gas ejection port having a substantially annular shape is provided around the processing liquid discharge port. An inert gas delivered from the inert gas supply part 816 described later is supplied from the gas ejection port toward the space (i.e., the space between the lower surface 512 of the shield plate 51 and the upper surface 91 of the substrate 9) below the shield plate 51. The lower end of the upper center nozzle 181 is disposed at almost the same position as that of the lower surface 512 of the shield plate 51 in the vertical direction. In other words, the processing liquid discharge port and the gas ejection port of the upper center nozzle 181 are provided at the center portion of the lower surface 512 of the shield plate 51.

On the hood portion 238 of the cover body 233 in the chamber cover 23, provided are the plurality of cover nozzles 182. The plurality of cover nozzles 182 face the upper surface of the shield plate 51 in the vertical direction. The plurality of cover nozzles 182 are disposed circumferentially about the central axis J1.

Figure 18:
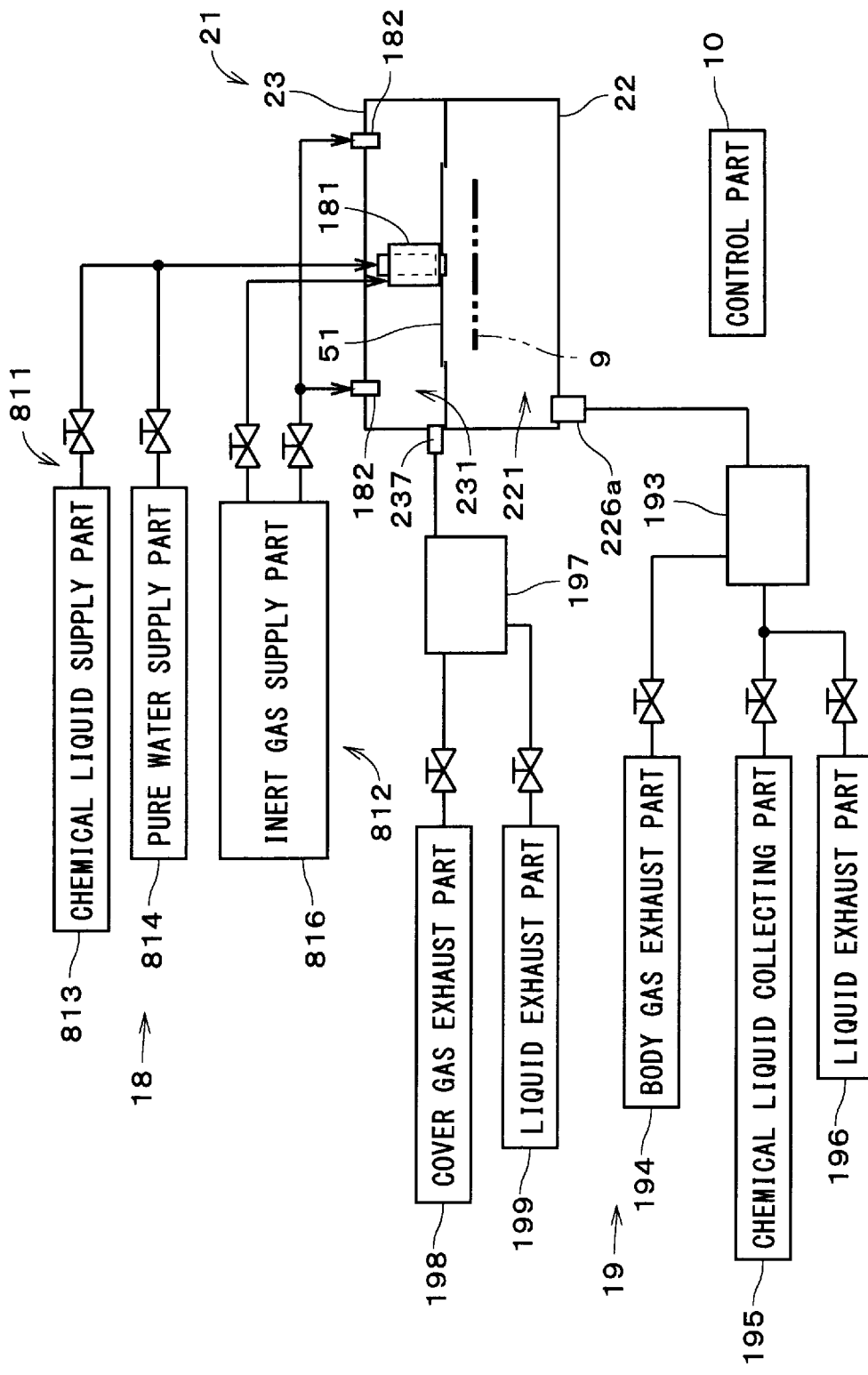
FIG. 18 is a block diagram showing a gas-liquid supply part and a gas-liquid exhaust part.

FIG. 18 is a block diagram showing a gas-liquid supply part 18 and a gas-liquid exhaust part 19 included in the substrate processing apparatus 1b. The gas-liquid supply part 18 includes the processing liquid supply part 811 and the gas supply part 812. The processing liquid supply part 811 includes the upper center nozzle 181, the chemical liquid supply part 813, and the pure water supply part 814. The chemical liquid supply part 813 and the pure water supply part 814 are connected to the upper center nozzle 181 through respective valves. The gas supply part 812 includes the upper center nozzle 181, the plurality of cover nozzles 182, and the inert gas supply part 816. The inert gas supply part 816 is connected to the upper center nozzle 181 through a valve. The inert gas supply part 816 is also connected to the plurality of cover nozzles 182 through respective valves. In the gas-liquid supply part 18, the upper center nozzle 181 is shared by the processing liquid supply part 811 and the gas supply part 812. The processing liquid supply part 811 and the gas supply part 812 may be formed by constituent elements which are independent of one another. Furthermore, the arrangement of the nozzles provided in the chamber 21 may be changed as appropriate.

The gas-liquid exhaust part 19 includes the body exhaust port 226a, the cover exhaust port 237, the gas-liquid separating part 193, the body gas exhaust part 194, the chemical liquid collecting part 195, the liquid exhaust part 196, the gas-liquid separating part 197, the cover gas exhaust part 198, and the liquid exhaust part 199. The body exhaust port 226a provided in the chamber body 22 is connected to the gas-liquid separating part 193. The gas-liquid separating part 193 is connected to the body gas exhaust part 194, the chemical liquid collecting part 195, and the liquid exhaust part 196 through respective valves. The cover exhaust port 237 provided on the chamber cover 23 is connected to the gas-liquid separating part 197. The gas-liquid separating part 197 is connected to the cover gas exhaust part 198 and the liquid exhaust part 199 through respective valves. The constituent elements of the gas-liquid supply part 18 and the gas-liquid exhaust part 19 are controlled by the control part 10. The first moving mechanism 41, the second moving mechanism 42, the substrate rotating mechanism 35, and the shield plate rotating mechanism 55 (see FIG. 16) are also controlled by the control part 10.

A chemical liquid supplied from the chemical liquid supply part 813 through the upper center nozzle 181 onto the substrate 9 is, for example, a polymer removal liquid or an etching solution such as hydrofluoric acid, a tetramethylammonium hydroxide solution, or the like. The pure water supply part 814 supplies pure water (DIW: deionized water) onto the substrate 9 through the upper center nozzle 181. The processing liquid supply part 811 may include another supply part for supplying a processing liquid (for example, a solvent such as isopropyl alcohol (IPA) or the like, an acid solution, an alkaline solution, a removal liquid, or the like) other than the above-described chemical liquid and the pure water. A gas supplied from the inert gas supply part 816 is, for example, nitrogen ($N_2$) gas. The gas supply part 812 may include another supply part for supplying an inert gas other than nitrogen gas or a gas other than the inert gas.

Figure 19:
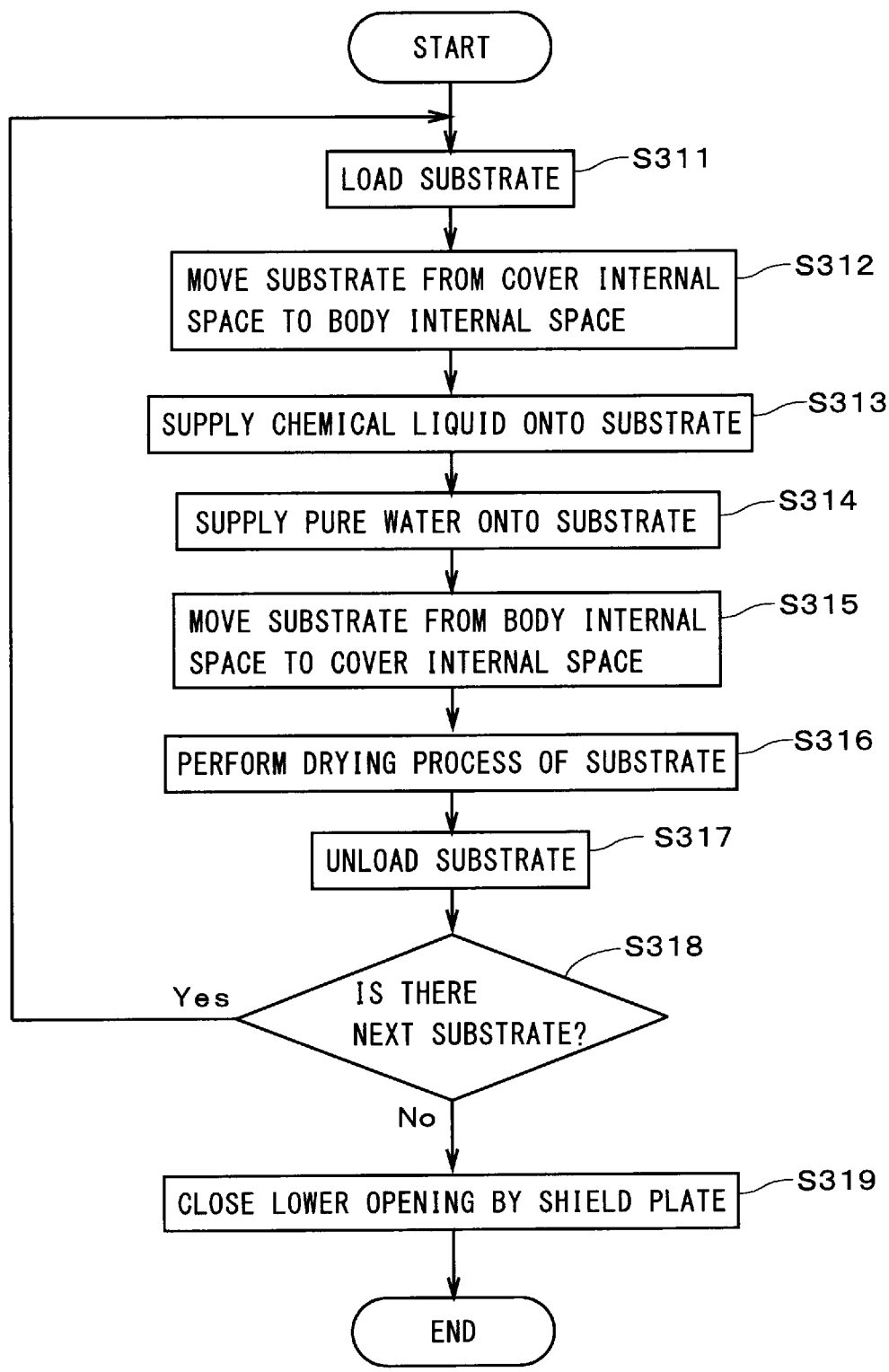
FIG. 19 is a flowchart showing an operation flow for processing a substrate.

Next, an operation flow for processing the substrate 9 in the substrate processing apparatus 1b will be described, with reference to FIG. 19. In the substrate processing apparatus 1b, first, as shown in FIG. 16, in the state where the chamber cover 23 is positioned at the lower position, the side opening 239 is opened by the side opening open/close mechanism 39, and the outer opening 112 is opened by the outer opening open/close mechanism 12. In other words, the chamber 21 and the housing 11 are opened.

Subsequently, by an external transfer mechanism, the substrate 9 is carried through the outer opening 112 and the side opening 239 in this order and loaded into the cover internal space 231. The substrate 9 is moved to below the shield plate 51 disposed at the separate position and passed to the substrate holding part 31 from the transfer mechanism (Step S311). In Step S311, the substrate 9 is held by the substrate holding part 31 above the lower opening 232 of the chamber cover 23. When the transfer mechanism moves to the outside of the housing 11, the side opening 239 and the outer opening 112 are closed.

Herein, in the substrate processing apparatus 1*b*, in principle, the supply of the nitrogen gas into the cover internal space 231 from the plurality of cover nozzles 182 of the gas supply part 812 (see FIG. 18) and the exhaust of the gas in the cover internal space 231 from the cover exhaust port 237 are always performed. Further, as described later, immediately before the chamber 21 is opened, the state where the cover internal space 231 is filled with the nitrogen gas (i.e., the state where the cover internal space 231 is in the nitrogen gas atmosphere (low oxygen atmosphere), hereinafter, referred to as a "gas filled state") is kept. Therefore, after the substrate 9 is disposed into the cover internal space 231, the environment of the substrate 9 can be rapidly brought into the gas filled state.

Subsequently, by driving the second moving mechanism 42, the chamber cover 23 is moved upward from the lower position shown in FIG. 16 to the upper position shown in FIG. 17. In other words, by the second moving mechanism 42, the substrate 9 together with the substrate holding part 31 is moved downward relatively to the chamber 21. The second moving mechanism 42 serves as a substrate moving mechanism for moving the substrate 9 together with the substrate holding part 31 relatively to the chamber 21 in the vertical direction. At that time, by driving the first moving mechanism 41, the relative position of the shield plate 51 relative to the chamber cover 23 is slightly changed. Specifically, by the first moving mechanism 41, the shield plate 51 becomes slightly closer to the lower opening 232 of the chamber cover 23 and is disposed at an almost intermediate position between the cover bottom 234 and the hood portion 238.

As described above, when the chamber cover 23 is moved from the lower position to the upper position, the substrate 9 is moved from the cover internal space 231 into the body internal space 221 through the lower opening 232 in the chamber 21 (Step S312). The cylindrical portion 230 is thereby positioned outside the substrate 9 and the substrate holding part 31 in the radial direction along the entire circumference thereof below the cover bottom 234. Actually, when the chamber cover 23 is moved from the lower position to the upper position, the body internal space 221 surrounded by the chamber body 22 and the lower surface of the chamber cover 23 (the lower surface 236 of the cover bottom 234) becomes larger. At that time, since the cover internal space 231 is in the gas filled state, the environment of the substrate 9 in the body internal space 221 is also brought into a state where the concentration of nitrogen gas is high (the oxygen concentration is low).

When the substrate 9 is positioned in the body internal space 221, the substrate rotating mechanism 35 starts rotating the substrate 9. Further, a chemical liquid is supplied from the chemical liquid supply part 813 (see FIG. 18) to the upper center nozzle 181, and the chemical liquid is supplied from the upper center nozzle 181 in the cover internal space 231 through the lower opening 232 onto the upper surface 91 of the substrate 9 in the body internal space 221 (Step S313).

The chemical liquid from the upper center nozzle 181 is continuously supplied onto the upper surface 91 of the substrate 9 being rotated. The chemical liquid is spread outward in the radial direction on the upper surface 91 by centrifugal force, to thereby cover the entire upper surface 91. The chemical liquid spattering from the outer peripheral edge of the substrate 9 being rotated is received by the lower surface 236 of the cover bottom 234 and the inner side surface of the cylindrical portion 230 and led to the body exhaust port 226*a* disposed below the cylindrical portion 230. Thus, the cover bottom 234 and the cylindrical portion 230 serve as a cup part for receiving the processing liquid spattering from the substrate 9. The chemical liquid passing through the body exhaust port 226*a* flows in the gas-liquid separating part 193 shown in FIG. 18. In the chemical liquid collecting part 195, the chemical liquid is collected from the gas-liquid separating part 193 and impurities and the like are removed from the chemical liquid through a filter or the like, and after that, the chemical liquid is reused.

In the substrate processing apparatus 1*b*, it is preferable that also while the chemical liquid is supplied onto the substrate 9, as described above, by continuously supplying the nitrogen gas from the gas supply part 812, the nitrogen gas atmosphere should be kept in the chamber space (the same applies to the supply of the pure water described later). Further, the nitrogen gas may be also ejected from the gas ejection port of the upper center nozzle 181, to thereby surely keep the nitrogen gas atmosphere around the substrate 9.

After a predetermined time elapses since the supply of the chemical liquid is started, the supply of the chemical liquid from the upper center nozzle 181 onto the substrate 9 is stopped. Subsequently, the pure water serving as a rinse liquid is supplied by the pure water supply part 814 (see FIG. 18) onto the upper surface 91 of the substrate 9 through the upper center nozzle 181 (Step S314). The pure water from the pure water supply part 814 is continuously supplied onto the center portion of the upper surface 91 of the substrate 9. The pure water is spread toward outer peripheral portion of the upper surface 91 by the rotation of the substrate 9 and spatters outward from the outer peripheral edge of the substrate 9. The pure water spattering from the substrate 9 is received by the lower surface 236 of the cover bottom 234 and the inner side surface of the cylindrical portion 230 and led to the body exhaust port 226*a*. The pure water passing through the body exhaust port 226*a* is discarded through the gas-liquid separating part 193 and the liquid exhaust part 196 (see FIG. 18). After a predetermined time elapses since the supply of the pure water is started, the supply of the pure water from the pure water supply part 814 is stopped.

Figure 17:
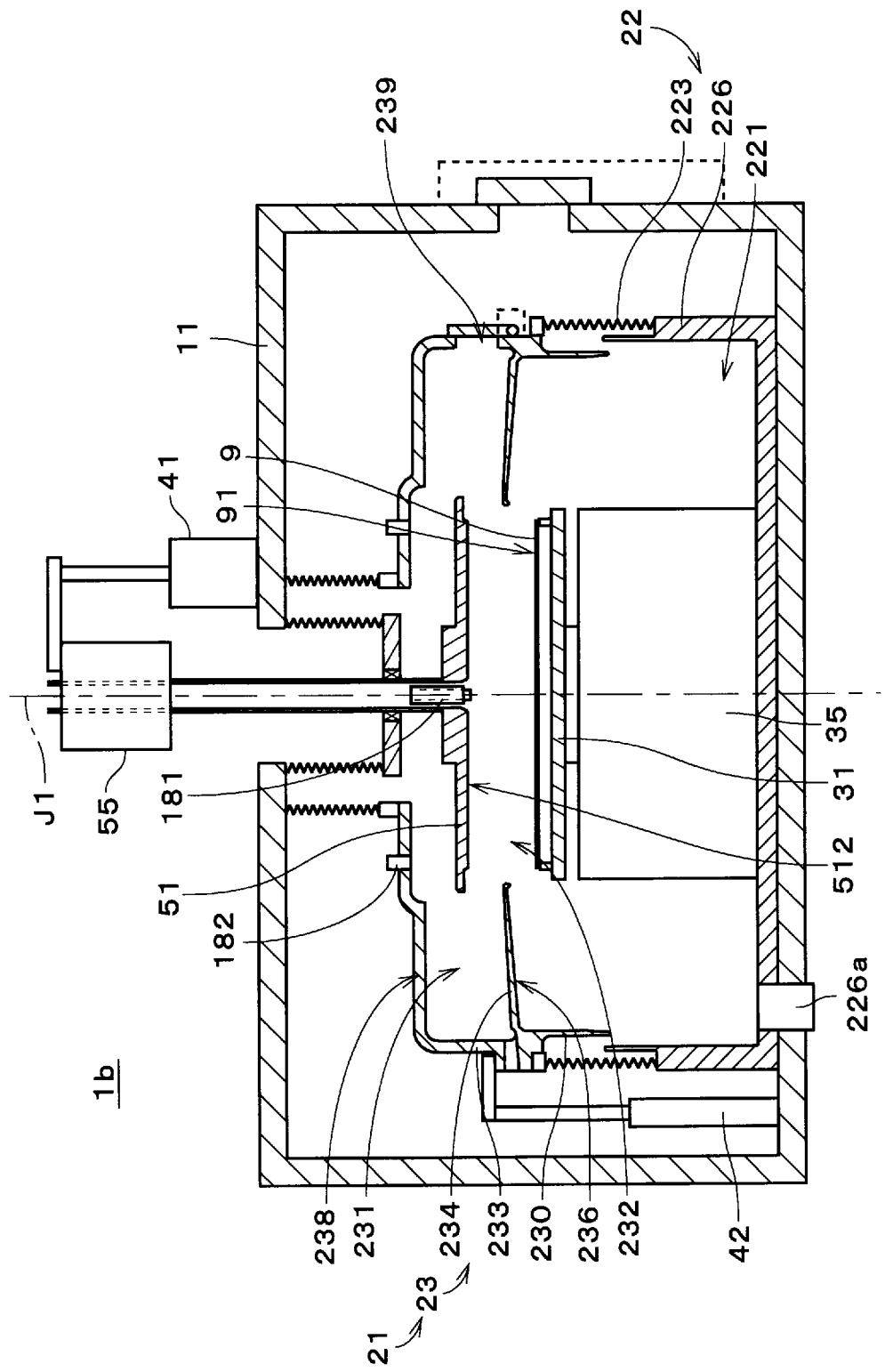
FIG. 17 is a cross section showing the substrate processing apparatus.
Figure 20:
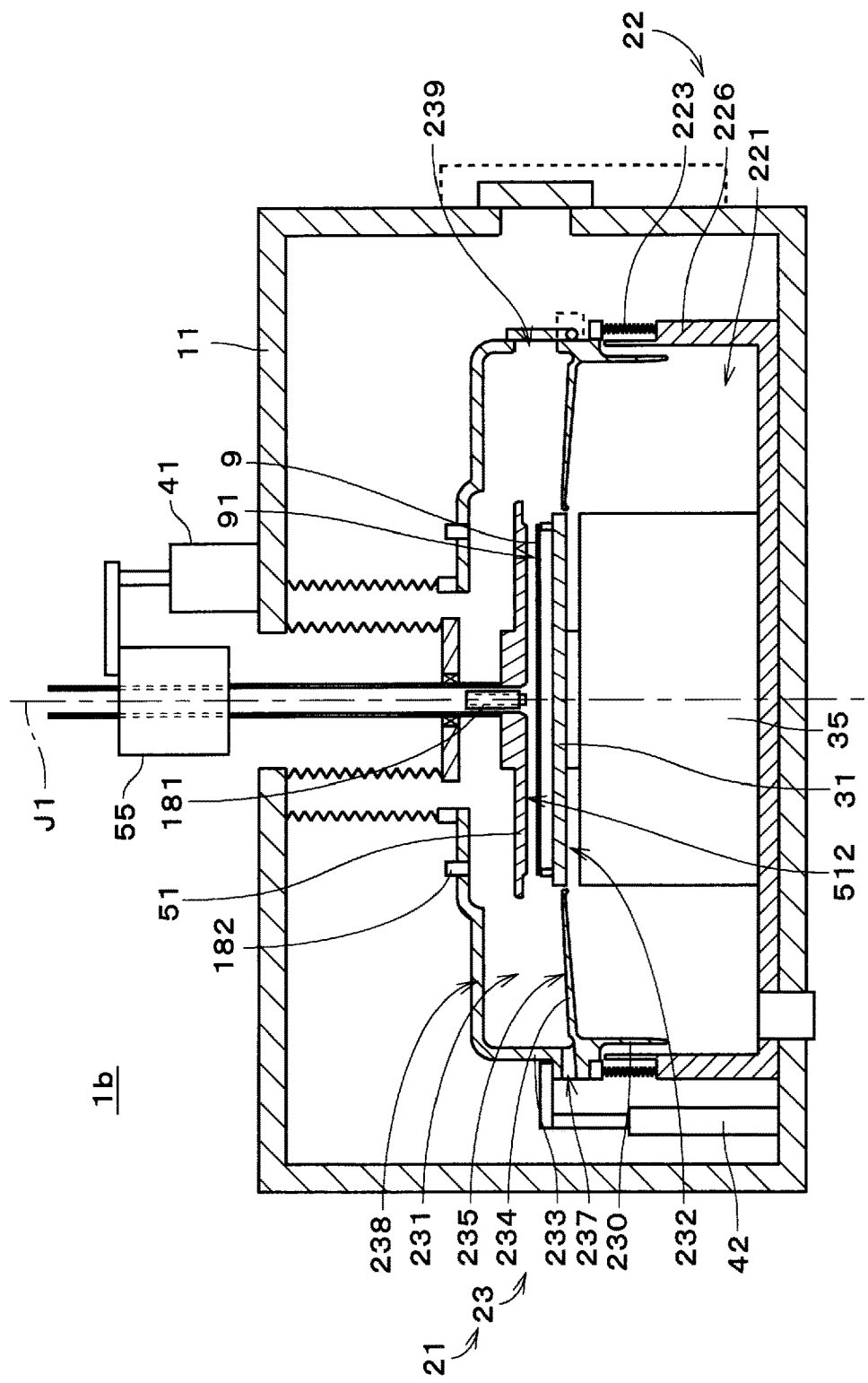
FIGS. 20 and 21 are cross sections each showing the substrate processing apparatus.

After the supply of the processing liquid (the chemical liquid and the pure water) onto the substrate 9 is finished, the chamber cover 23 is moved downward, by driving the second moving mechanism 42, from the upper position shown in FIG. 17 to the lower position shown in FIG. 20. In other words, by the second moving mechanism 42, the substrate 9 together with the substrate holding part 31 is moved upward relatively to the chamber 21. At that time, the relative position of the shield plate 51 relative to the chamber cover 23 is not changed since the first moving mechanism 41 is driven. In other words, the state where the shield plate 51 is disposed at the almost intermediate position between the cover bottom 234 and the hood portion 238 is kept by the first moving mechanism 41.

As described above, when the chamber cover 23 is moved from the upper position to the lower position, the substrate 9 is moved from the body internal space 221 into the cover internal space 231 through the lower opening 232 in the chamber 21 (Step S315). As shown in FIG. 20, in the cover internal space 231, the upper surface 91 of the substrate 9 and the lower surface 512 of shield plate 51 face each other, being adjacent to each other, in the vertical direction. Specifically, the shield plate 51 is disposed at a position (hereinafter, referred to as a "close position") closer to the upper surface 91 of the substrate 9 in the vertical direction. Further, the width of the gap between an outer edge of the substrate holding part 31 and an inner edge of the cover bottom 234 (the edge of the lower opening 232) is very small, and the cover internal space 231 and the body internal space 221 are almost separated by the substrate holding part 31.

Subsequently, the substrate 9 disposed in the cover internal space 231 is rotated together with the substrate holding part 31 by the substrate rotating mechanism 35 at a relatively high speed about the central axis J1. The processing liquid (mainly, the pure water) on the substrate 9 is thereby moved outward in the radial direction and spatters around from the outer edge of the substrate 9. As a result, the processing liquid on the substrate 9 is removed (Step S316). Hereinafter, the process of Step S316 will be referred to as the "drying process". The rotation speed of the substrate 9 in Step S316 is higher than that of the substrate 9 in Steps S313 and S314.

In Step S316, the processing liquid spattering from the substrate 9 being rotated is received by the inner side surface of the cover body 233 and the upper surface 235 of the cover bottom 234 and moved to the connecting portion between the cover body 233 and the cover bottom 234. The processing liquid (i.e., the processing liquid removed from the substrate 9 in Step S316) is discarded through the cover exhaust port 237, the gas-liquid separating part 197, and the liquid exhaust part 199 (see FIG. 18). In the chamber cover 23, as described earlier, the upper surface 235 of the cover bottom 234 is a sloped surface going downward as it goes outward in the radial direction. For this reason, it is possible to prevent the processing liquid on the upper surface 235 from moving toward the lower opening 232 at the center thereof. Further, since the processing liquid on the upper surface 235 is rapidly moved outward in the radial direction, rapid exhaust of the processing liquid from the cover internal space 231 can be achieved.

When the substrate 9 is rotated in the cover internal space 231, the shield plate 51 is rotated by the shield plate rotating mechanism 55 at the close position at a rotation speed almost equal to that of the substrate 9 in the same rotation direction as the substrate 9 rotates, about the central axis J1. Since the shield plate 51 is disposed at the close position, it is possible to inhibit (or prevent) the processing liquid spattering from the substrate 9 from being splashed back from the inner side surface of the cover body 233 and adhered again to the upper surface 91 of the substrate 9. Further, with the rotation of the shield plate 51, it is possible to spatter around the processing liquid adhered to the upper surface and the lower surface 512 of the shield plate 51 and remove the processing liquid from the shield plate 51.

In the drying process of Step S316, besides the plurality of cover nozzles 182, the upper center nozzle 181 also ejects the nitrogen gas. Specifically, the nitrogen gas is supplied in the space between the lower surface 512 of the shield plate 51 and the upper surface 91 of the substrate 9 through the gas ejection port of the upper center nozzle 181. The processing liquid can be thereby exhausted more rapidly from the space between the substrate 9 and the shield plate 51 and drying of the substrate 9 can be accelerated. In the drying process, with continuous supply of the nitrogen gas from the gas supply part 812 into the cover internal space 231, the cover internal space 231 is brought into the gas filled state where the cover internal space 231 is filled with dry nitrogen gas. At that time, the gas is exhausted from the cover internal space 231 mainly by the cover gas exhaust part 198.

After the drying process of the substrate 9 is finished, the rotation of the substrate 9 by the substrate rotating mechanism 35 is stopped. Further, the shield plate 51 is moved upward from the close position shown in FIG. 20 by driving the first moving mechanism 41 and disposed at the separate position shown in FIG. 16. Subsequently, the side opening 239 and the outer opening 112 are opened, and the chamber 21 and the housing 11 are thereby opened. The substrate 9 after being subjected to the above series of processes is passed to the external transfer mechanism in the chamber 21. Then, by the transfer mechanism, the substrate 9 is carried through the side opening 239 and the outer opening 112 in this order and unloaded to the outside of the housing 11 (Step S317). After the transfer mechanism is moved to the outside of the housing 11, the side opening 239 and the outer opening 112 are closed.

In the substrate processing apparatus 1b, when there is a substrate 9 to be processed next (Step S318), the process goes back to Step S311 and the substrate 9 is loaded into the cover internal space 231. At that time, in the drying process (the drying process in immediately preceding Step S316) immediately before the chamber 21 is opened, since the cover internal space 231 is in the gas filled state, it is possible to rapidly bring the environment of the substrate 9 into the gas filled state after the substrate 9 is disposed in the cover internal space 231. Then, like in the above case, the processes of Steps S312 to S317 are performed.

Figure 21:
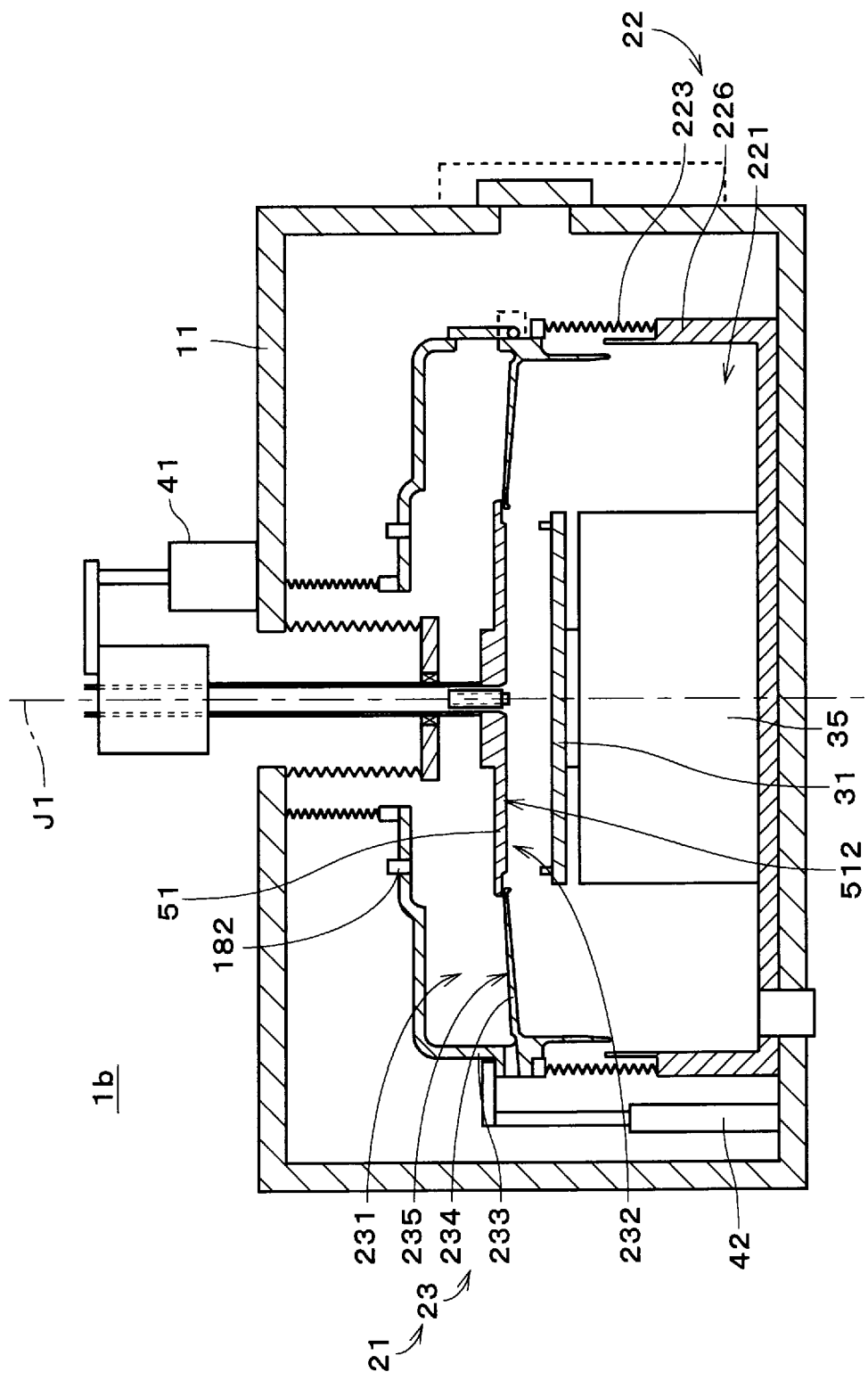

On the other hand, when there is no substrate 9 to be processed next (Step S318), by driving the first moving mechanism 41 and the second moving mechanism 42, the chamber cover 23 is moved to the upper position and the shield plate 51 is superposed on the lower opening 232 of the chamber cover 23, as shown in FIG. 21. Specifically, the outer peripheral portion of the lower surface 512 of the shield plate 51 comes into contact with a portion of the upper surface 235 of the cover bottom 234, which is near to the lower opening 232, along the entire circumference thereof. The lower opening 232 of the chamber cover 23 is thereby closed by the shield plate 51, to separate the cover internal space 231 and the body internal space 221 from each other (Step S319). Further, by continuously supplying the nitrogen gas from the plurality of cover nozzles 182 into the cover internal space 231, the cover internal space 231 is kept in the gas filled state where the cover internal space 231 is filled with the dry nitrogen gas. Therefore, drying of the cover internal space 231 (a decrease of the humidity), i.e., drying of the inner surface of the chamber cover 23 and the upper surface of the shield plate 51 is also performed.

At that time, it is not always necessary to hermetically seal the lower opening 232 by the shield plate 51 but there may be a very small gap between the shield plate 51 and the cover bottom 234 only if the shield plate 51 is superposed on the lower opening 232. Actually, the state in which the lower opening 232 is closed by the shield plate 51 is kept until a substrate 9 to be processed next is prepared. Then, when the substrate 9 to be processed next is prepared, the processing on the substrate 9 shown in FIG. 19 is started (restarted).

As explained above, in the substrate processing apparatus 1b, when the substrate 9 is disposed in the body internal space 221, the processing liquid is supplied onto the upper surface 19 of the substrate 9, and when the substrate 9 is disposed in the cover internal space 231, the substrate 9 is dried by using the gas from the gas supply part 812 while the substrate 9 is rotated. Thus, since the cover internal space 231 in which the substrate 9 is disposed immediately after being loaded into the chamber 21 is a space in which the drying process using a gas (the drying process on the substrate 9 which is processed immediately before) is performed, it is possible to rapidly and efficiently bring the environment of the substrate 9 into the gas filled state.

Further, since the gas supplied from the gas supply part 812 is an inert gas such as nitrogen gas or the like, it is possible to rapidly perform the processing on the substrate 9 by using the processing liquid in the low oxygen atmosphere. As a result, it is possible to prevent oxidation or the like of a metal film provided on the upper surface 91 of the substrate 9. In the drying process, since the gas supply part 812 supplies a gas into a space between the lower surface 512 of the shield plate 51 and the upper surface 91 of the substrate 9 through the gas ejection port provided at the center portion of the lower surface 512 of the shield plate 51, it is possible to efficiently dry the substrate 9.

Since the outer opening 112 which is openable and closable is provided on the housing 11, it is possible to prevent the outside air from entering the cover internal space 231. Further, since the lower opening 232 is closed by the shield plate 51 while no substrate 9 is disposed inside the chamber 21, it is possible to easily keep the gas filled state in the cover internal space 231.

The substrate processing apparatus 1b allows various variations.

By providing the gas ejection port of the gas supply part 812 on the housing 11, the gas may be supplied into the inside of the housing 11, besides in the cover internal space 231. In this case, it is possible to further prevent the outside air from entering the cover internal space 231.

Depending on the type of processing on the substrate 9, droplets or steam of the processing liquid may be supplied onto the upper surface 91 of the substrate 9 by the processing liquid supply part 811.

Though the above-described substrate moving mechanism includes the second moving mechanism 42 for moving the chamber cover 23 in the exemplary configuration of FIG. 16, the substrate moving mechanism may be, for example, a mechanism for moving the substrate holding part 31 in the vertical direction in the chamber 21.

Further, though the shield plate moving mechanism includes the first moving mechanism 41 for moving the shield plate 51 and the second moving mechanism 42 for moving the chamber cover 23 in the exemplary configuration of FIG. 16, the substrate moving mechanism for moving the substrate holding part 31 in the vertical direction as described above may serve also as the shield plate moving mechanism, from the viewpoint that the shield plate 51 should be disposed selectively at the close position or at the separate position.

In the chamber body 22, a plurality of cups disposed concentrically may be provided inside the cylindrical portion 230. In this case, when the type of the processing liquid to be supplied onto the substrate 9 is changed, it is preferable that the cup (including the cylindrical portion 230) for receiving the processing liquid from the substrate 9 should be also changed. When a plurality of types of processing liquids are used, it is thereby possible to easily separate the plurality of processing liquids, to be then collected or discarded.

In the substrate processing apparatus 1b, the processing may be performed on various types of substrates other than the semiconductor substrate.

The configurations in the above-discussed preferred embodiments and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST 1, 1a, 1b Substrate processing apparatus
9 Substrate
10 Control part
11 Housing
12 Outer opening open/close mechanism
21, 21a Chamber
22 Chamber body
23 Chamber cover
31 Substrate holding part
35 Substrate rotating mechanism
39 Side opening open/close mechanism
41 First moving mechanism
42 Second moving mechanism
43 Third moving mechanism
51 Shield plate
55 Shield plate rotating mechanism
91 Upper surface (of substrate)
95 Liquid film
112 Outer opening
181 Upper center nozzle
186 Scanning nozzle
189 Inner cover nozzle
198 Cover gas exhaust part
221 Body internal space
222 Upper opening
231 Cover internal space
232 Lower opening
233 Cover body
234 Cover bottom
235 Upper surface (of cover bottom)
237 Cover exhaust port
239 Side opening
511 Upper surface (of shield plate)
512 Lower surface (of shield plate)
810 Cleaning liquid supply part
810a Film formation liquid supply part
811 Processing liquid supply part
812 Gas supply part
861 Discharge head
862 Head supporting part
863 Head rotating mechanism
J1 Central axis
S111 to S122, S131 to S135, S211 to S223, S311 to S319 Step

The invention claimed is:

1. A substrate processing apparatus for processing a substrate, comprising:
   a chamber cover which has a lower opening and forms a cover internal space having a size in a radial direction larger than that of said lower opening;
   a chamber body which forms a body internal space and has an upper opening facing said lower opening in a vertical direction, said chamber body together with said chamber cover forming a chamber with said upper opening covered by said chamber cover;

a substrate holding part for holding a substrate in a horizontal state inside said chamber;

a discharge part disposed in said cover internal space, for discharging a processing liquid toward an upper surface of said substrate;

a discharge-part moving mechanism for disposing said discharge part selectively at a discharge position above said lower opening or at a waiting position separated from said lower opening in said radial direction in said cover internal space;

a substrate rotating mechanism for rotating said substrate together with said substrate holding part about a central axis directed in said vertical direction when said substrate is disposed in said cover internal space to thereby dry said substrate;

a gas supply part for supplying a gas into said cover internal space;

a gas exhaust part for exhausting a gas from said cover internal space; and a control part for controlling said discharge-part moving mechanism to dispose said discharge part at said discharge position when the processing liquid is supplied from said discharge part onto said substrate and to dispose said discharge part at said waiting position when said discharge part is dried while no processing liquid is supplied from said discharge part onto said substrate, wherein said chamber cover further comprises a cover body having a shape like a cup turned upside down, and a cover bottom having an annular shape, which extends from a lower end portion of said cover body inwardly in said radial direction and is provided with said lower opening at a center portion thereof, and wherein the processing liquid spattering from said substrate is received by an upper surface of said cover bottom when said substrate is dried, and said discharge part disposed at said waiting position faces said upper surface of said cover bottom.

2. The substrate processing apparatus according to claim 1, further comprising:

a shield plate disposed in said cover internal space, facing said upper surface of said substrate; and a shield plate moving mechanism for moving said shield plate relatively to said chamber cover in said vertical direction in said cover internal space, wherein said control part controls said shield plate moving mechanism to dispose said shield plate above said discharge part when the processing liquid is supplied from said discharge part onto said substrate and to close said lower opening with said shield plate when said discharge part is dried while no processing liquid is supplied from said discharge part onto said substrate.

3. The substrate processing apparatus according to claim 1, wherein said chamber cover comprises an exhaust port for exhausting a liquid from said cover internal space, and predispensing is performed in a state where said discharge part is disposed at said waiting position.

4. The substrate processing apparatus according to claim 3, wherein said upper surface of said cover bottom goes downward as it goes outward in said radial direction, and said exhaust port is provided at a connecting portion between said cover bottom and said cover body of said chamber cover.

5. The substrate processing apparatus according to claim 1, wherein said discharge part comprises:

a discharge head for discharging the processing liquid; and a head supporting part which is a member extending in a horizontal direction, having a free end portion to which said discharge head is fixed, and a fixed end portion which is attached to said chamber cover in said cover internal space, and wherein said discharge-part moving mechanism comprises a head rotating mechanism for rotating said discharge head together with said head supporting part about said fixed end portion.

6. The substrate processing apparatus according to claim 5, wherein said head rotating mechanism is provided on an upper surface of said chamber cover.

7. The substrate processing apparatus according to claim 1, further comprising:

a chamber open/close mechanism for forming said chamber inside which said substrate is disposed, by moving said chamber cover relatively to said chamber body in said vertical direction, to thereby cover said upper opening of said chamber body by said chamber cover.

8. The substrate processing apparatus according to claim 7, wherein said cover internal space is filled with a gas by supplying said gas into said cover internal space from said gas supply part before said chamber is formed.

9. The substrate processing apparatus according to claim 1, further comprising an exhaust port provided to said cover bottom to exhaust the processing liquid on said upper surface of said cover bottom to the outside of said chamber cover.

* * * * *